United States Patent
Noda

(10) Patent No.: US 8,329,536 B2
(45) Date of Patent: Dec. 11, 2012

(54) METHOD FOR MANUFACTURING SEMICONDUCTOR DEVICE WITH SILICON NITRIDE CHARGE TRAPPING FILM HAVING VARYING HYDROGEN CONCENTRATION

(75) Inventor: Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/191,830

(22) Filed: Jul. 27, 2011

(65) Prior Publication Data

US 2011/0287621 A1 Nov. 24, 2011

Related U.S. Application Data

(62) Division of application No. 12/230,122, filed on Aug. 22, 2008, now Pat. No. 7,999,308.

(30) Foreign Application Priority Data

Aug. 31, 2007 (JP) ................................ 2007-226903

(51) Int. Cl.
*H01L 21/8239* (2006.01)

(52) U.S. Cl. .. 438/261; 438/591; 438/775; 257/E21.679
(58) Field of Classification Search .................. 257/325
See application file for complete search history.

(56) References Cited

U.S. PATENT DOCUMENTS

| | | |
|---|---|---|
| 6,551,948 B2 | 4/2003 | Ohmi et al. |
| 6,906,390 B2 | 6/2005 | Nomoto et al. |
| 7,259,433 B2 | 8/2007 | Nomoto et al. |
| 7,663,915 B2 | 2/2010 | Kato |
| 7,709,883 B2 | 5/2010 | Takano et al. |
| 7,723,773 B2 | 5/2010 | Yamazaki |
| 7,851,296 B2 | 12/2010 | Noda et al. |
| 2006/0249780 A1 | 11/2006 | Mori |
| 2007/0181875 A1 | 8/2007 | Yamazaki et al. |
| 2007/0215958 A1 | 9/2007 | Tanaka et al. |
| 2008/0096396 A1 | 4/2008 | Shih et al. |

FOREIGN PATENT DOCUMENTS

| | | |
|---|---|---|
| JP | 53-057771 | 5/1978 |
| JP | 10-012826 | 1/1998 |
| JP | 2002-203917 | 7/2002 |
| JP | 2004-221448 | 8/2004 |

*Primary Examiner* — Stephen W Smoot
(74) *Attorney, Agent, or Firm* — Eric J. Robinson; Robinson Intellectual Property Law Office, P.C.

(57) ABSTRACT

To improve a charge retention characteristic of a nonvolatile memory transistor. A first insulating film, a charge trapping film, and a second insulating film are formed between a semiconductor substrate and a conductive film. The charge trapping film is formed of a silicon nitride film including an upper region having a low concentration of hydrogen and a lower region having a high concentration of hydrogen. Such a silicon nitride film is formed in such a manner that a silicon nitride film including 15 atomic % or more hydrogen is formed by a chemical vapor deposition method and an upper portion of the silicon nitride film is nitrided. The nitridation treatment is performed by nitriding the silicon nitride film by nitrogen radicals produced in plasma of a nitrogen gas.

26 Claims, 43 Drawing Sheets

| | CALCULATION AREA [nm] | CONC. [atomic%] | | | |
|---|---|---|---|---|---|
| | | Si | N | H | O |
| UPPER REGION | 0.9-2.6 | 39.9 | 47.0 | 10.0 | 3.1 |
| LOWER REGION | 6.1-11.3 | 32.3 | 46.6 | 21.1 | ※ |

※: under lower detection limit

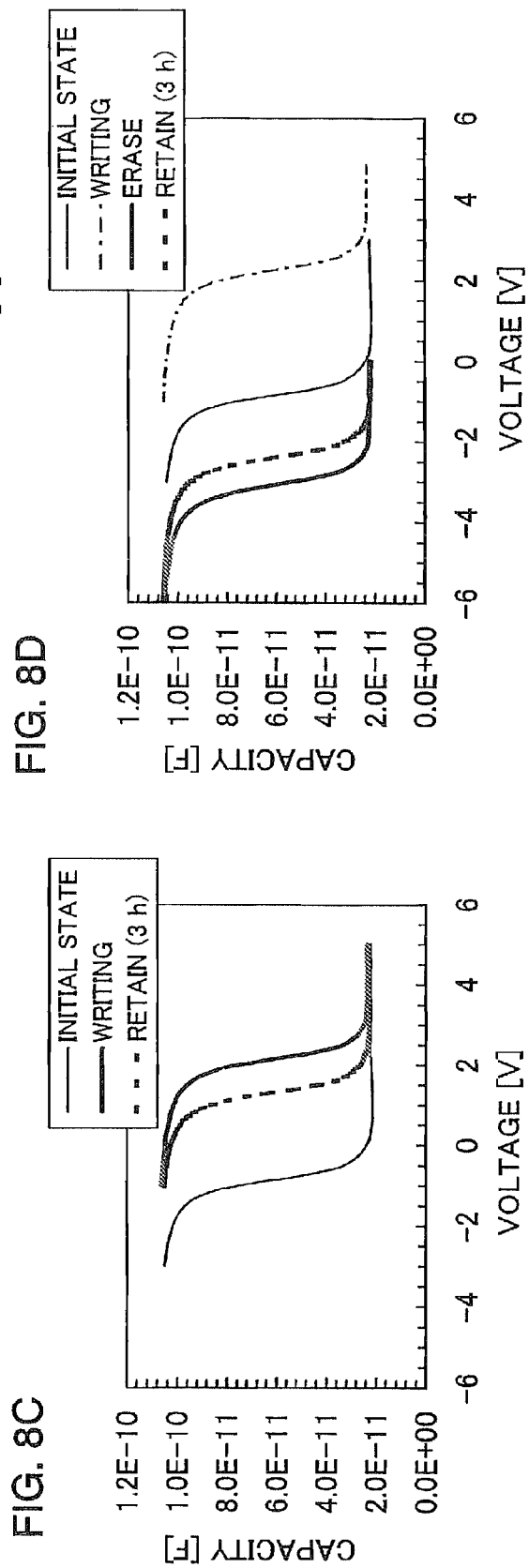
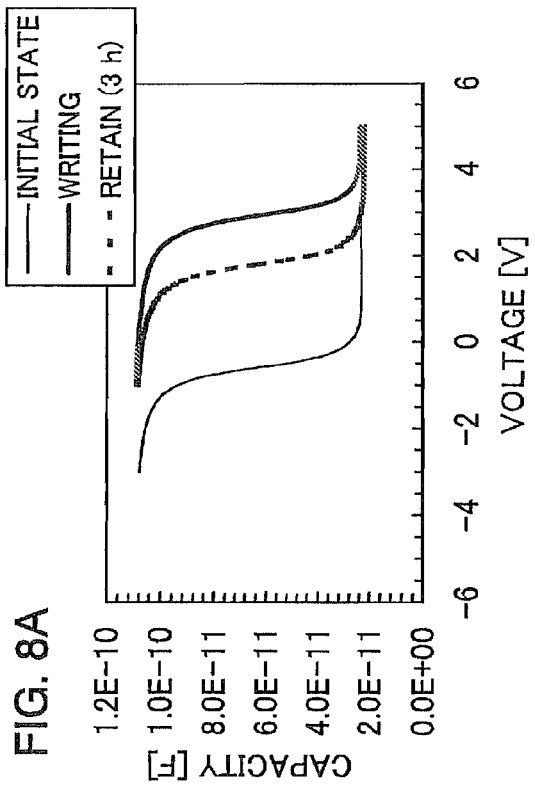

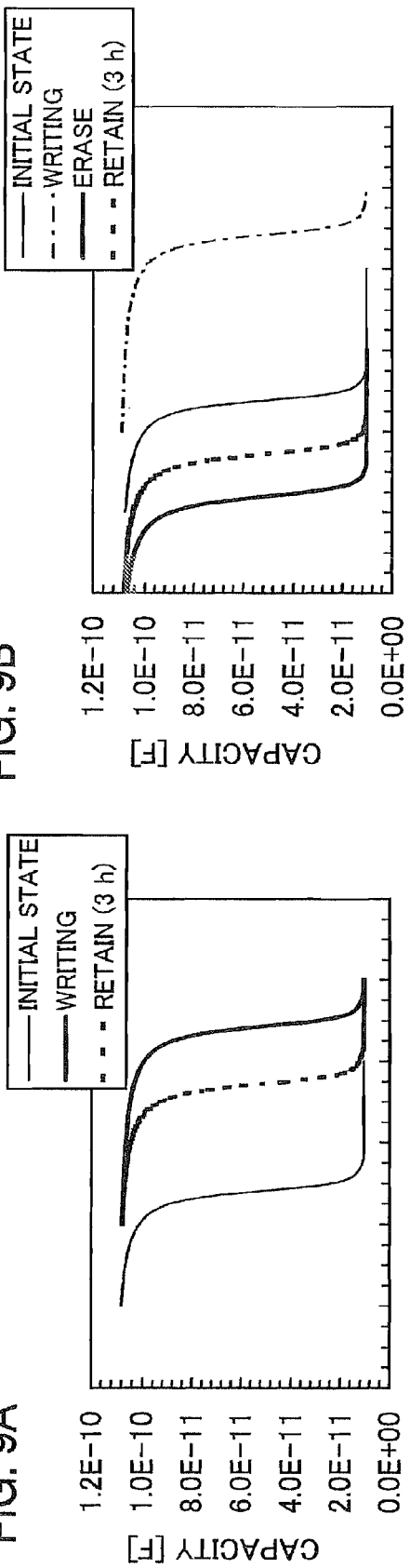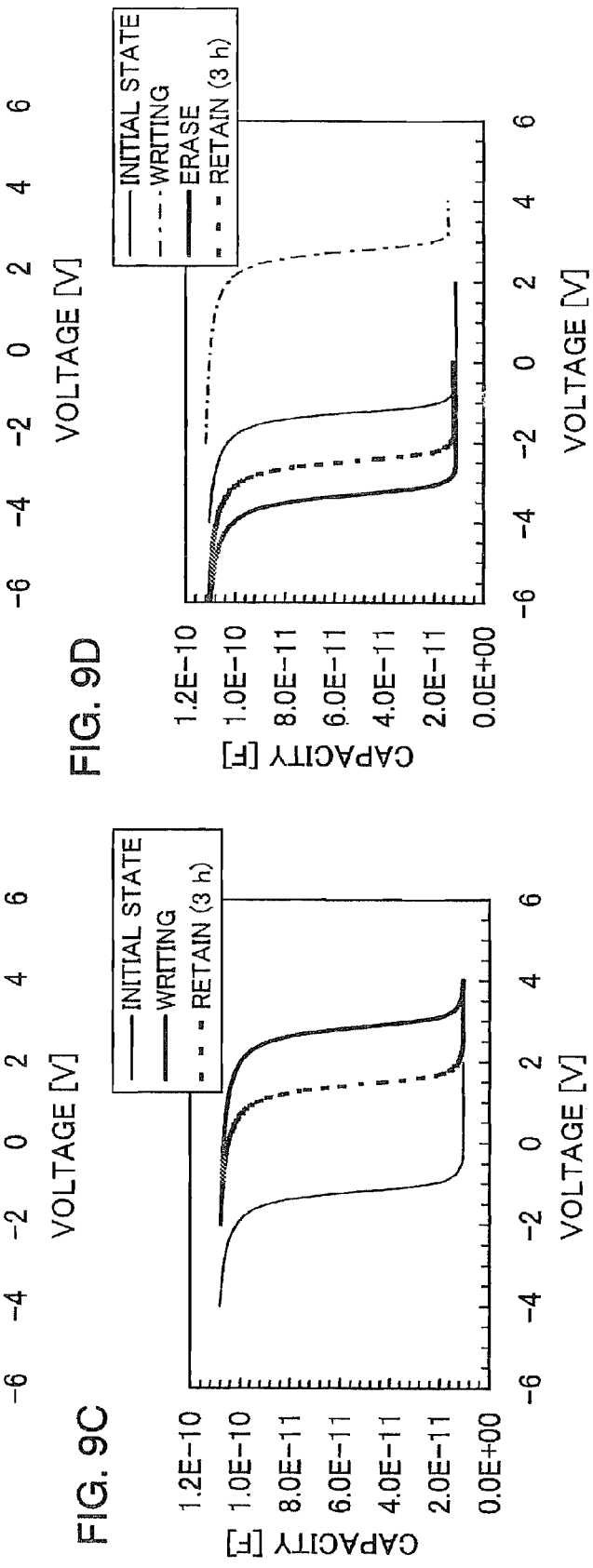

| | CALCULATION AREA [nm] | CONC. [atomic%] | | | |
|---|---|---|---|---|---|
| | | Si | N | H | O |
| UPPER REGION | 0.9-2.6 | 39.9 | 47.0 | 10.0 | 3.1 |
| LOWER REGION | 6.1-11.3 | 32.3 | 46.6 | 21.1 | ※ |

※: under lower detection limit

FIG. 11

| | PROCESS GAS FLOW [sccm] | CONC. [atomic%] | | | COMPOSITION RATIO | DENS. [g/cm$^3$] |
|---|---|---|---|---|---|---|
| | | Si | N | H | N/Si | |
| SIN-1 | SiH$_4$/NH$_3$=2/400 | 30.4 | 48.2 | 21.4 | 1.59 | 2.1 |
| SIN-2 | SiH$_4$/NH$_3$/Ar=2/100/400 | 31.3 | 48.0 | 20.7 | 1.53 | 2.1 |
| SIN-3 | SiH$_4$/NH$_3$/H$_2$=2/100/400 | 33.9 | 48.8 | 17.3 | 1.44 | 2.2 |
| SIN-4 | SiH$_4$/N$_2$/Ar=2/400/50 | 38.5 | 51.2 | 10.3 | 1.33 | 2.2 |
| SIN-5 | SiH$_4$/N$_2$/Ar=2/100/400 | 38.2 | 52.1 | 9.7 | 1.36 | 2.2 |

Oxygen concentration is under lower detection limit.

FIG. 12

| | CONCENTRATION [atoms/cm$^3$] | | | BOND CONCENTRATION RATIO |
|---|---|---|---|---|
| | N-H | Si-H | TOTAL | Si-H/N-H |
| SIN-1 | 9.10E+21 | 2.00E+20 | 9.30E+21 | 0.02 |
| SIN-3 | 7.54E+21 | 2.18E+20 | 7.76E+21 | 0.03 |
| SIN-4 | 2.29E+21 | 3.25E+21 | 5.54E+21 | 1.42 |

FIG. 17A
WRITE 0
FIG. 17B
WRITE 1
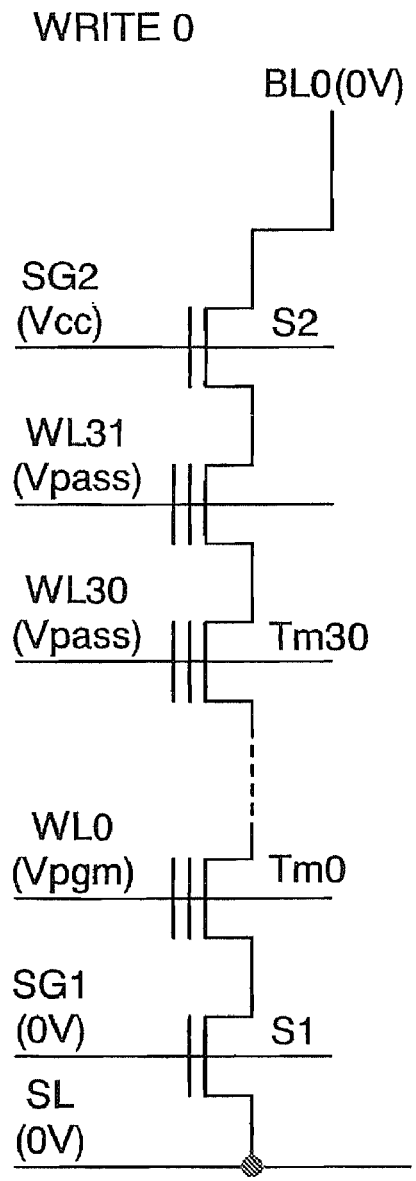
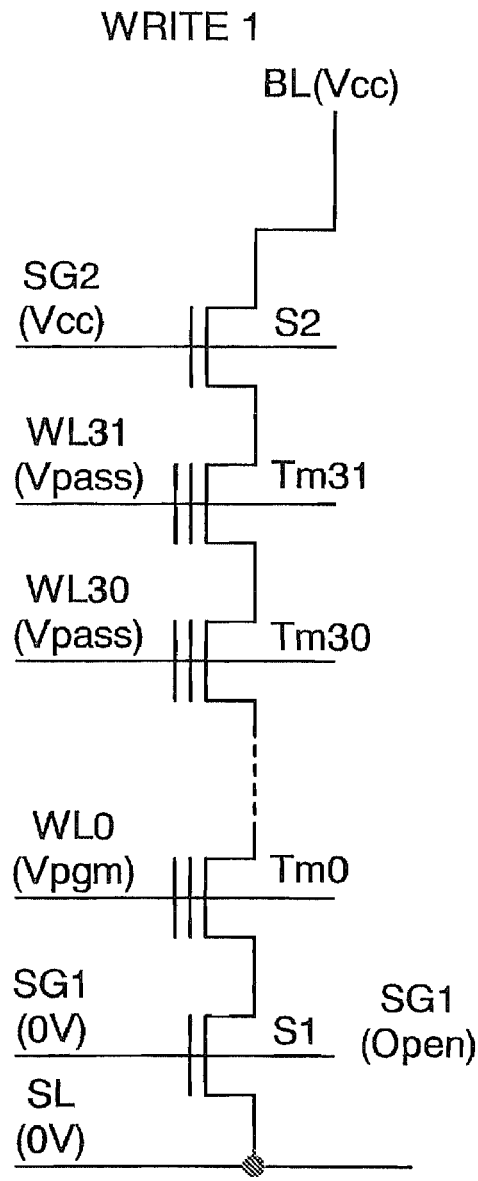

ERASE

READ

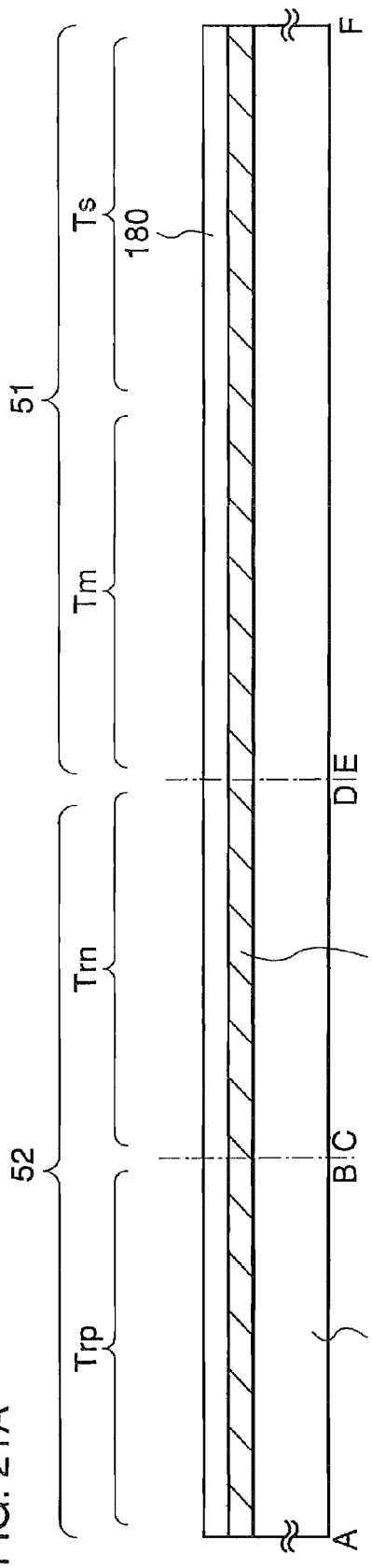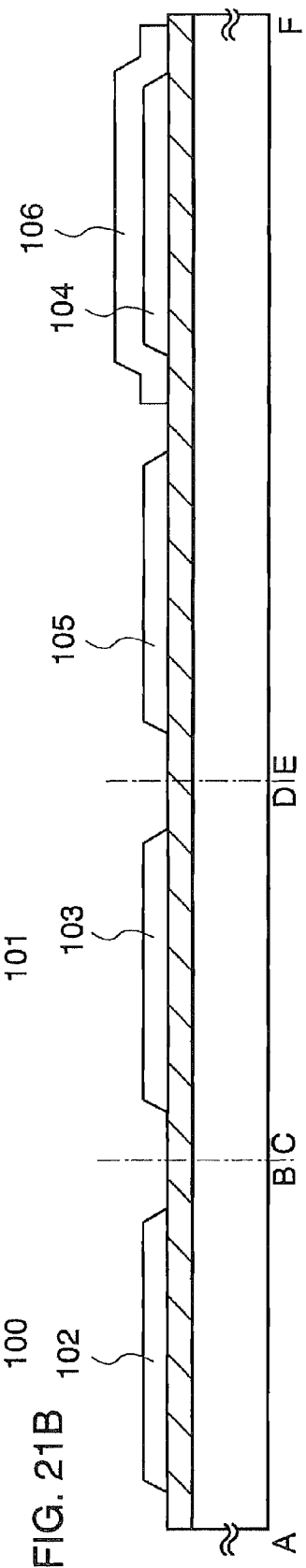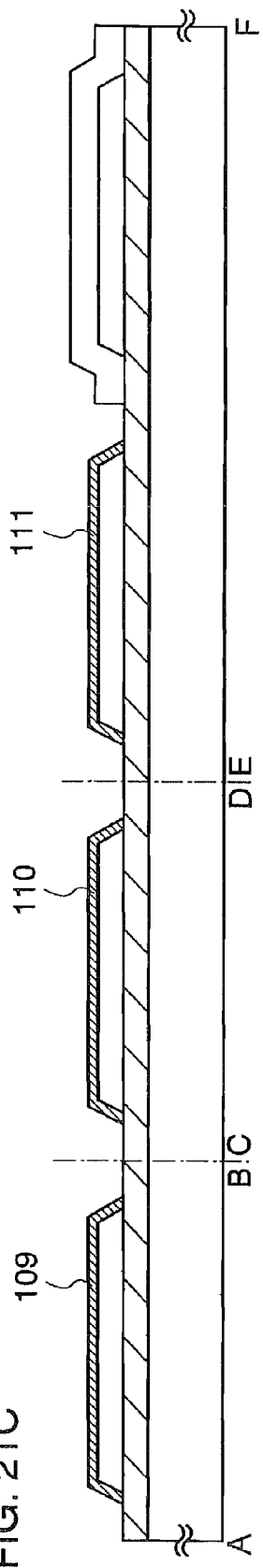

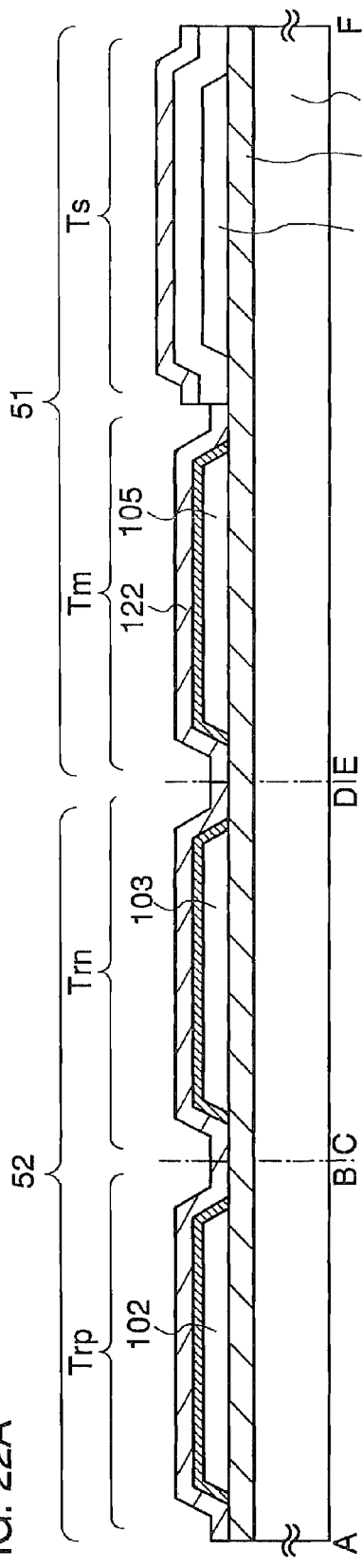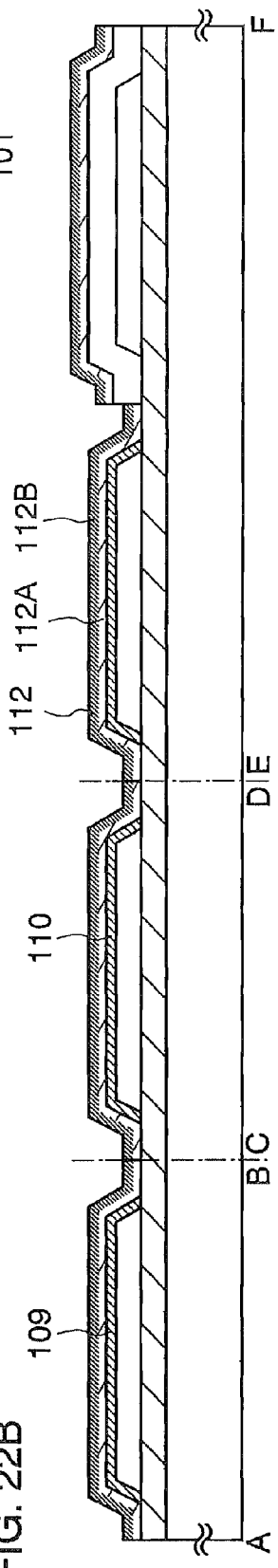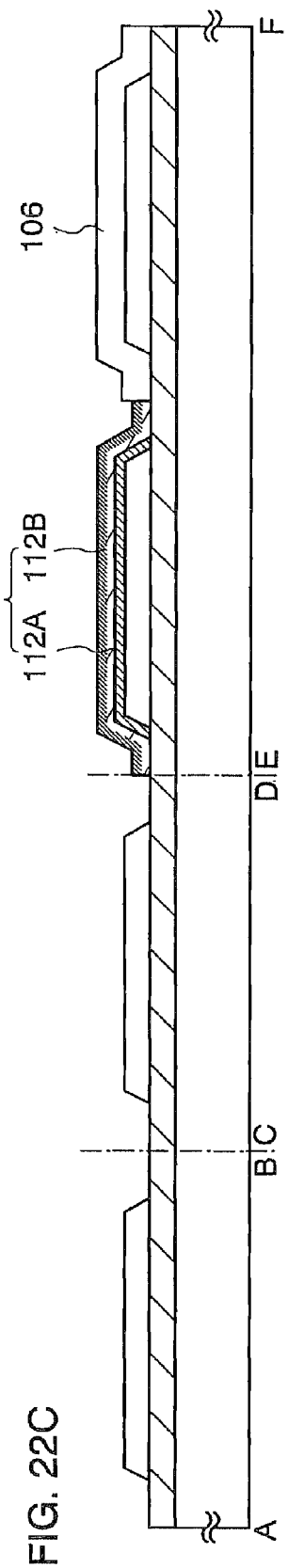

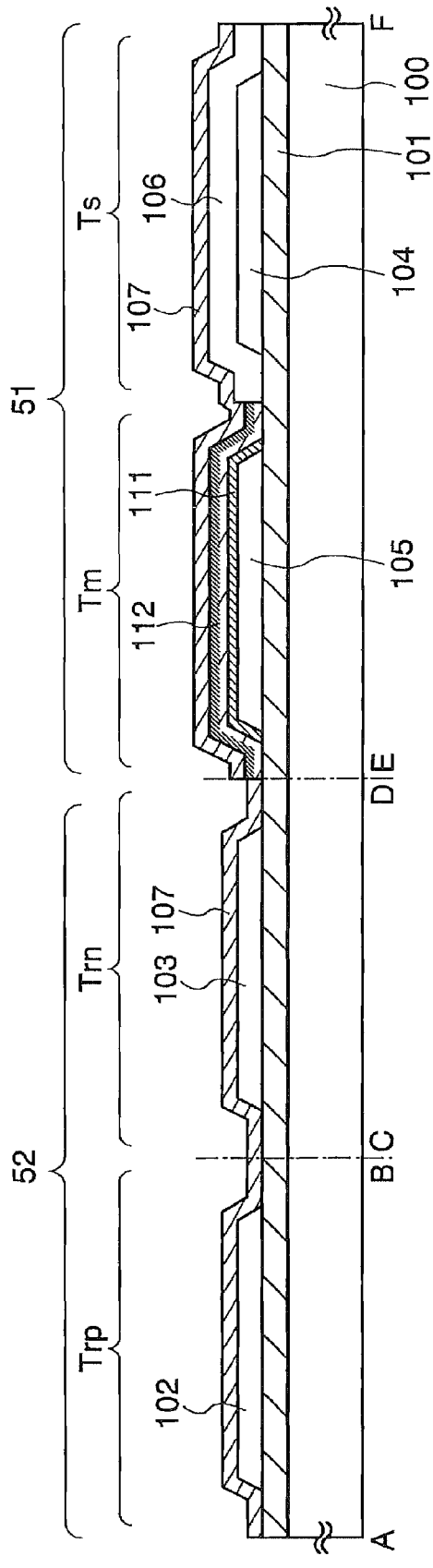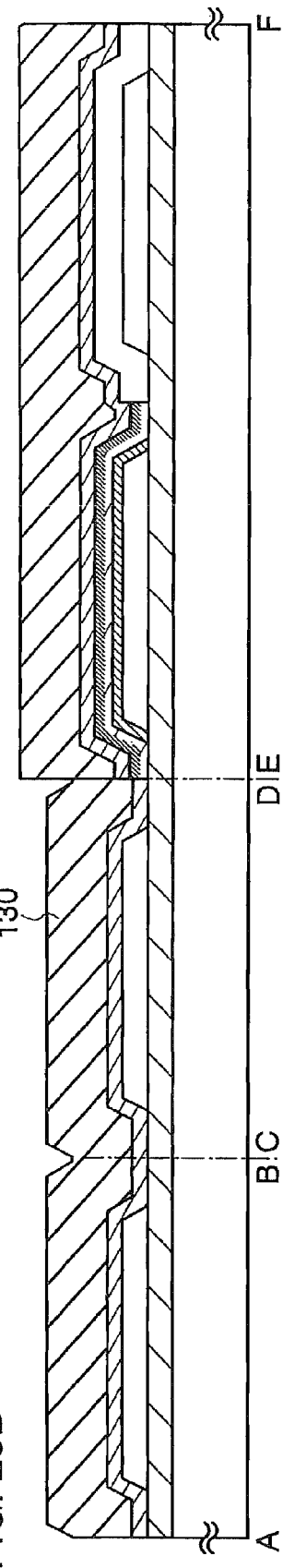

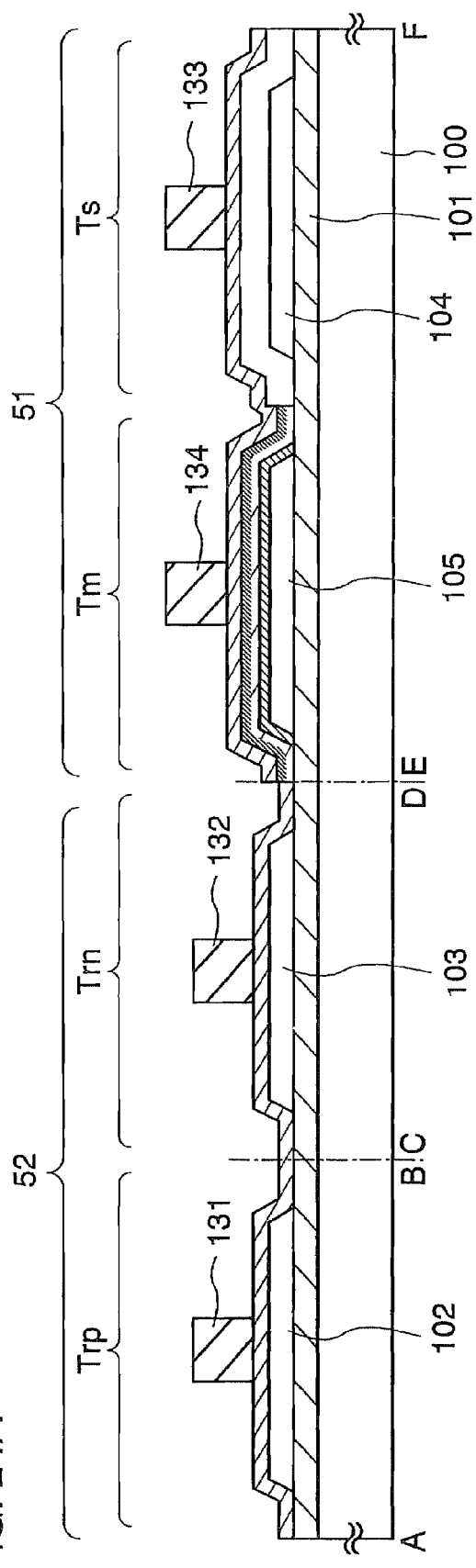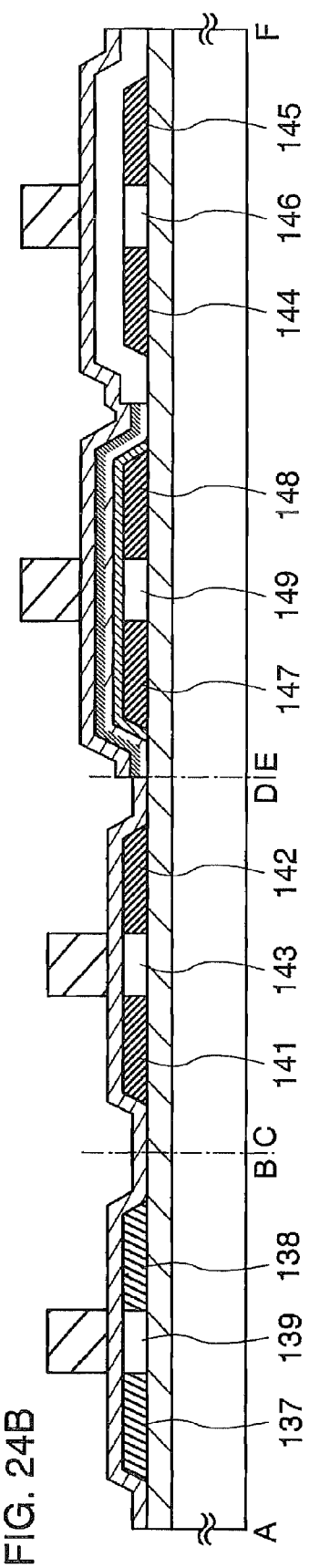

FIG. 26A
FIG. 26B
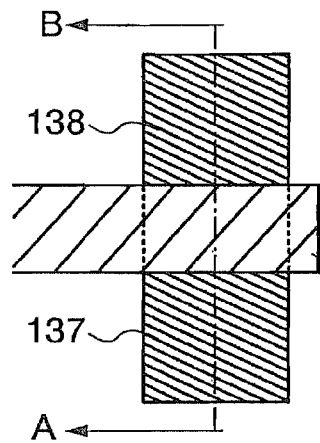
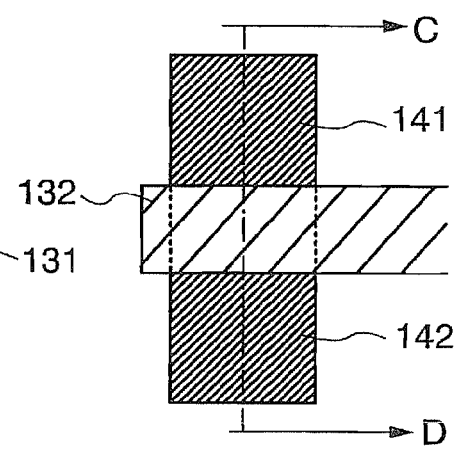
FIG. 26C
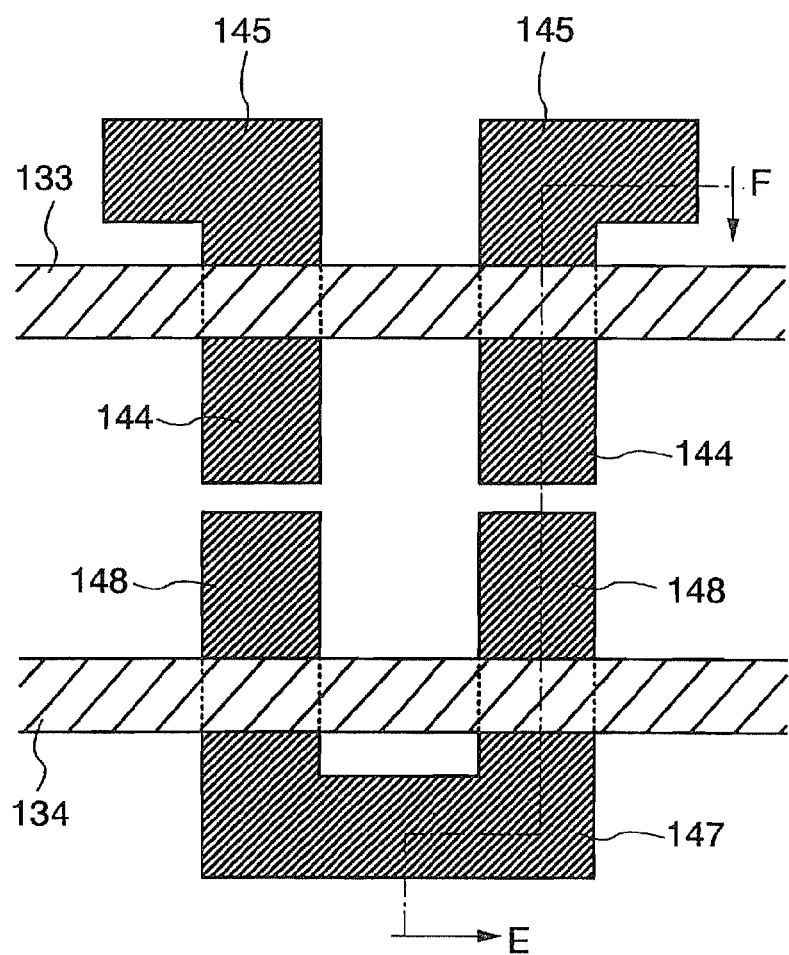

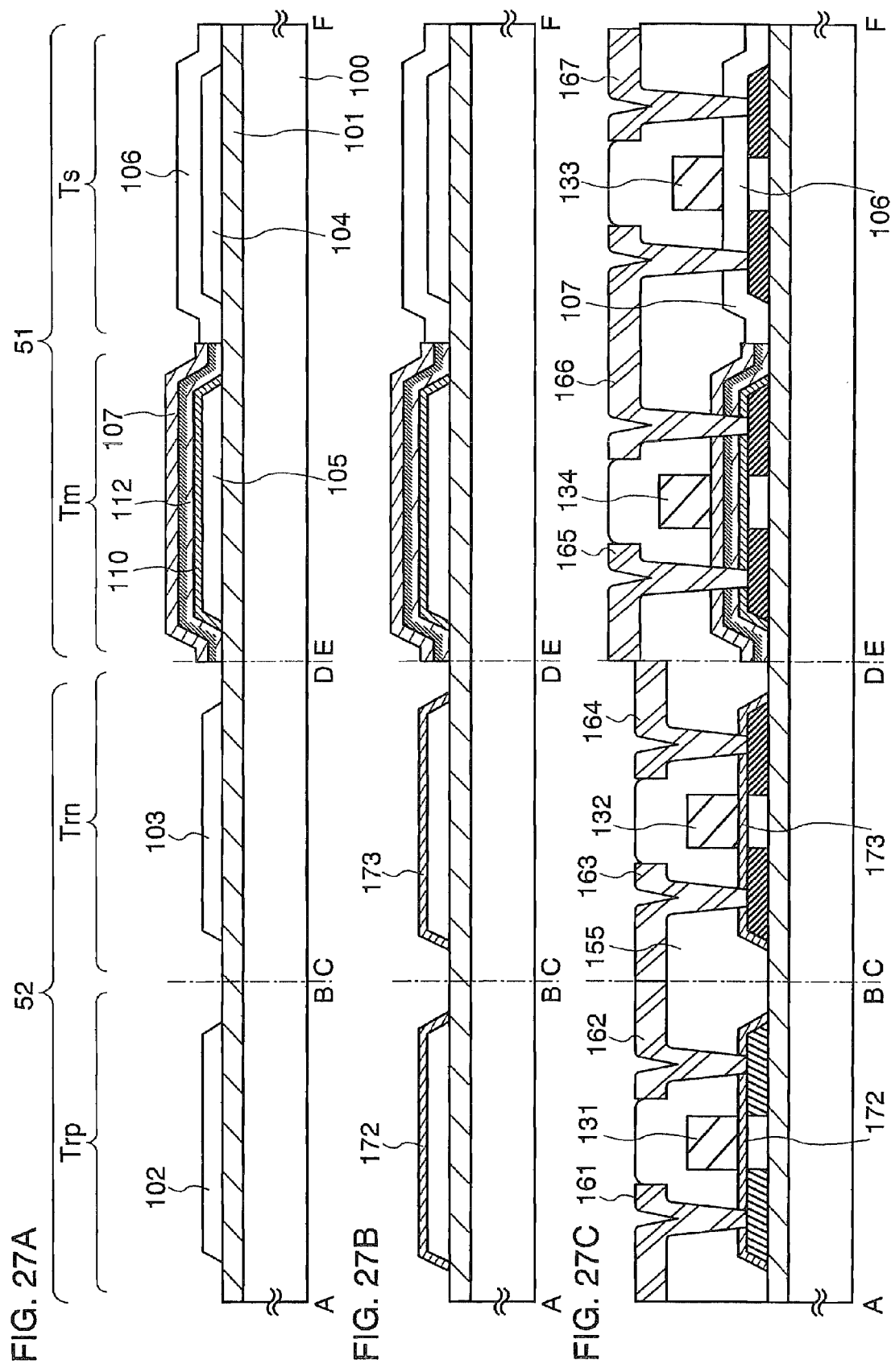

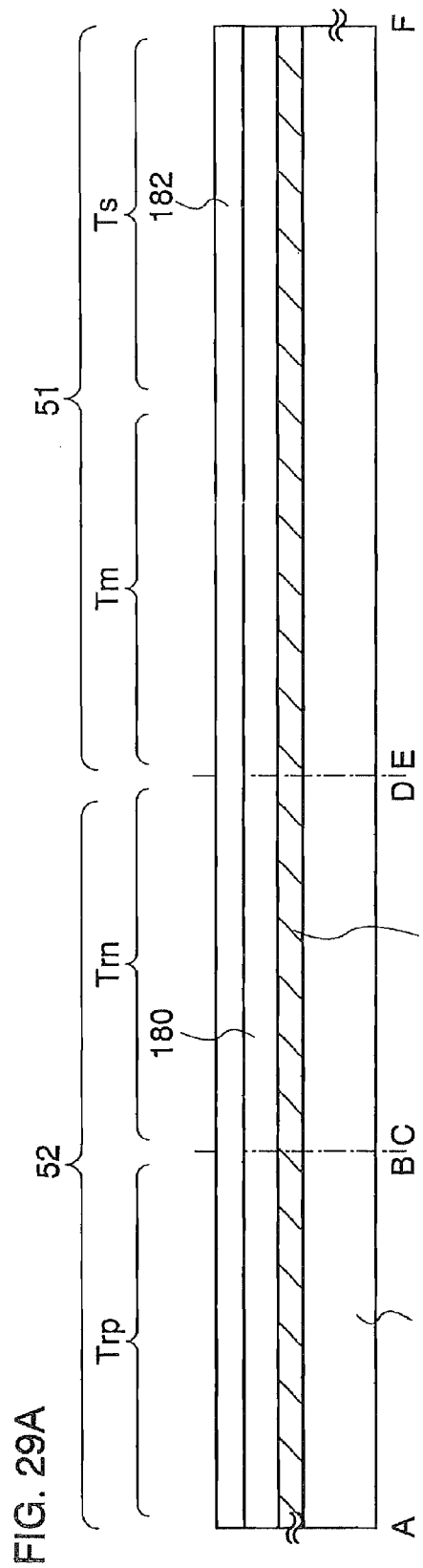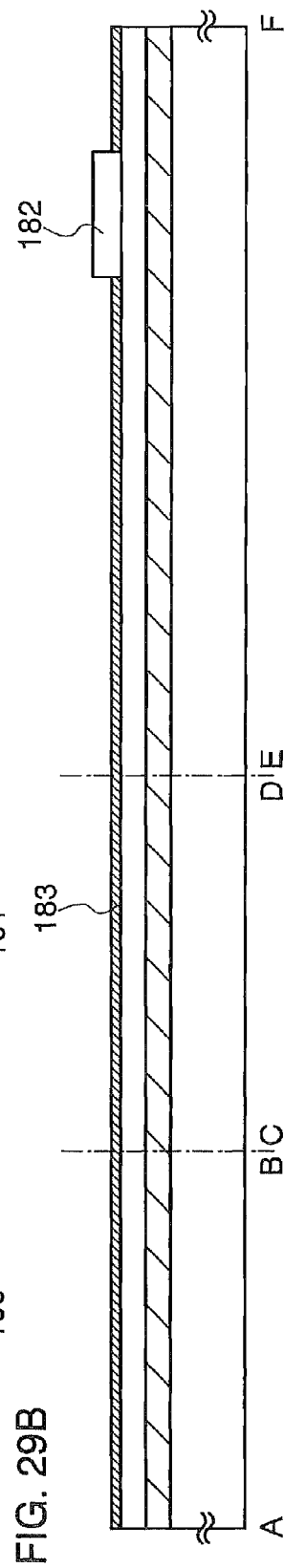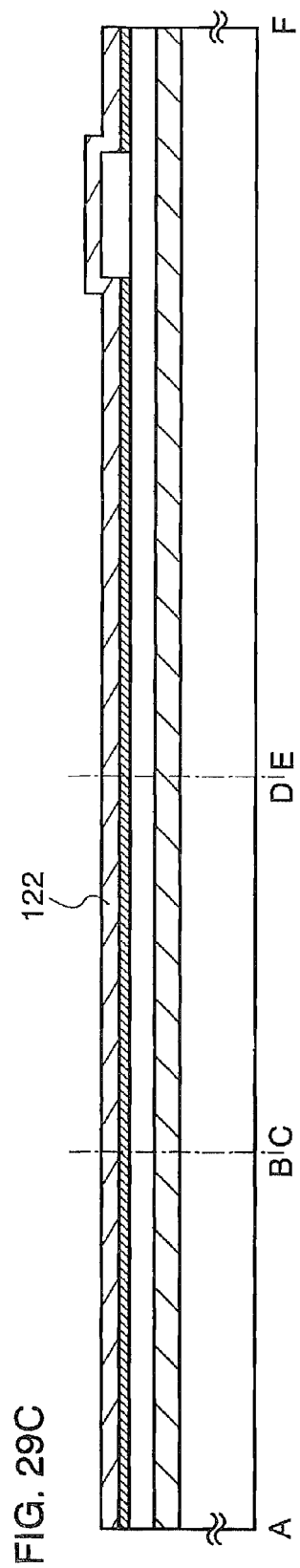

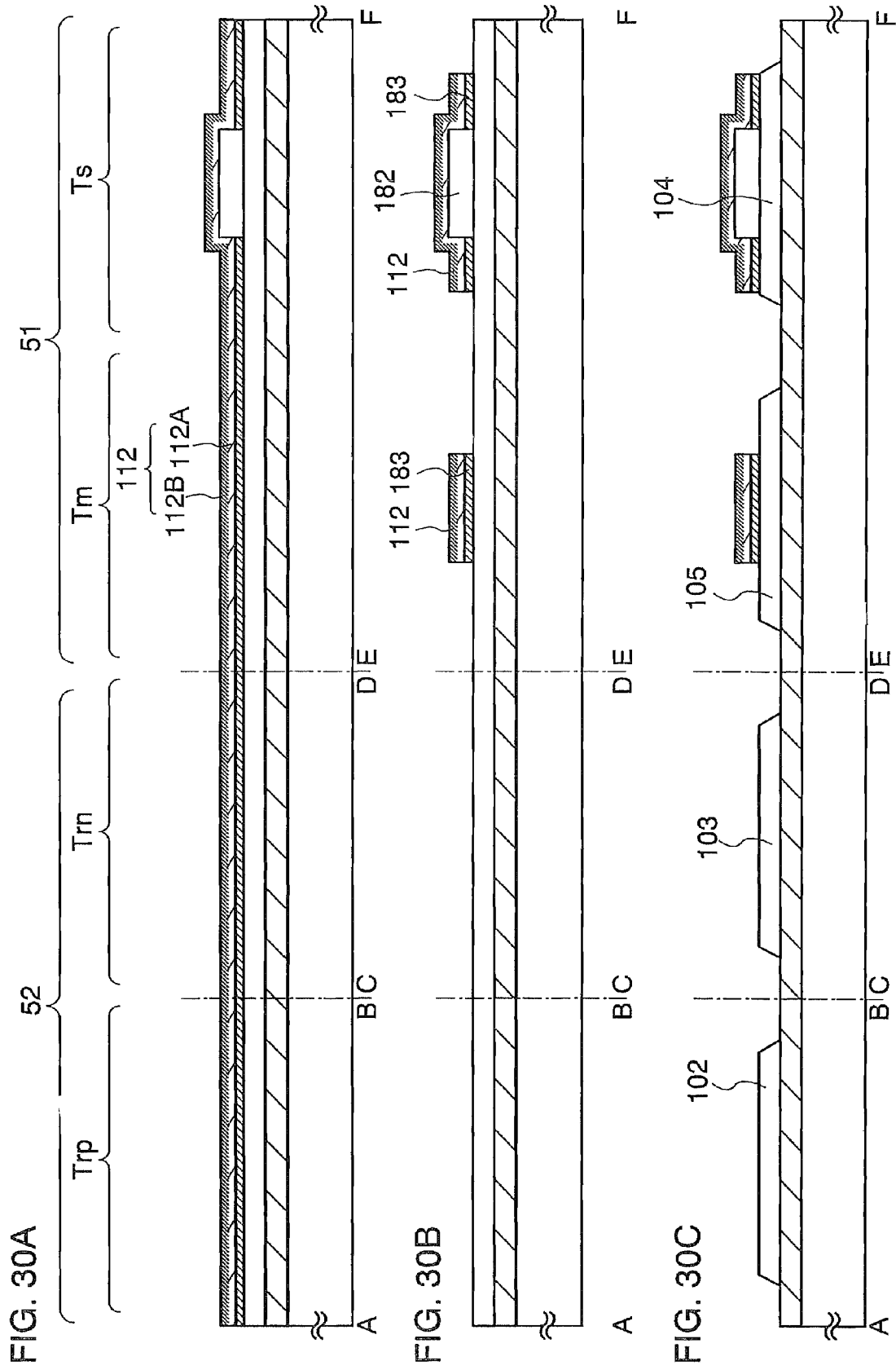

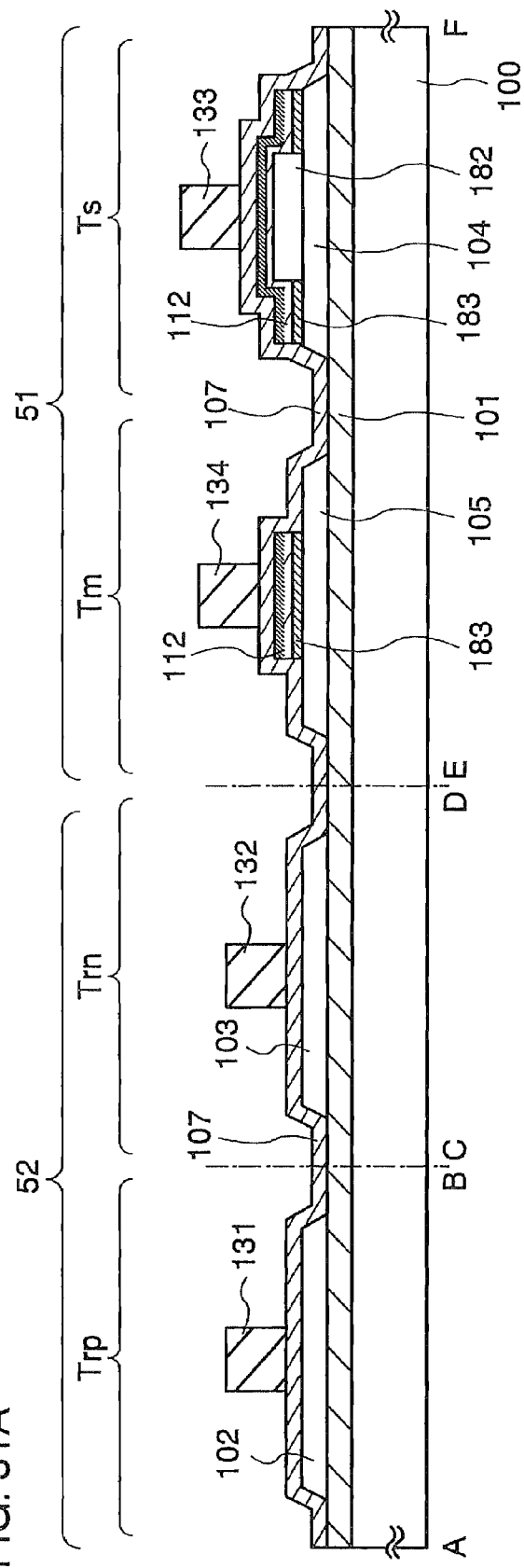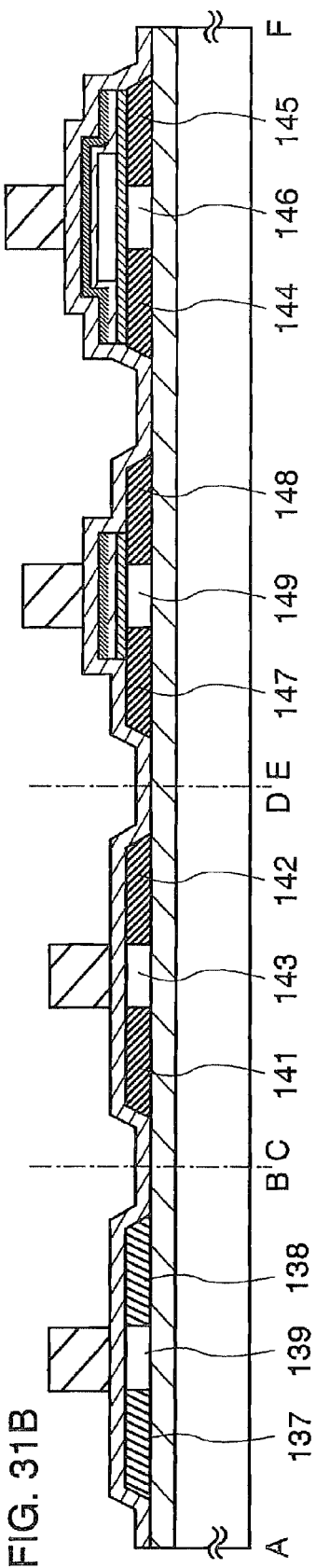

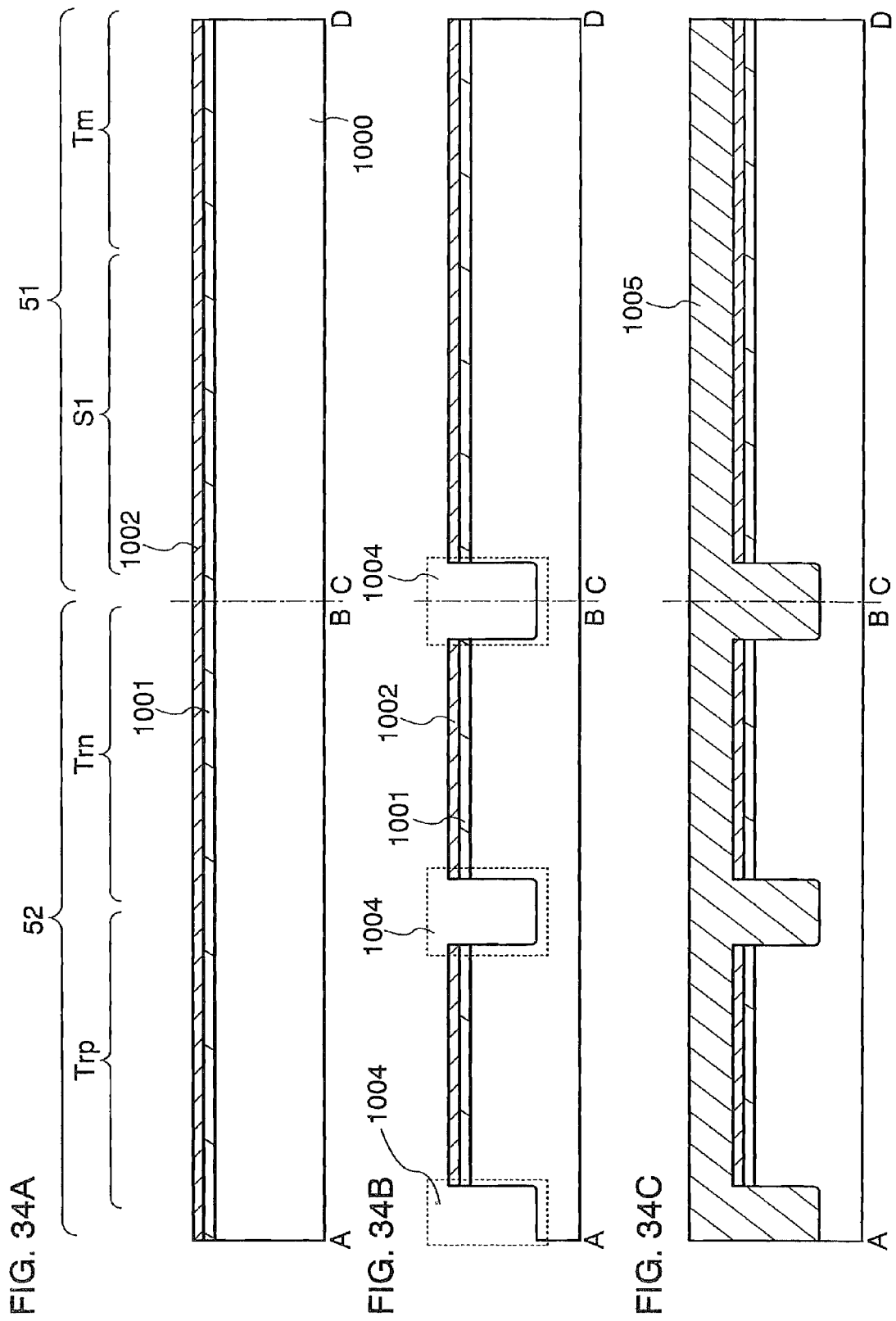

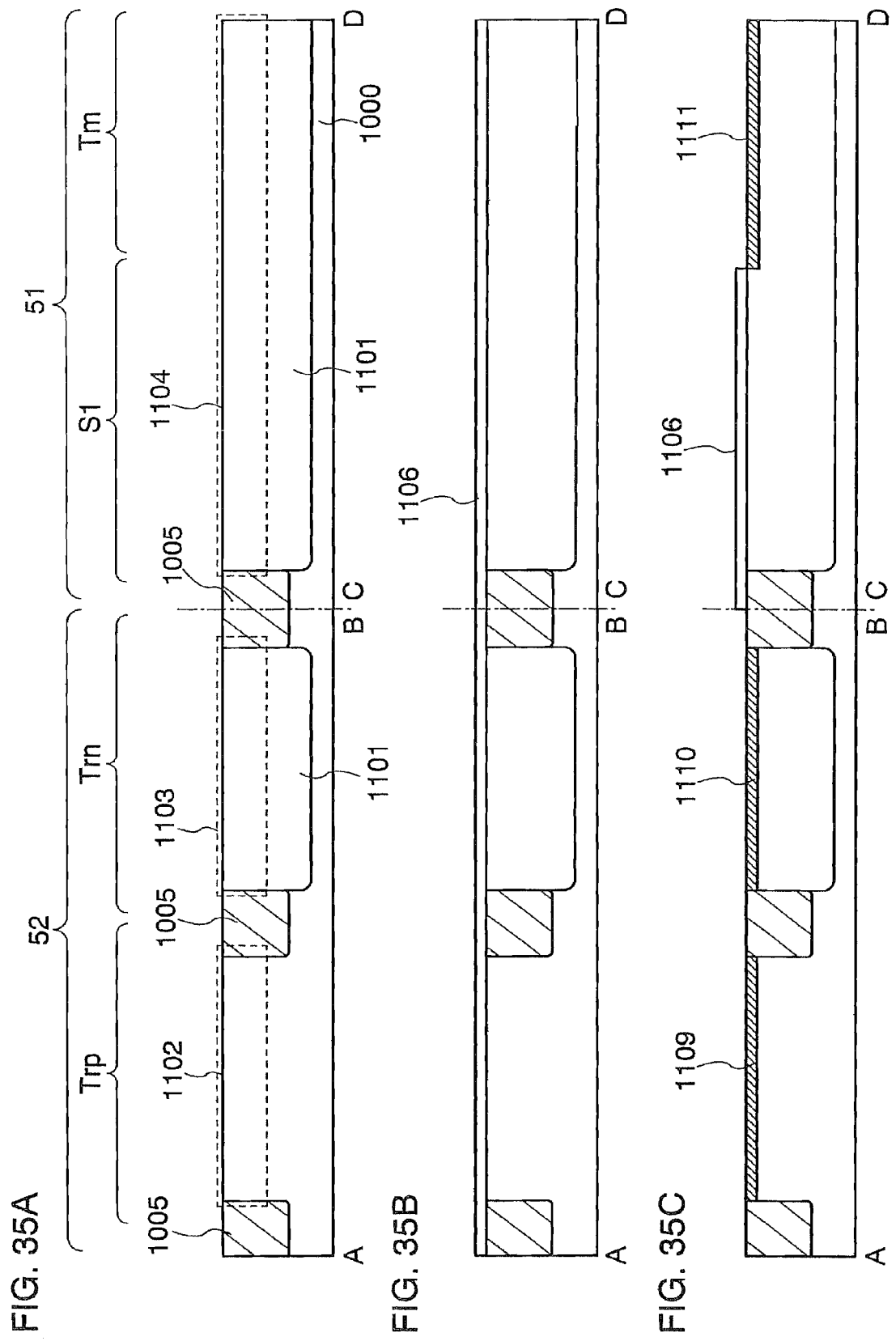

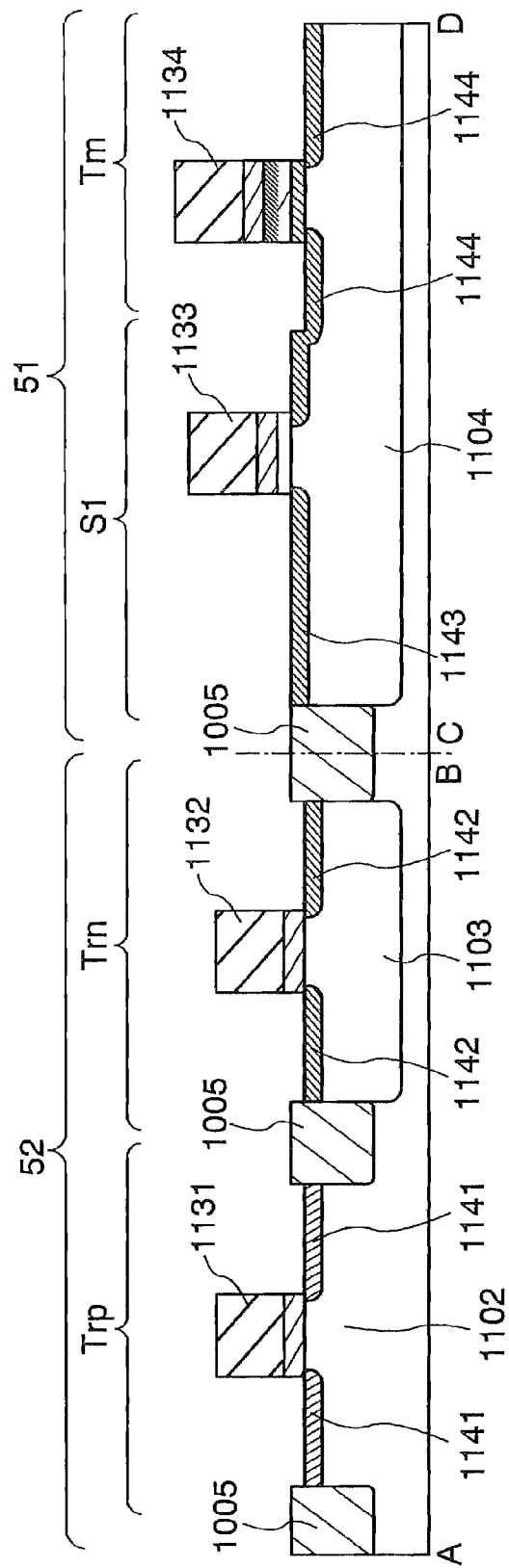
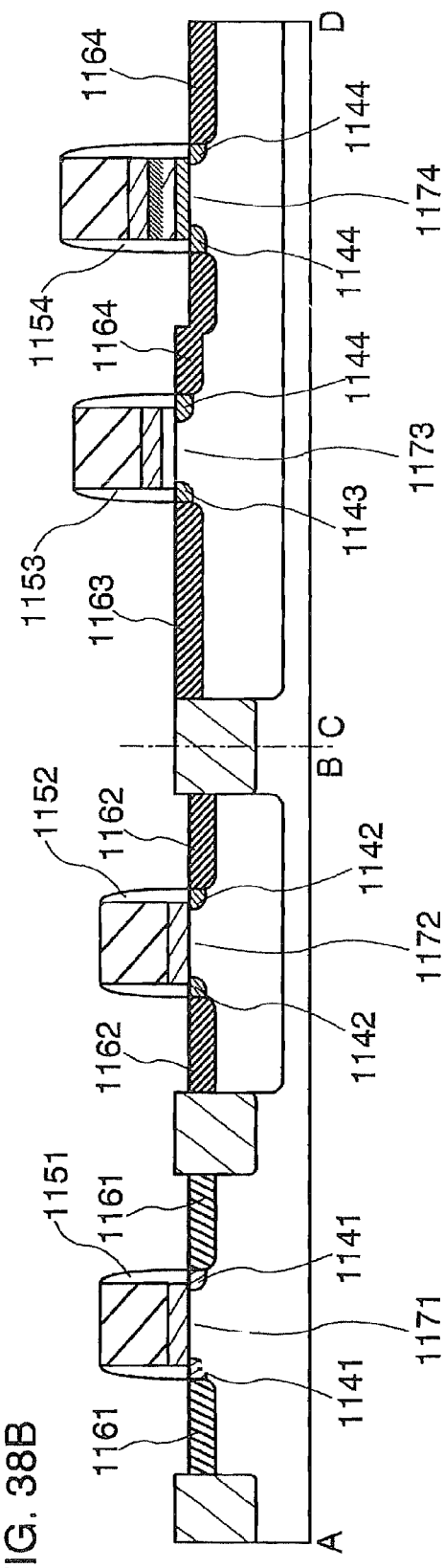
FIG. 38A
FIG. 38B

METHOD FOR MANUFACTURING SEMICONDUCTOR DEVICE WITH SILICON NITRIDE CHARGE TRAPPING FILM HAVING VARYING HYDROGEN CONCENTRATION

BACKGROUND OF THE INVENTION

1. Field of the Invention

The present invention relates to a semiconductor device having a nonvolatile semiconductor memory element capable of writing, erasing, and reading, and a method for manufacturing the semiconductor device.

2. Description of the Related Art

A nonvolatile semiconductor element is a semiconductor element capable of electrically rewriting and storing data even when a power supply is turned off. As the nonvolatile semiconductor memory element, nonvolatile memory elements each having a structure similar to that of a metal oxide semiconductor field effect transistor (MOSFET) are classified into two major groups in terms of a difference in a charge trapping film. One includes a floating-gate (FG) type in which a charge trapping film is formed of a conductive film between a channel formation region and a gate electrode; and the other includes a metal-oxide-nitride-oxide-silicon (MONOS) type and a metal-nitride-oxide-silicon (MNOS) type each of which uses an insulating film as a charge trapping film.

In many of the MONOS memory elements and the MNOS memory elements, a silicon nitride film formed by a chemical vapor deposition method is used as a charge trapping film. It is known that a retention characteristic of a memory transistor can be improved by forming a silicon nitride film forming a charge trapping film with a two-layer structure and adjusting a composition or a composition ratio in the two-layer structure (see References 1 to 3).

In Reference 1 (Japanese Examined Patent Application Publication No. S59-24547), a silicon nitride film having a two-layer structure, which is formed by stacking a silicon nitride film which contains comparatively a lot of Si and a silicon nitride film which contains comparatively a lot of N, is used as a charge trapping film. In order to make the upper layer and the lower layer different in concentrations of Si and N, the flow ratio of $NH_3$ to $SiH_4$ at the time of forming a silicon nitride film by a chemical vapor deposition method is changed.

In Reference 2 (Japanese Published Patent Application No. 2002-203917), a charge trapping film formed of a silicon nitride film having a two-layer structure is used. Charge trap density of a nitride film in the upper layer is made higher than that of a nitride film in the lower layer. To form such a charge trapping film, a silicon source gas is varied; thus, two kinds of silicon nitride films are formed, which are different from each other in concentrations of a Si—H bond and a Si—Cl bond.

The following is described in Reference 3 (Japanese Published Patent Application No. 2004-221448): a silicon nitride film with a Si—H bond density of less than or equal to $1 \times 10^{19}$ $cm^{-3}$ is formed by a reduced pressure chemical vapor deposition method using $SiCl_4$ and $NH_3$ as a source material in order to improve a charge retention characteristic of a charge trapping film.

A chemical vapor deposition method (hereinafter, referred to as a "CVD method") is a method for forming a thin film made of a given substance by decomposing a source gas including a constituent element of a film to be formed, as a composition, and subjecting the source gas to chemical reaction. In order to form a silicon nitride film by a CVD method, $SiH_4$, $SiCl_4$, or the like is used for a silicon source gas, and $NH_3$ is used for a nitrogen source gas. The silicon nitride film which is formed using any of these source gases includes H or Cl which has been included in these source gases. Therefore, the silicon nitride film is formed from silicon nitride with a nonstoichiometric composition, in which a composition ratio of Si to N is out of a stoichiometric composition ratio. Further, as mentioned in References 1 to 3, a composition or a composition ratio of a silicon nitride film affects a charge retention characteristic of the silicon nitride film.

In view of the foregoing problems, the present invention is made by developing a silicon nitride film which is suitable for a charge trapping film. It is an object of the present invention to provide a semiconductor device having a nonvolatile semiconductor memory element capable of improving a charge retention characteristic, and a method for manufacturing the semiconductor device.

SUMMARY OF THE INVENTION

One aspect of the present invention is a semiconductor device having a nonvolatile semiconductor memory element. The nonvolatile semiconductor memory element is formed from a semiconductor and includes a semiconductor region having a source region, a drain region, and a channel formation region, and a conductive film which overlaps with the channel formation region. The nonvolatile semiconductor memory element further includes at least a first insulating film which overlaps with the channel formation region, and a charge trapping, film which is farmed from silicon nitride formed over the first insulating film, between the semiconductor region and the conductive film. In addition, in the nonvolatile semiconductor memory element, the charge trapping film is a silicon nitride film having a distribution of a hydrogen concentration in a thickness direction (also referred to as a depth direction). Note that a second insulating film formed over the charge trapping film can be provided between the semiconductor region and the conductive film of the nonvolatile semiconductor memory element.

One feature of the semiconductor device relating to the present invention includes the charge trapping film of the nonvolatile semiconductor memory element which has a lower region on the first insulating film side and an upper region on the conductive film side, which are adjacent to each other in a thickness direction, where a hydrogen concentration of the lower region is greater than or equal to 15 atomic %, a hydrogen concentration of the upper region is lower than the hydrogen concentration of the lower region. Note that the thickness of the upper region preferably accounts for 40% or more and 60% or less of the thickness of the charge trapping film.

Another feature of the semiconductor device relating to the present invention includes the charge trapping film of the nonvolatile semiconductor memory element which has a lower region on the first insulating film side and an upper region on the conductive film side, which are adjacent to each other in a thickness direction, where a hydrogen concentration of the upper region is 0.7 times or less as high as a hydrogen concentration of the lower region. Note that the thickness of the upper region preferably accounts for 40% or more and 60% or less of a thickness of the charge trapping film. Further, the hydrogen concentration of the lower region is preferably greater than or equal to 15 atomic %.

Another aspect of the present invention is a method for manufacturing a semiconductor device having a nonvolatile semiconductor memory element. The nonvolatile semiconductor memory element manufactured by a method relating to the present invention has a semiconductor region which is formed from a semiconductor and includes a semiconductor region having a source region, a drain region, and a channel formation region, and a conductive film which overlaps with the channel formation region. The nonvolatile semiconductor memory element further includes at least a first insulating film which overlaps with the channel formation region, and a charge trapping film which is formed from silicon nitride formed over the first insulating film, between the semiconductor region and the conductive film.

One feature of the method for manufacturing a semiconductor device of the present invention includes a step of forming a charge trapping film, where a silicon nitride film having a hydrogen concentration of greater than or equal to 15 atomic % is formed by a chemical vapor deposition method and an upper portion of the silicon nitride film is nitrided. With this step, a charge trapping film formed of a silicon nitride film having a distribution of a hydrogen concentration in a thickness direction is formed.

Another feature of the method for manufacturing a semiconductor device of the present invention includes a step of forming a charge trapping film, where a region in which a hydrogen concentration is reduced by 30% or more is formed over an upper portion of the silicon nitride film by forming the silicon nitride film by a chemical vapor deposition method and by nitriding the upper portion of the silicon nitride film. With such a step, a silicon nitride film having a distribution of a hydrogen concentration in a thickness direction is formed. In the above-described present invention, a silicon nitride film having a hydrogen concentration greater than or equal to 15 atomic % is preferably fanned by a chemical vapor deposition method.

In the method for manufacturing a semiconductor device which relates to the present invention, the upper portion of the silicon nitride film can be nitrided by reacting nitrogen radicals with the silicon nitride film. For example, nitrogen radicals can be produced by exciting an $N_2$ gas.

Further, the upper portion of the silicon nitride film can be nitrided by exciting a mixed gas including an $N_2$ gas and a rare gas to produce plasma of the mixed gas and by reacting nitrogen radicals produced in the plasma with the silicon nitride film.

Further, the upper portion of the silicon nitride film can be nitrided by exciting a mixed gas including an $N_2$ gas and a rare gas by a microwave to produce plasma of the mixed gas and by reacting nitrogen radicals produced in the plasma with the silicon nitride film. With the use of a microwave as a plasma excitation source, high-density plasma with an electron density greater than or equal to $1 \times 10^{11}$ cm$^{-3}$ and an electron temperature less than or equal to 3 eV can be produced.

Further, in the step of forming a charge trapping film, a process gas for forming the silicon nitride film includes $NH_3$ as the nitrogen source gas. Alternatively, the process gas includes $H_2$, and $N_2$ as the nitrogen source gas.

Furthermore, in the step of forming a charge trapping film, a silicon nitride film can be formed by a plasma enhanced chemical vapor deposition method.

Note that in the present invention, a semiconductor device includes devices capable of functioning with the use of semiconductor characteristics. For example, integrated circuits and electronic devices are all included in semiconductor devices. Further, in the present invention, as a data writing method and a data erasing method of a nonvolatile memory transistor, there are a method that uses Fowler-Nordheim (F-N) tunneling current, a method that uses direct tunneling current, a method that uses hot carriers; and the like.

According to the present invention, a charge retention characteristic of a nonvolatile semiconductor memory element can be improved, and a semiconductor device having data storage capability with high reliability can be provided. Further, a method for manufacturing such a semiconductor device can be provided.

BRIEF DESCRIPTION OF THE DRAWINGS

In the accompanying drawings:

FIGS. 8A to 8D are graphs of capacitance-voltage characteristics of nonvolatile memory capacitors (a memory element B and a comparative memory element b);

FIGS. 9A to 9D are graphs of capacitance-voltage characteristics of nonvolatile memory capacitors (comparative memory elements Z and z);

FIG. 11 is a table showing a composition of a silicon nitride film formed by a PECVD method;

FIG. 12 is a table showing concentrations of a Si—H bond and a N—H bond of a silicon nitride film formed by a PECVD method;

FIGS. 17A and 17B are circuit diagrams illustrating writing operation of a memory cell array;

FIGS. 21A to 21C are cross-sectional views showing a method for manufacturing the semiconductor device of FIG. 19;

FIGS. 22A to 22C are cross-sectional views showing a method for manufacturing a semiconductor device;

FIGS. 23A and 23B are cross-sectional views showing a method for manufacturing a semiconductor device, which are continued from FIG. 22C;

FIGS. 24A and 24B are cross-sectional views showing a method for manufacturing a semiconductor device, which are continued from FIG. 23B;

FIGS. 26A to 26C are top views of FIG. 24B;

FIGS. 27A to 27C are cross-sectional views showing a method for manufacturing a semiconductor device;

FIGS. 29A to 29C are cross-sectional views showing a method for manufacturing the semiconductor device of FIG. 28;

FIGS. 30A to 30C are cross-sectional views showing a method for manufacturing a semiconductor device, which are continued from FIG. 29C;

FIGS. 31A and 31B are cross-sectional views showing a method for manufacturing a semiconductor device, which are continued from FIG. 30C;

FIGS. 34A to 34C are cross-sectional views showing a method for manufacturing the semiconductor device of FIG. 32;

FIGS. 35A to 35C are cross-sectional views showing a method for manufacturing a semiconductor device, which are continued from FIG. 34C;

FIGS. 38A and 38B are cross-sectional views showing a method for manufacturing a semiconductor device, which are continued from FIG. 37B;

DETAILED DESCRIPTION OF THE INVENTION

Embodiment Mode

Figure 1:
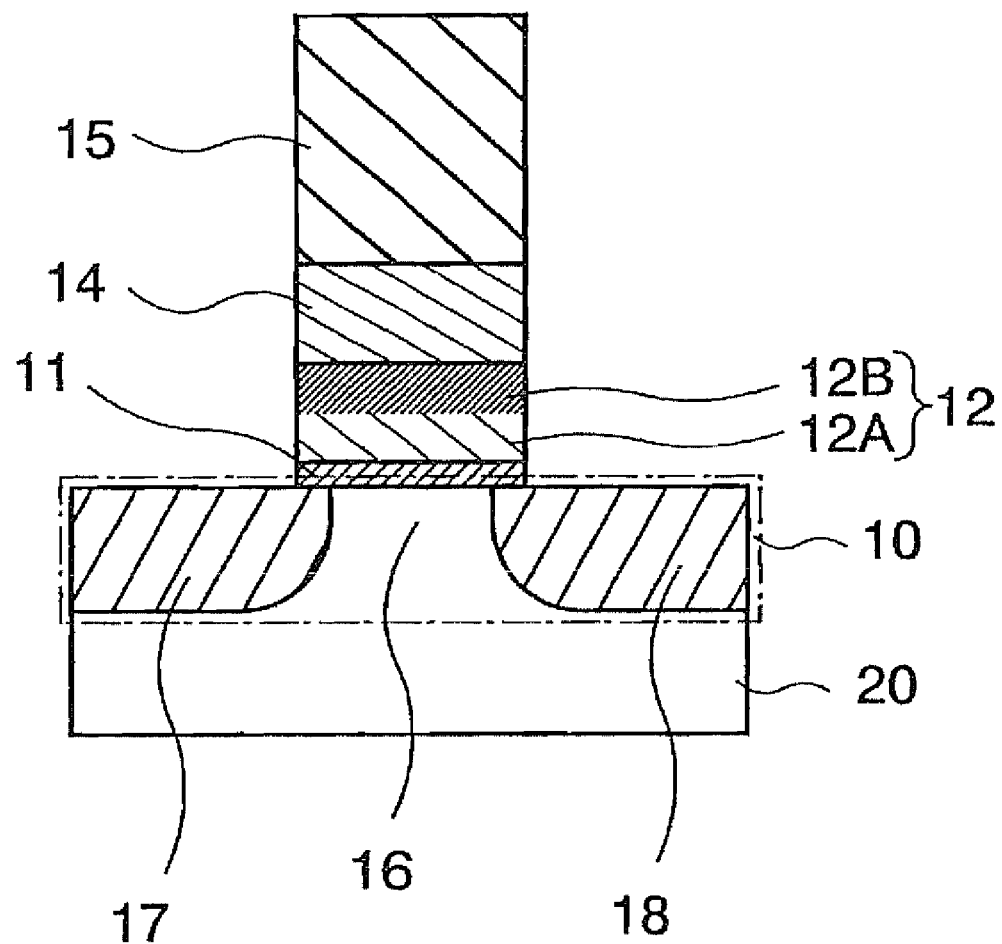
FIG. 1 is a cross-sectional view showing a structural example of a nonvolatile memory transistor.

The present invention will be hereinafter described. The present invention can be implemented in various different modes, and it is easily understood by those skilled in the art that various changes and modifications of the modes and details are possible without departing from the purpose and scope of the present invention. Therefore, the present invention is not construed as being limited to the description of Embodiment Modes. Note that the same portion is denoted by the same reference numeral in all drawings, and repetition explanation of materials, shapes, manufacturing methods, and the like is omitted.

Embodiment Mode 1

This embodiment mode describes a structure of a nonvolatile memory transistor as a nonvolatile memory element, and a method for manufacturing the nonvolatile memory transistor.

FIG. 1 is a cross-sectional view for illustrating a main structure of a MONOS-type nonvolatile memory transistor. A nonvolatile memory transistor of FIG. 1 includes a semiconductor substrate 20 provided with a semiconductor region 10. In the semiconductor region 10, a channel formation region 16, and a high concentration impurity region 17 and a high concentration impurity region 18 which sandwich the channel formation region 16 are formed. One of the high concentration impurity regions 17 and 18 is a region serving as a source region of the memory transistor, and the other of the high concentration impurity regions 17 and 18 is a region serving as a drain region of the memory transistor.

Over the semiconductor region 10, a first insulating film 11, a charge trapping film 12, a second insulating film 14, and a conductive film 15 are stacked in this order. These films 11, 12, 14, and 15 overlap with the channel formation region 16 in the semiconductor region 10. The conductive film 15 serves as a gate electrode of the memory transistor.

A bulk single-crystal or polycrystalline silicon substrate (silicon wafer), a single-crystal or polycrystalline silicon germanium substrate, or a single-crystal or polycrystalline germanium substrate can be used as the semiconductor substrate 20. Further, an SOI (silicon on insulator) substrate in which a semiconductor layer with a thickness of less than or equal to 1 μm is formed over an insulating layer can be used. As the SOI substrate, a so-called SIMOX (separation by implanted oxygen) substrate can be used, which is formed in such a manner that after oxygen ions are injected into a mirror-polished wafer and high-temperature annealing is performed so that an oxide layer is formed at a certain depth from the surface and defects generated in a surface layer are eliminated. Further, an SOI substrate formed using a Smart-Cut (registered trademark) method can be used. In a similar manner to the SOI substrate, an SGOI (silicon-germanium on insulator) substrate or a GOI (germanium on insulator) substrate can also be used.

As a method for taking charge in and out of the charge trapping film 12, namely a writing method and an erasing method of a nonvolatile memory transistor, there are a method that uses F-N tunneling current, a method that uses direct tunneling current, and a method that uses hot carriers. The nonvolatile memory transistor of FIG. 1 can use a method selected from these methods, as appropriate, as the writing method and the erasing method. Therefore, the first insulating film 11 is formed to be thin so that charge passes through the first insulating film 11. The thickness of the first insulating film 11 is preferably greater than or equal to 1 nm and less than or equal to 10 nm, more preferably greater than or equal to 1 nm and less than or equal to 5 nm. The first insulating film 11 can be formed of a film with a single-layer structure using an insulating material selected from silicon oxide, silicon oxynitride ($SiO_xN_y$, where x>0 and y>0), or metal oxide. As the metal oxide, aluminum oxide, tantalum oxide, zirconium oxide, hafnium oxide, or the like is used. Further, the first insulating film 11 with a single-layer structure can be formed using a silicon oxide film an upper portion of which is nitrided, a silicon oxynitride film, or the like. Furthermore, the first insulating film 11 can be formed of an insulating film with a two-layer structure in which an insulating film formed from a material selected from silicon oxynitride, aluminum oxide, tantalum oxide, zirconium oxide, or hafnium oxide is stacked on a silicon oxide film, as well.

The charge trapping film 12 is formed of a silicon nitride film, and the thickness can be greater than or equal to 2 nm and less than or equal to 20 nm, preferably greater than or equal to 5 nm and less than or equal to 15 nm. Further, the charge trapping film 12 has a distribution of a nitrogen concentration and a hydrogen concentration in a thickness direction. In the charge trapping film 12, the hydrogen concentration of the upper portion is lower than the hydrogen concentration of the lower portion.

With the use of the charge trapping film 12 formed of a silicon nitride film having a concentration difference of hydrogen in a thickness direction, a retention characteristic of a nonvolatile memory transistor can be improved. Further, voltage applied to the conductive film 15 in writing data to the nonvolatile memory transistor (more precisely, the absolute value of voltage) can be reduced. Furthermore, voltage applied to the conductive film 15 in erasing data from the nonvolatile memory transistor (more precisely, the absolute value of voltage) can be reduced.

In the charge trapping film 12, the thickness of an upper region 12B can account for 40% or more and 60% or less of the thickness of the charge trapping film 12. It is preferable that the thickness of the upper region 12B be approximately equal to the thickness of a lower region 12A, and the thickness of the upper region 12B preferably accounts for 45% or more and 55% or less of the thickness of the charge trapping film 12.

The charge trapping film 12 includes the lower region 12A and the upper region 12B which are adjacent to each other in a thickness direction. A hydrogen concentration of the upper region 12B is lower than a hydrogen concentration of the lower region 12A. Also, note that the hydrogen concentration in the lower region 12A is preferably greater than or equal to 15 atomic %, more preferably 20 atomic %. That is, the charge trapping film 12 has a distribution of a hydrogen concentration in the thickness direction. In the charge trapping film 12, a lot of nitrogen is present on the conductive film 15 side and a lot of hydrogen is present on the semiconductor region 10 side. As described above, the charge trapping film 12 is formed of a silicon nitride film including the upper region 12B on the conductive film 15 side where a hydrogen concentration is low and the lower region 12A on the semiconductor region 10 side where a hydrogen concentration is high. With the use of the charge trapping film 12 as described above, a retention characteristic of a nonvolatile memory transistor can be improved.

Meanwhile, the charge trapping film 12 may have a nitrogen concentration distribution in the thickness direction, and the upper region 12B may have a higher nitrogen concentration than the lower region 12A.

Further, the hydrogen concentration of the upper region 12B is preferably 0.7 times or less, more preferably 0.6 times or less, as high as the hydrogen concentration of the lower region 12A.

The hydrogen concentration of the lower region 12A can be greater than or equal to 15 atomic %; however, the hydrogen concentration of the lower region 12A is preferably less than or equal to 25 atomic %. If the hydrogen concentration of the lower region 12A exceeds 25 atomic %, the lower region 12A becomes brittle and dielectric strength of the lower region 12A is lowered; thus, it is difficult to make the lower region 12A function as a charge trap. On the other hand, the hydrogen concentration of the upper region 12B may be lower than the hydrogen concentration of the lower region 12A. The hydrogen concentration of the upper region 12B is preferably less than or equal to 12 atomic %, more preferably less than or equal to 10 atomic %.

The second insulating film 14 is a film for preventing leakage charges from the charge trapping film 12 and for preventing injection of charges from the conductive film 15 into the charge trapping film 12. The second insulating film 14 can be formed at a thickness greater than or equal to 1 nm and less than or equal to 20 nm. The second insulating film 14 preferably has a thickness greater than or equal to 5 nm and less than or equal to 10 nm. The second insulating film 14 can be formed of a single-layer film or a multilayer film including two or more layers which is formed from an insulating material selected from silicon oxide, silicon oxynitride, silicon nitride oxide, silicon nitride, aluminum oxide, tantalum oxide, zirconium oxide, or hafnium oxide. In the case of using an insulating film with a single-layer structure, a film made of an oxide or a silicon oxynitride film is preferably used. For example, in the case of using an insulating film with a two-layer structure, it is preferable that a silicon oxide film or a silicon oxynitride film be formed in the lower layer and an insulating film with higher dielectric constant than the silicon oxide film or the silicon oxynitride film be formed in the upper layer. For example, a stacked-layer film of a silicon oxide film and a silicon nitride film and a stacked-layer film of a silicon oxynitride film and a silicon nitride film can be given. With such a stacked-layer structure, equivalent oxide thickness (EOT) of the second insulating film 14 can be reduced. By reducing EOT, voltage which is applied to a memory element and is needed for writing and erasing can also be reduced without changing a physical thickness of the second insulating film 14.

The conductive film 15 is a film with a single-layer structure or a stacked-layer structure, and the conductive film 15 forms a gate electrode of a nonvolatile memory transistor. As a conductive material which forms the conductive film 15, a metal selected from tantalum (Ta), tungsten (W), titanium (Ti), molybdenum (Mo), chromium (Cr), niobium (Nb), or the like; an alloy or a compound containing any of these metals as its main component (e.g., metal nitride or silicide); or polycrystalline silicon doped with a dopant such as phosphorus or arsenic can be used. For example, the conductive film 15 can have a stacked-layer structure including metal nitride of a single layer or a plurality of layers and a layer formed from a simple metal thereover. For this metal nitride, tungsten nitride, molybdenum nitride, and titanium nitride can be used. By formation of a metal nitride film to be in contact with the second insulating film 14, separation of the simple metal film thereover can be prevented. Since metal nitride such as tantalum nitride has a high work function, the first insulating film 11 can be formed to be thick due to synergy with the second insulating film 14.

Next, a method for manufacturing the nonvolatile memory transistor shown in FIG. 1 is described with reference to FIGS. 2A to 2F.

The first insulating film 11 is formed over a top surface of the semiconductor substrate 20. For example, as a method for forming a silicon oxide film as the first insulating film 11, the following methods are given: a method for oxidizing a surface of the semiconductor substrate 20 by heating the semiconductor substrate 20 in an atmosphere including oxygen (thermal oxidation treatment); a method for oxidizing a surface of the semiconductor substrate 20 by oxygen radicals produced by exciting a gas including oxygen in a composition (for example, oxygen ($O_2$) or dinitrogen monoxide ($N_2O$)) (oxidation treatment by oxygen radicals); a method for forming a silicon oxide film by a CVD method such as a PECVD method or a thermal CVD method; and the like.

As a method for forming a silicon oxynitride film as the first insulating film 11, there is a method in which a surface is oxidized by thermal oxidation treatment or oxidation treatment by oxygen radicals to form a silicon oxide film, and the obtained silicon oxide film is nitrided. As the nitridation treatment, treatment in which a semiconductor substrate is heated in a nitrided atmosphere (thermal nitridation treatment), or a method in which nitrogen radicals (N radicals) or hydronitrogen radicals (NH radicals) are produced by exciting a nitrogen gas or an ammonia gas, and nitridation is performed using these radicals. The silicon oxynitride film can be formed by a CVD method such as a PECVD method. As the first insulating film 11, a metal oxide film such as an aluminum oxide film may be formed. The metal oxide film can be formed by a sputtering method, a metal-organic chemical vapor deposition (MOCVD) method, or the like.

When the oxidation treatment by oxygen radicals or nitridation treatment by nitrogen radicals or hydronitrogen radicals is performed, it is preferable that a gas be excited by a microwave to produce plasma. This is because high-density plasma with an electron density greater than or equal to $1 \times 10^{11}$ cm$^{-3}$ and with an electron temperature less than or equal to 3 eV can be produced. A typical frequency of a microwave for producing high-density plasma is 2.45 GHz. With the use of high-density plasma, an insulating film can be formed at a heating temperature less than or equal to 550° C. and at practical reaction rate. That is, high-density plasma is produced by a microwave, and radicals produced in the high-density plasma is reacted with an object (an object to be treated), whereby the object can be oxidized or nitrided by solid-phase reaction at a substrate heating temperature less than or equal to 550° C., which is low, in a short time.

Figure 3:
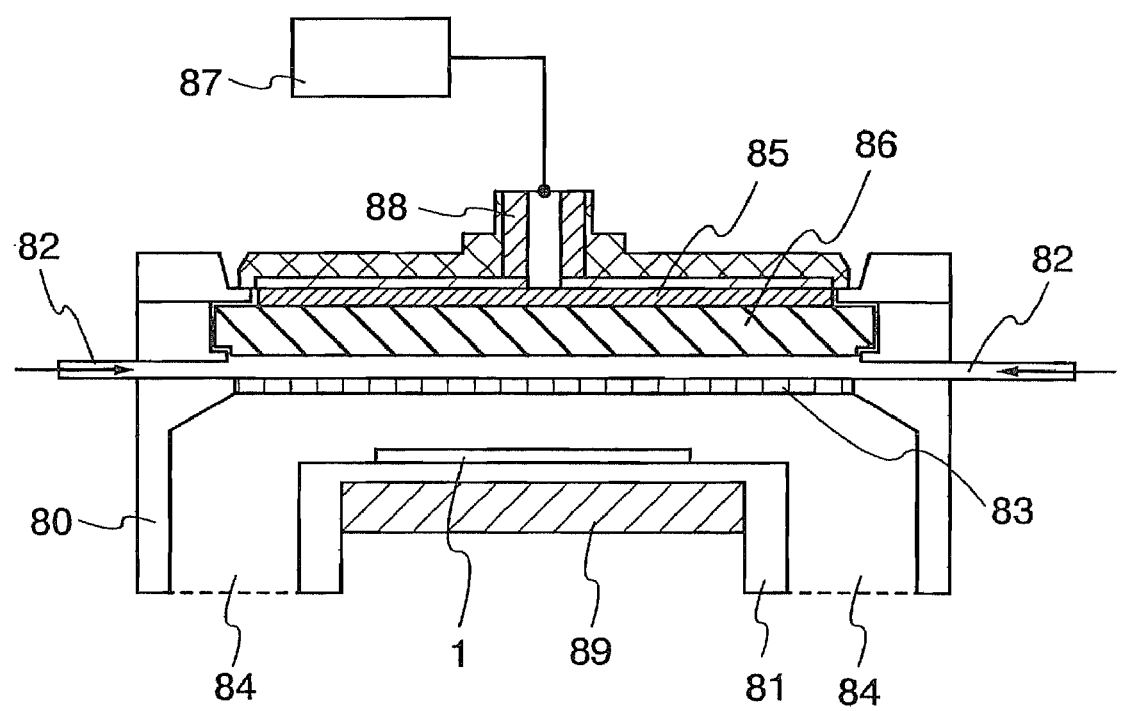
FIG. 3 is a cross-sectional view for illustrating a structural example of a high-density plasma treatment apparatus.

FIG. 3 shows a structural example of a high-density plasma treatment apparatus for performing various kinds of treatment using high-density plasma produced by excitation by a microwave. As treatment using high-density plasma (hereinafter, referred to as "high-density plasma treatment"), there are oxidation treatment, nitridation treatment, oxynitridation treatment, hydrogenation treatment, surface modification treatment, and the like with respect to a semiconductor material, an insulating material, and a conductive material. Desired treatment can be performed by changing a gas to be excited by plasma.

The high-density plasma treatment apparatus shown in FIG. 3 includes a treatment chamber 80 for producing plasma. The treatment chamber 80 includes a stage 81 for disposing an object 1 such as a substrate; a shower plate 83 which is coupled to a gas supply portion 82; and an exhaust port 84 which is connected to a vacuum pump for exhausting a gas from the treatment chamber 80. The upper portion of the treatment chamber 80 includes a coaxial waveguide 88, which is coupled to a microwave generating portion 87; an antenna 85; and a dielectric plate 86. In addition, by providing a temperature control portion 89 for the stage 81, it is also possible to control the temperature of the object 1.

To perform high-density plasma treatment, a given gas is supplied from the gas supply portion 82. The gas passes through holes of the shower plate 83 to be introduced into the treatment chamber 80. A microwave with a frequency of 2.45 GHz is generated from the microwave generating portion 87 to be supplied to the coaxial waveguide 88. The microwave is supplied from the coaxial waveguide 88 and antenna 85 sides to the treatment chamber 80 through the dielectric plate 86. The gas supplied to the treatment chamber 80 is excited by the microwave; thus, high-density plasma is produced. The distance between the stage 81 and the shower plate 83 (hereinafter, also referred to as an electrode distance) can be greater than or equal to 20 mm and less than or equal to 80 mm, preferably greater than or equal to 20 mm and less than or equal to 60 mm. Further, with the temperature control portion 89, high-density plasma treatment can be performed with the object 1 heated.

In the case of performing oxidation treatment, a rare gas as well as a gas including oxygen in a composition is preferably included in a gas to be excited by plasma. The gas including oxygen in a composition is, for example, oxygen ($O_2$), dinitrogen monoxide ($N_2O$), or the like. Also in the case of performing nitridation treatment, a rare gas as well as a gas including nitrogen in a composition is preferably included in a gas to be excited by plasma. The gas including nitrogen in a composition is, for example, nitrogen ($N_2$), ammonia ($NH_3$), or the like. The addition of a rare gas makes it possible to efficiently produce oxygen radicals (hereinafter, referred to as "O*") and nitrogen radicals (hereinafter, referred to as "N*") in plasma. As the rare gas, one kind or more kinds of gases selected from He, Ne, Ar, Kr, or Xe can be used. In order to produce high-density plasma, it is preferable to use Ar, Kr, and Xe which have a larger atomic radius.

An example of a method for performing oxidation treatment on an object, with the high-density plasma treatment apparatus which is shown in FIG. 3, is described. Each of $O_2$ and Kr is supplied to the treatment chamber 80 from the gas supply portion 82, and a microwave is introduced into the treatment chamber 80; thus, plasma of a mixed gas of $O_2$ and Kr is produced. In the resulting plasma, Kr is excited by the introduced microwave to produce Kr radicals (hereinafter, referred to as "Kr*"), and the Kr* and oxygen molecules ($O_2$) are collided, whereby O* is produced. O* thus produced in plasma is reacted with the object which is on the stage 81; thus, the object 1 is oxidized. Further, a hydrogen ($H_2$) gas is excited as well as a gas including oxygen in a composition and a rare gas to produce OH radicals (hereinafter, referred to as "OH*") in plasma, whereby the object 1 can be oxidized by OH*. The heating temperature for oxidation treatment can be greater than or equal to 300° C. and less than or equal to 550° C., and the pressure is preferably greater than or equal to 100 Pa and less than or equal to 140 Pa.

An example of a method for performing nitridation treatment on an object, with the high-density plasma treatment apparatus which is shown in FIG. 3, is described. Each of $N_2$ and Kr is supplied to the treatment chamber 80 from the gas supply portion 82, and a microwave is introduced into the treatment chamber 80; thus, plasma of a mixed gas of $N_2$ and Kr is produced. In the resulting plasma, Kr is excited by the introduced microwave to produce Kr*, and the Kr* and nitrogen molecules ($N_2$) are collided, whereby N* is produced. N* thus produced in plasma is reacted with the object 1 which is on the stage 81; thus, the object 1 is nitrided. Further, a mixed gas of $N_2$, $H_2$, and a rare gas, or a mixed gas of $NH_3$ and a rare gas is excited, whereby nitridation treatment can be performed. N* and NH radicals (hereinafter, referred to as "NH*") are produced in plasma of the mixed gas, and the object is nitrided by N* and NH*. The heating temperature for nitridation treatment can be greater than or equal to 300° C. and less than or equal to 550° C., and the pressure is preferably greater than or equal to 5 Pa and less than or equal to 15 Pa.

An example of a method for forming the first insulating film 11 by high-density plasma treatment is described. First, oxygen radicals are produced using high-density plasma to oxidize a surface of the semiconductor substrate 20; thus, an oxide film with a thickness of 2 nm to 6 nm is formed. Subsequently, nitrogen radicals are produced using high-density plasma to nitride the upper portion of the oxide film by the nitrogen radicals.

Figure 2A:
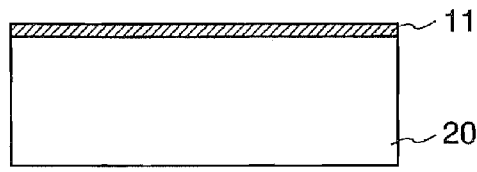
FIGS. 2A to 2F are cross-sectional views illustrating a method for manufacturing the nonvolatile memory transistor of FIG. 1.
Figure 2B:
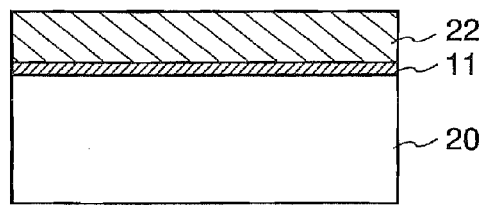

Next, as shown in FIG. 2B, a silicon nitride film 22 is formed in contact with the first insulating film 11 by a CVD method. The silicon nitride film 22 forms the charge trapping film 12. The thickness of the silicon nitride film 22 can be greater than or equal to 2 nm and less than or equal to 20 nm, preferably greater than or equal to 5 nm and less than or equal to 15 nm.

The hydrogen concentration of the silicon nitride film 22 is set to be greater than or equal to 15 atomic %, whereby the charge trapping film 12, in which the upper portion and the lower portion are different from each other in a nitrogen concentration and a hydrogen concentration, can be easily formed. Further, the hydrogen concentration of the silicon nitride film 22 is preferably set to be less than or equal to 25 atomic %. This is because, if the hydrogen concentration of the lower region 12A exceeds 25 atomic %, the lower region 12A becomes brittle and thus dielectric strength of the lower region 12A is lowered, whereby it is difficult to make the lower region 12A function as a charge trap.

As a nitrogen source gas to serve as a source material of the silicon nitride film 22, a hydronitrogen gas that contains a N—H bond can be used. Specifically, ammonia ($NH_3$) is preferably used for this nitrogen source gas, and hydrazine ($NH_2H_2N$) can also be used instead of ammonia ($NH_3$). A hydronitrogen gas is used as the nitrogen source gas, whereby a silicon nitride film at a hydrogen concentration greater than or equal to 15 atomic % can be easily formed by a CVD method. Note that in the case of using a gas excluding a N—H bond, for example, an $N_2$ gas as the nitrogen source gas, a hydrogen gas may be added to a process gas.

As the silicon source gas to serve as a source material of the silicon nitride film 22, a gas that contains hydrogen or halogen in a composition is used. As such a gas, there are $SiH_4$, $Si_2H_6$, $SiCl_4$, $SiHCl_3$, $SiH_2Cl_2$, $SiH_3Cl_3$, $SiF_4$, and the like. In the case of forming the silicon nitride film 22 by a PECVD method, $SiH_4$ (monosilane) is preferably used for the silicon source gas.

To the process gas for forming the silicon nitride film 22 by a CVD method, a gas other than the nitrogen source gas and the silicon source gas, which are to be source materials, can be added. As such a gas, there are a rare gas such as He, Ar, or Xe; a hydrogen ($H_2$) gas; a chlorine ($Cl_2$) gas; a fluorine ($F_2$) gas; and the like.

As the process gas, for example, a mixed gas of $SiH_4$, $NH_3$, and $H_2$, a mixed gas of $SiH_4$, $NH_3$, and Ar, a mixed gas of $SiH_4$, $NH_3$, $H_2$, and Ar, a mixed gas of $SiH_4$, $N_2$, $H_2$, and Ar, or the like can be used. Further, the partial pressure ratio of the nitrogen source gas to the silicon source gas (N source gas/Si source gas) can be greater than or equal to 0.1 and less than or equal to 1000, and this partial pressure ratio is preferably greater than or equal to 1 and less than or equal to 400. The partial pressure ratio can be adjusted by the flow rate at the time of supplying the silicon source gas and the nitrogen source gas to a reaction chamber.

In the case of forming the silicon nitride film 22 by a thermal CVD method, the substrate temperature can be greater than or equal to 700° C. and less than or equal to 1100° C. In the case of forming the silicon nitride film 22 by a PECVD method, the substrate temperature can be greater than or equal to 300° C. and less than or equal to 500° C.

Figure 2C:
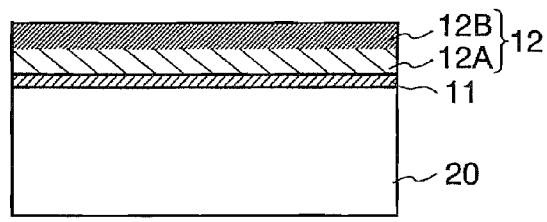

Next, an upper portion of the silicon nitride film 22 is nitrided. By the nitridation treatment, the charge trapping film 12 having the upper region 12B and the lower region 12A which are adjacent to each other in the thickness direction is formed as shown in FIG. 2C. The upper region 12B is a region which is nitrided by nitridation treatment. The lower region 12A is a region which has not been subjected to nitridation treatment in the silicon nitride film 22. Therefore, the lower region 12A has a composition similar to the silicon nitride film 22.

The upper portion of the silicon nitride film 22 is nitrided, whereby the charge trapping film 12 in which a nitrogen concentration is higher on the second insulating film 14 side and a hydrogen concentration is higher on the first insulating film 11 side can be formed. By providing the charge trapping film 12 having a concentration difference of hydrogen in the thickness direction, a retention characteristic of a nonvolatile memory transistor can be improved.

By nitridation treatment performed on the upper portion of the silicon nitride film 22, H in a Si—H bond and a N—H bond is released and a dangling bond is formed. The dangling bond functions as a charge trap site of the charge trapping film 12. Further, nitrogen is taken into part of this dangling bond; thus, the upper portion of the silicon nitride film 22 is nitrided. Accordingly, by the nitridation, the upper region 12B in which a hydrogen concentration is made high is formed. That is, the hydrogen concentration of the upper region 12B is lower than the hydrogen concentration of the lower region 12A.

The concentration difference of hydrogen between the upper region 12B and the lower region 12A is preferably greater than or equal to 30%, more preferably greater than or equal to 40%. That is, the hydrogen concentration of the upper region 12B is preferably 0.2 times or more and 0.7 times or less, more preferably 0.2 times or more and 0.6 times or less, as high as the hydrogen concentration of the lower region 12A.

The charge trapping film 12 on the conductive film 15 side forms a dangling bond by the nitridation, whereby a region with increased charge trap density (the upper region 12B) is formed. By increasing the charge trap density of the charge trapping film 12, a writing voltage and an erasing voltage for the nonvolatile memory transistor can be lowered. On the other hand, a region which is not nitrided and in which a hydrogen is little released (a region corresponding to the lower region 12A) remains in the charge trapping film 12 on the channel formation region 16 side. With such a structure, in the charge trapping film 12, a region with high charge trap density can be kept away from the channel formation region. Thus, the amount of charge trapped in the charge trapping film 12 is increased, and the amount of charge which is once stored but is leaked from the channel formation region 16 can be decreased. Accordingly, a retention characteristic of a nonvolatile memory transistor is improved.

Further, since the charge trapping film 12 is a film which is formed by nitriding the upper portion of the silicon nitride film 22, the charge trapping film 12 has a higher dielectric constant than the silicon nitride film 22. Accordingly, writing voltage and erasing voltage of a nonvolatile memory transistor having the charge trapping film 12 can be reduced.

A writing characteristic, an erasing characteristic, and a retention characteristic of a semiconductor memory element can be improved by synergy between the lower region 12A and the upper region 12B. Therefore, it is preferable that the thickness of the upper region 12B be set to be approximately equal to the thickness of the lower region 12A; thus, the thickness of the upper region 12B preferably account for 40% or more and 60% or less, more preferably 45% or more and 55% or less of the thickness of the silicon nitride film 22.

If the thickness of the upper region 12B is less than 40% of the thickness of the charge trapping film 12, an effect of increase in a dielectric constant of the charge trapping film 12, which is a reduction in writing voltage and erasing voltage, is not sufficiently obtained. On the contrary, if the percentage of the thickness exceeds 60%, the probability that charge is trapped in a region near a channel region is increased; thus, a charge retention characteristic is deteriorated. The thickness of a region of the silicon nitride film 23, which is to be nitrided, can be adjusted by treating time, treatment temperature, or the like of nitridation treatment.

The charge trapping film 12 is a film having a stacked-layer structure, in which two regions which are different from each other in a hydrogen concentration overlap with each other, but is a film without an interface between the two regions. If the charge trapping film 12 has an interface, a defect at the interface or the like leads to an adverse effect on electric characteristics, such as an increase in subthreshold swing (S value). Two regions which are different from each other in a hydrogen concentration without an interface in the silicon nitride film can be formed by nitriding the upper portion of the silicon nitride film 22 formed by a CVD method.

For the nitridation treatment performed on the upper portion of the silicon nitride film 22, solid-phase thermal nitridation treatment using heating treatment at 800° C. or more in an atmosphere including a nitrogen gas or ammonia can be used. As a means for the heating, a rapid thermal annealing (RTA) apparatus, an annealing furnace, or the like can be used. Further, as the nitridation treatment, plasma treatment in which an object is nitrided by N* produced in plasma can be performed. Note that by nitridation treatment using N*, a concentration difference of hydrogen between the lower region 12A and the upper region 12B can be made larger than in the case of thermal nitridation treatment; thus, it is preferable to perform nitridation treatment using N*. This is because, in thermal nitridation treatment, hydrogen is easily released from the lower region 12A due to heating of the silicon nitride film 22 at a temperature greater than or equal to 800° C., while, in nitridation treatment using N*, it is possible to occur almost no release of hydrogen from the lower region 12A because the treatment can be performed at a substrate temperature greater than or equal to 300° C. and less than or equal to 550° C. for a short time.

N* can be produced by exciting an $N_2$ gas. To produce N* efficiently in plasma including an $N_2$ gas, plasma is preferably produced by exciting a mixed gas of an $N_2$ gas and a rare gas. As the rare gas, one kind or more kinds of gases selected from He, Ne, Ar, Kr, or Xe can be used. To produce N* efficiently, Ar, Kr, and Xe which have a large atomic radius may be selected. For example, in the case of using a mixed gas of $N_2$ and Ar in order to produce N*, the mixed gas of $N_2$ and Ar is excited to produce plasma of the mixed gas. In the resulting plasma, Ar is excited and Ar radicals (hereinafter, referred to as "Ar*'") are produced. The Ar* and nitrogen molecules ($N_2$) are collided, whereby N* is produced. The N* produced in plasma is reacted with the silicon nitride film 22; thus, the upper portion of the silicon nitride film 22 is nitrided, and the upper region 12B is formed.

It is preferable to use a microwave to excite the mixed gas of an $N_2$ gas and a rare gas, because high-density plasma with an electron density greater than or equal to $1.0 \times 10^{11}$ $cm^{-3}$ and an electron temperature less than or equal to 3.0 eV can be produced. With the use of high-density plasma, nitridation treatment on the silicon nitride film 22 can be performed at a treatment temperature less than or equal to 550° C. in a short time while suppressing damage to the silicon nitride film 22 due to plasma.

A typical frequency of a microwave for producing high-density plasma is 2.45 GHz. With the use of high-density plasma, the upper portion of the silicon nitride film 22 can be nitrided at a heating temperature less than or equal to 550° C. in a processing time of several minutes. The pressure at the time of nitriding reaction using high-density plasma produced by exciting a microwave is preferably greater than or equal to 5 Pa and less than or equal to 15 Pa, and the heating temperature can be greater than or equal to 300° C. and less than or equal to 550° C. For the nitridation treatment performed on the silicon nitride film 22 using high-density plasma, the high-density plasma treatment apparatus shown in FIG. 3 can be used.

Further, the upper portion of the silicon nitride film 22 can be nitrided by NH*. NH* can be fanned in such a manner that a mixed gas of $N_2$, a rare gas, and $H_2$ is excited to produce plasma of the mixed gas; thus, N* and NH* radicals can be produced in the resulting plasma. N* and NH* radicals can alternatively be produced in plasma by exciting a mixed gas of $NH_3$ and a rare gas. A gas including hydrogen in a composition is used for a process gas; therefore, hydrogen radicals are included in plasma. Accordingly, the upper portion of the silicon nitride film 22 is nitrided by N* and NH* radicals and a dangling bond is terminated by hydrogen in plasma. Thus, a concentration difference of hydrogen between the upper region 12B and the lower region 12A of the charge trapping film 12 is not easily increased.

Therefore, in the case where the upper portion of the silicon nitride film 22 is nitrided by plasma treatment, it is preferable that a gas including hydrogen in a composition be not used for a gas excited by plasma. For example, a mixed gas of an $N_2$ gas and a rare gas can be used for a process gas of nitridation treatment.

Figure 2D:
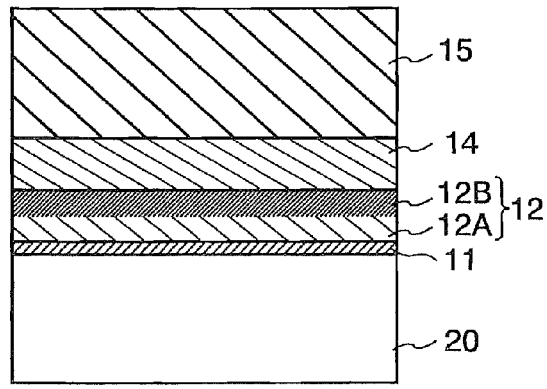

Next, as shown in FIG. 2D, an insulating film is formed in contact with the charge trapping film 12 by a CVD method, a sputtering method, or the like to form the second insulating film 14 with a single-layer structure or a stacked-layer structure. Then, the conductive film 15 with a single-layer structure or a stacked-layer structure is formed in contact with the second insulating film 14 by a sputtering method or the like. Note that when a nonvolatile memory transistor is of an MNOS type, the second insulating film 14 is not formed, and the conductive film 15 is formed in contact with the charge trapping film 12.

Figure 2E:
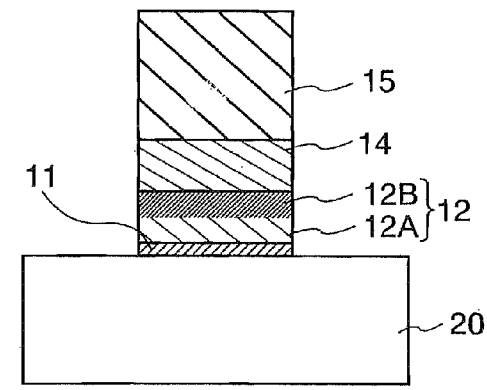
Figure 2F:
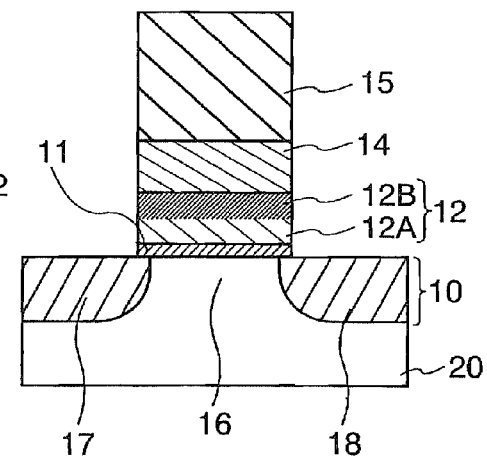

Next, a photolithography step is performed to form a mask made of photoresist over the conductive film 15. With the use of this mask, a stacked-layer film including the first insulating film 11, the charge trapping film 12, the second insulating film 14, and the conductive film 15 is etched. By the etching, a structure shown in FIG. 2E is obtained. After the etching, the mask made of photoresist is removed.

Next, an impurity to serve as a donor or an acceptor is added to the semiconductor substrate 20 by an ion implantation method or an ion doping method, with a stack including the first insulating film 11, the charge trapping film 12, the second insulating film 14, and the conductive film 15 used as a mask to form the high-concentration impurity regions 17 and 18 each exhibiting either n-type conductivity or p-type conductivity. In the semiconductor substrate 20, a region which overlaps with the conductive film 15 and thus an impurity is not added becomes the channel formation region 16. As a donor impurity element, phosphorus, arsenic, or the like can be used. As an acceptor impurity element, boron or the like can be used. Subsequently, the impurity added to the high-concentration impurity regions 17 and 18 is activated by heat treatment or the like. Through the above-described steps, the nonvolatile memory transistor shown in FIG. 1 is formed.

Embodiment Mode 2

The nonvolatile memory transistor shown in FIG. 1 is a memory element on which a semiconductor region is formed in a semiconductor substrate. This embodiment mode describes a nonvolatile memory transistor in which a semiconductor layer over an insulating film serves as a semiconductor region, and a method for manufacturing the nonvolatile memory transistor.

Figure 4:
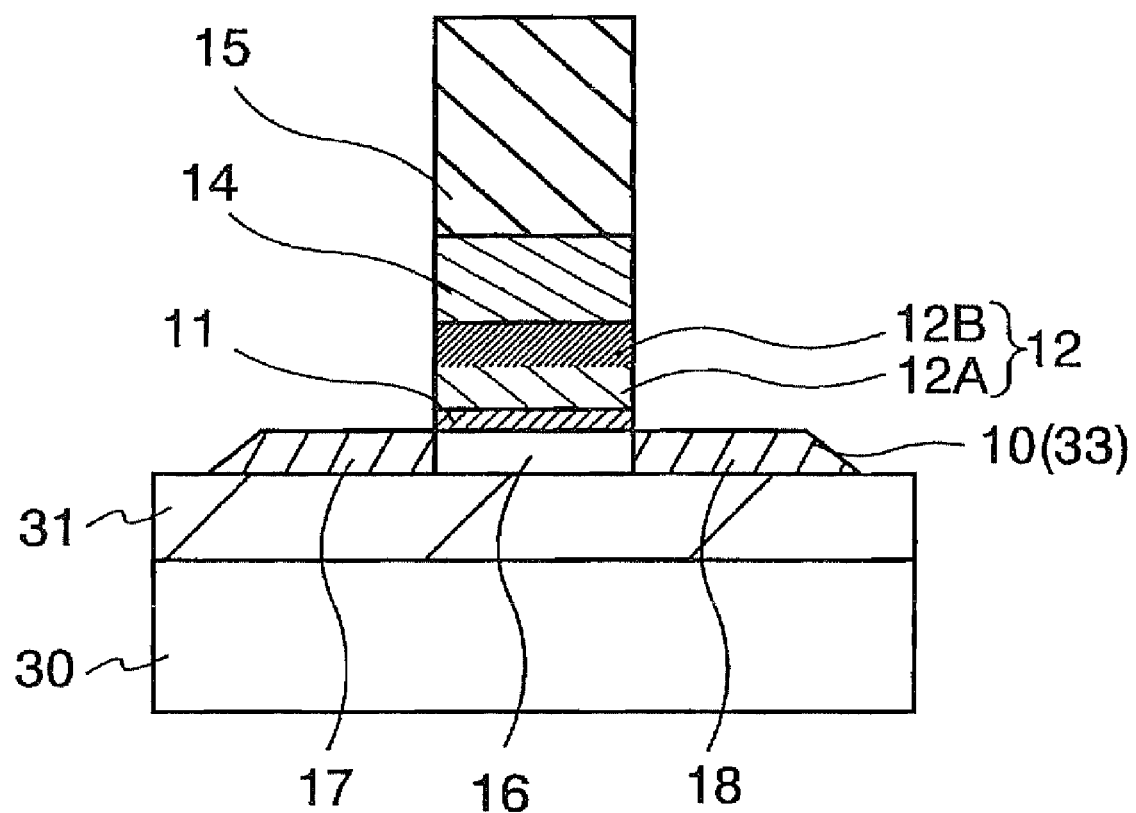
FIG. 4 is a cross-sectional view of a nonvolatile memory transistor.

FIG. 4 is a cross-sectional view showing a structural example of a nonvolatile memory transistor. A base insulating film 31 is formed over a substrate 30, and a semiconductor film 33 to serve as a semiconductor region 10 is formed over the base insulating film 31. In the semiconductor film 33, a channel formation region 16 and high concentration impurity regions 17 and 18 each exhibiting either n-type conductivity or p-type conductivity are formed. Over the semiconductor film 33, a first insulating film 11, a charge trapping film 12, a second insulating film 14, and a conductive film 15 are stacked in this order. These films 11, 12, 14, and 15 overlap with the channel formation region 16.

Also for the nonvolatile memory transistor shown in FIG. 4, a writing method and an erasing method can be selected from a method that uses F-N tunneling current, a method that uses direct tunneling current, or a method that uses hot carriers, as appropriate, in a manner similar to the nonvolatile memory transistor shown in FIG. 1. Hereinafter, a structure which is different from the nonvolatile memory transistor shown in FIG. 1 is described.

As the substrate 30, a glass substrate, a quartz substrate, a sapphire substrate, a ceramic substrate, a stainless steel substrate, a metal substrate, or the like can be used. The substrate 30 may be a substrate different from a substrate which is used at the time of manufacturing a nonvolatile memory transistor. In this case, as the substrate 30, a plastic film can be used.

The base insulating film 31 can be formed of a single-layer film or a stacked-layer film of an insulating material such as silicon oxide, silicon nitride, silicon nitride oxide, or silicon oxynitride. Such an insulating film can be formed by a CVD method or a sputtering method. Alternatively, the semiconductor film 33 may be formed in contact with the substrate 30 without forming the base insulating film 31. By the formation of the base insulating film 31, the following effects are produced: a reduction in interface state density of the semiconductor film 33 on the substrate 30 side; prevention of intrusion of contaminants, such as alkali metal, from the substrate 30 into the semiconductor film 33; or the like.

The semiconductor film 33 is a non-single-crystal semiconductor film, and a polycrystalline semiconductor is preferably used. For a semiconductor material, silicon is preferably used, and alternatively, silicon germanium and germanium can be used as well.

An SOI (silicon on insulator) substrate can be used for the substrate 30. In the case of using an SOI substrate, the semiconductor film 33 is formed of a semiconductor layer of the SOI substrate, and the base insulating film 31 is formed of an insulating layer in the SOI substrate.

Also in the nonvolatile memory transistor shown in FIG. 4, a silicon nitride film including a region on the second insulating film 14 side, which has a low concentration of hydrogen, is used for the charge trapping film 12, as in the nonvolatile memory transistor shown in FIG. 1. Thus, the charge retention characteristic can be improved.

Hereinafter, a method for manufacturing the nonvolatile memory transistor shown in FIG. 4 is described with reference to FIGS. 5A to 5F.

Over the substrate 30, an insulating film is formed by a CVD method, a sputtering method, or the like to form the base insulating film 31 having a single-layer structure or a stacked-layer structure. Next, the semiconductor film 33 is formed over the base insulating film 31 (see FIG. 5A). As an example of a method for forming the semiconductor film, there is a method in which an amorphous semiconductor film of amorphous silicon, amorphous silicon germanium, amorphous germanium, or the like is formed at a thickness greater than or equal to 10 nm and less than or equal to 100 nm, and the amorphous semiconductor film is crystallized to form a crystalline semiconductor film. As a method for crystallizing an amorphous semiconductor film, there are a laser crystallization method in which laser beam irradiation is performed, a crystallization method in which heat treatment using a rapid thermal annealing (RTA) apparatus or an annealing furnace is performed, and the like.

Figure 5A:
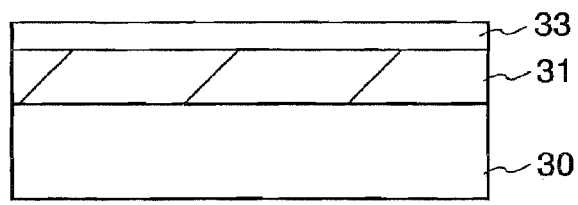
FIGS. 5A to 5F are cross-sectional views illustrating a method for manufacturing the nonvolatile memory transistor of FIG. 4.
Figure 5B:
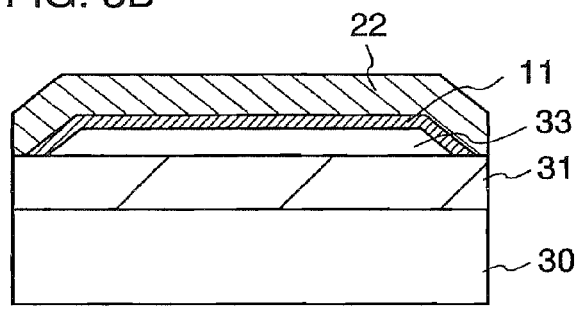

Next, as shown in FIG. 5B, the semiconductor film 33 is divided into each element to have an island shape by a photolithography step and an etching step. By such division into an island shape, element isolation can be effectively performed even in the case where a memory cell array and a driver circuit for controlling the memory cell array are formed over one substrate. Specifically, even when a memory cell array in which a voltage of from approximately 10 V to 20 V is required for reading and erasing, and a driver circuit which operates at a voltage of from approximately 3V to 7V to mainly input and output data and control commands are formed over one substrate, mutual interference between elements due to the difference of voltage applied to each element can be prevented.

Next, the first insulating film 11 is formed over the semiconductor film 33. The first insulating film 11 can be formed in a manner similar to the first insulating film 11 shown in FIG. 2B. Note that in the case of using a substrate with an upper temperature limit of less than or equal to 750° C., such as a glass substrate, for the substrate 30, oxidation treatment or nitridation treatment using high-density plasma is preferably performed when the first insulating film 11 is formed by oxidation treatment or nitridation treatment. For example, the semiconductor film 33 is oxidized by oxidation treatment using high-density plasma, whereby an oxide film can be formed as the first insulating film 11. Further, the semiconductor film 33 is subjected to oxidation treatment using high-density plasma, and then, the obtained oxide film is subjected to nitridation treatment using high-density plasma, whereby the first insulating film 11 can be formed over a surface of the semiconductor film 33.

Furthermore, an insulating film is formed over the semiconductor film 33 by a CVD method or a sputtering method, and the obtained insulating film is subjected to solid-phase oxidation or solid-phase nitridation by plasma, whereby the first insulating film 11 with an improved dielectric strength can be formed. Subsequent steps can be carried out in a manner similar to the steps shown in FIGS. 2B to 2F.

As shown in FIG. 5B, a silicon nitride film 22 is formed in contact with the first insulating film 11 by a CVD method. As a method for forming the silicon nitride film 22, a method which is the same as the method for forming the silicon nitride film 22 which is described with reference to FIG. 2B can be used. In the case of using a substrate with an upper temperature limit of less than or equal to 750° C., such as a glass substrate, for the substrate 30, the silicon nitride film 22 is preferably formed by a PECVD method. In a PECVD method, a deposition rate is higher than in a thermal CVD method and a heating temperature can be less than or equal to 500° C. In the case of forming the silicon nitride film 22 by a PECVD method, a substrate temperature may be greater than or equal to 300° C. and less than or equal to 500° C.

Figure 5C:
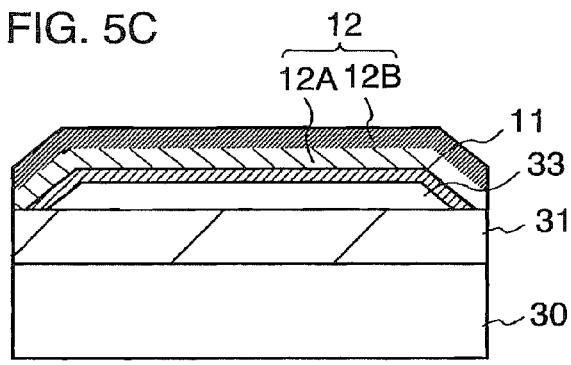

Next, an upper portion of the silicon nitride film 22 is nitrided to form the charge trapping film 12. By the nitridation treatment, the charge trapping film 12 having an upper region 12B and a lower region 12A which are adjacent to each other in a thickness direction is formed as shown in FIG. 5C. The upper region 12B is a region which is nitrided by nitridation treatment, and the lower region 12A is a region which is not nitrided. In other words, the upper region 12B is a region in which hydrogen concentration is lowered by the nitridation, and the lower region 12A is a region in which the hydrogen concentration is little changed by the nitridation.

The nitridation treatment of the silicon nitride film 22 can be performed in a manner similar to the nitridation treatment of the silicon nitride film 22 shown in FIG. 2C. In the case of using a substrate with an upper temperature limit of less than or equal to 700° C., such as a glass substrate, for the substrate 30, the nitridation treatment is preferably performed using high-density plasma which is excited by a microwave. This is because, in high-density plasma treatment, nitridation treatment can be performed at a heat temperature less than or equal to 550° C. in a processing time of approximately several minutes.

Figure 5D:
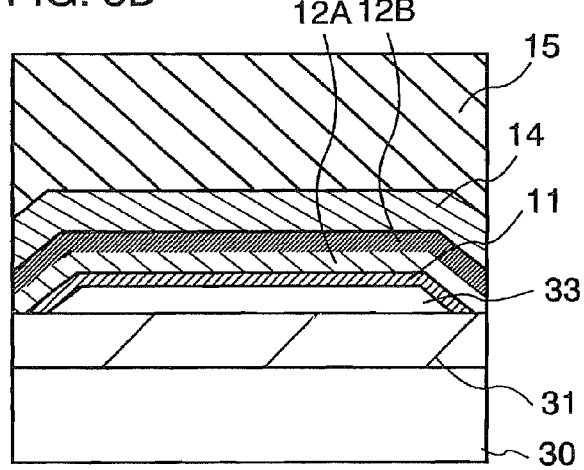

Next, as shown in FIG. 5D, an insulating film is formed in contact with the charge trapping film 12 by a CVD method, a sputtering method, or the like to form the second insulating film 14 having a single-layer structure or a stacked-layer structure. Then, a conductive film is formed in contact with the second insulating film 14 by a sputtering method or the like to form the conductive film 15 with a single-layer structure or a stacked-layer structure. Note that when a nonvolatile memory transistor is of an MNOS type, the conductive film 15 is formed in contact with the charge trapping film 12 without forming the second insulating film 14.

Figure 5E:
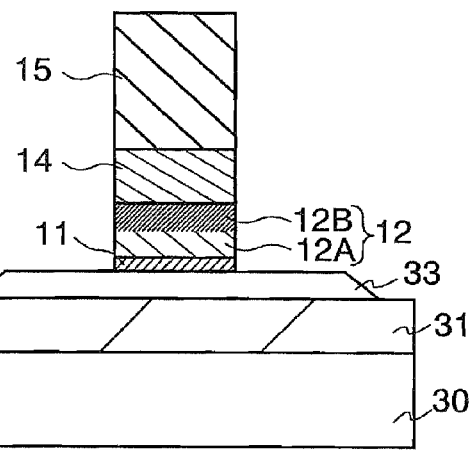

Next, a photolithography step is performed to form a mask made of photoresist over the conductive film 15, and a stacked-layer film including the first insulating film 11, the charge trapping film 12, the second insulating film 14, and the conductive film 15 is etched using the mask. By the etching, a structure shown in FIG. 5E is obtained.

Figure 5F:
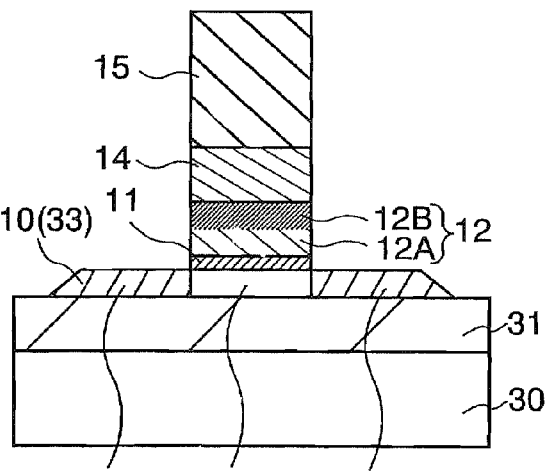

An impurity to be a donor or an acceptor is added to the semiconductor film 33 by an ion implantation method or an ion doping method, with a stack of the first insulating film 11, the charge trapping film 12, the second insulating film 14, and the conductive film 15 used as a mask to form the high-concentration impurity regions 17 and 18 each exhibiting either n-type conductivity or p-type conductivity. In the semiconductor film 33, a region which overlaps with the conductive film 15 and thus an impurity is not added becomes the channel formation region 16. Subsequently, the impurity added to the high-concentration impurity regions 17 and 18 is activated by heat treatment or the like. Through the above-described steps, the nonvolatile memory transistor shown in FIG. 5F is formed. Note that FIG. 5F shows a cross-sectional view which is the same as FIG. 4.

Embodiment Mode 3

In this embodiment mode, with reference to experiment data, the following is described: a retention characteristic of a nonvolatile memory semiconductor element is improved by nitridation of an upper portion of a silicon nitride film fainted by a CVD method. That is, an effect of the nonvolatile memory semiconductor elements described in Embodiment Modes 1 and 2 and a method for manufacturing the nonvolatile memory semiconductor elements is described.

Figure 6:
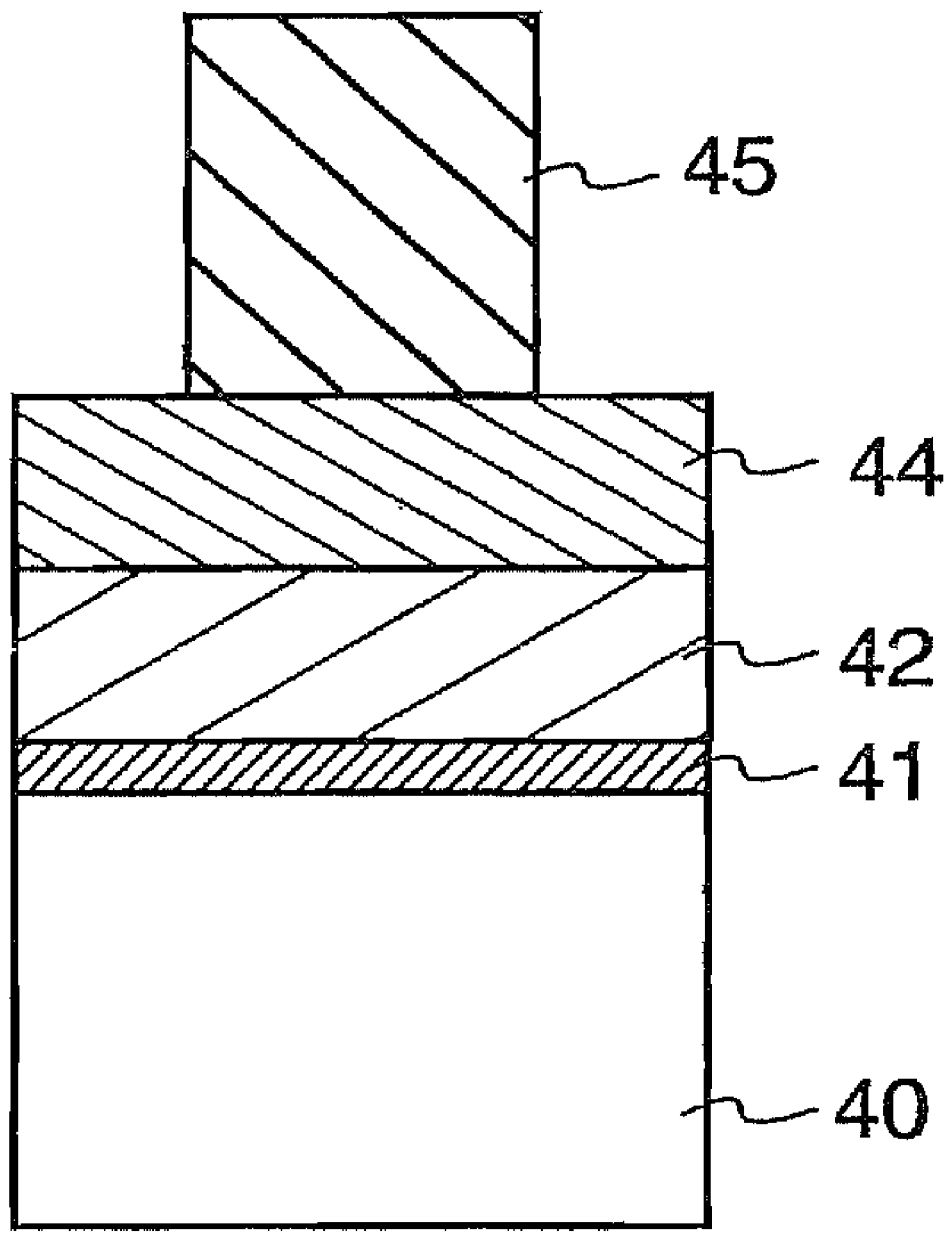
FIG. 6 is a cross-sectional view of a nonvolatile memory capacitor of which a capacitance-voltage characteristic is measured.

In this embodiment mode, in order to evaluate improvement of a charge retention characteristic of a nonvolatile memory semiconductor element, a nonvolatile memory capacitor was manufactured using a p-type single-crystal silicon substrate. FIG. 6 is a cross-sectional view showing a structure of a capacitor which was manufactured. As shown in FIG. 6, in a capacitor, a first insulating film 41, a silicon nitride film 42, a second insulating film 44, and an electrode 45 are stacked in this order over a silicon substrate 40. The silicon nitride film 42 is a film serving as a charge trapping film.

Further, in this embodiment mode, six kinds of memory capacitors which are different in a structure of the silicon nitride film 42 were formed. For a memory element of the present invention, two kinds of nonvolatile memory capacitors each having a silicon nitride film with the same structure as the charge trapping film of the nonvolatile memory transistors described in Embodiment Modes 1 and 2, were manufactured. These capacitors are referred to as a "memory element A" and a "memory element B". The other four kinds of capacitors are capacitors each having a silicon nitride film with a different structure from the charge trapping film of the nonvolatile memory transistors described in Embodiment Modes 1 and 2. These capacitors are referred to as a "comparative memory element a", a "comparative memory element b", a "comparative memory element Z", and a "comparative memory element z".

In order to distinguish the silicon nitride films 42 of the memory elements A and B and the comparative memory elements a, b, Z, and z, the silicon nitride films in the elements are denoted by different reference numerals. The silicon nitride films are denoted by 42-A, 42-B, 42-a, 42-b, 42-Z, and 42-z corresponding to the memory elements A and B and the comparative memory elements a, b, Z, and z. The silicon nitride films 42-a, 42-b, and 42-z are films formed by a PECVD method. On the other hand, the silicon nitride films 42-A, 42-B, and 42-Z are films which are obtained by subjecting the silicon nitride films 42-a, 42-b, and 42-z formed by a PECVD method to nitridation treatment using high-density plasma under the same condition, respectively.

Hereinafter, a method for manufacturing the memory element A and the comparative memory element a is described. To form the first insulating film 41, first, a surface of the silicon substrate 40 was oxidized by O* produced in high-density plasma, whereby a silicon oxide film was formed. In the high-density plasma treatment, a substrate temperature was set to 400° C., a pressure was set to 106.67 Pa, an $O_2$ gas and an Ar gas were used as a process gas, and an Ar gas at a flow rate of 900 sccm and an $O_2$ gas at a flow rate of 5 sccm were supplied to a treatment chamber. A microwave at a frequency of 2.45 GHz was introduced into the treatment chamber. Thus, the process gas was excited, so that oxygen radicals were produced in plasma of the process gas. The treatment time of high-density plasma treatment was regulated so that a silicon oxide film having a thickness of approximately 3 nm was formed over a surface of the silicon substrate 40.

Next, an upper portion of the silicon oxide film was nitrided by N* produced in high-density plasma. In the high-density plasma treatment, a substrate temperature was set to 400° C., a pressure was set to 12 Pa, and an $N_2$ gas and an Ar gas were used as a process gas. A microwave at a frequency of 2.45 GHz was introduced into the treatment chamber while an Ar gas at a flow rate of 1000 sccm and an $N_2$ gas at a flow rate of 200 sccm were supplied to the treatment chamber. Thus, the process gas was excited, so that nitrogen radicals were produced.

Next, a silicon nitride film 42-a with a thickness of 10 nm was formed by a PECVD method over the first insulating film 41. A parallel-plate PECVD apparatus was used for a film formation apparatus. A film formation condition of the silicon nitride film 42-a with the use of a PECVD apparatus is as follows:

<Silicon Nitride Film 42-a>
  Film thickness: 10 nm
  Process gas and the flow rate:
  $NH_3$ (the flow rate: 400 seem)
  $SiH_4$ (the flow rate: 2 sccm)
  Substrate temperature: 400° C.
  Film formation pressure: 40 Pa
  Distance between electrodes: 30 mm
  Electrode area: 600 $cm^2$
  High-frequency power output: 100 W Next, an upper portion of the silicon nitride film 42-a manufactured by a PECVD method was subjected to nitridation treatment using high-density plasma, whereby a silicon nitride film 42-A was formed. A condition of the high-density plasma treatment is as follows:

<High-Density Plasma Nitridation Treatment>
  Process gas and the flow rate:
  $N_2$ (the flow rate: 200 sccm)
  Ar (the flow rate: 1000 sccm)
  Substrate temperature: 400° C.
  Reaction pressure: 40 Pa
  Frequency of microwave: 2.45 GHz
  Microwave power output: 3000 W Next, the second insulating film 44 was formed over the silicon nitride film 42-A. Here, a silicon oxynitride film with a thickness of 10 nm was formed by a PECVD method. $SiH_4$ and $N_2O$ were used for a process gas. A substrate temperature was set to 400° C., a film formation pressure was set to 40 Pa, and $SiH_4$ at a flow rate of 1 seem and $N_2O$ at a flow rate of 800 seem were supplied to the reaction chamber of a PECVD apparatus. Further, a distance between electrodes was set to 28 mm and a high-frequency power output was set to 150 W.

Next, an Al—Ti alloy film with a thickness of 400 nm was formed over the second insulating film 44 with the use of a sputtering apparatus and the Al—Ti alloy film was processed into a predetermined shape by etching, whereby the electrode 45 was formed. Through the above-described steps, the memory element A was completed. The comparative memory element a is an element in which the silicon nitride film 42-a formed by a PECVD method is used for a charge trapping film as it is. The comparative memory element a was manufactured by the same method as the memory element A with the exception that high-density plasma nitridation method is not performed.

The memory element B and the comparative memory elements b, Z, and z were manufactured by the same method as the memory element A with the exception of a step for forming the silicon nitride film 42 of each element. A film formation condition of the silicon nitride films 42-b and 42-z with the use of a PECVD apparatus is described below.

<Silicon Nitride Film 42-b>
  Film thickness: 10 nm
  Process gas and the flow rate:
  $NH_3$ (the flow rate: 100 sccm)
  $H_2$ (the flow rate: 400 sccm)
  $SiH_4$ (the flow rate: 2 sccm)
  Substrate temperature: 400° C.
  Film formation pressure: 40 Pa
  Distance between electrodes: 30 mm
  Electrode area: 600 $cm^2$
  High-frequency power output: 100 W <Silicon Nitride Film 42-z>
  Film thickness: 10 nm
  Process gas and the flow rate:
  $N_2$ (the flow rate: 400 sccm)
  $SiH_4$ (the flow rate: 2 sccm)
  Ar (the flow rate: 50 sccm)
  Substrate temperature: 400° C.
  Film formation pressure: 40 Pa
  Distance between electrodes: 30 mm
  Electrode area: 600 $cm^2$
  High-frequency power output: 100 W Further, upper portions of the silicon nitride films 42-b and 42-z were subjected to nitridation treatment under the same condition as the memory element A by high-density plasma treatment, and thus, the silicon nitride films 42-B and 42-Z were formed.

Through the above-described steps, the capacitors (A, B, Z, a, b, and z) of the present invention and a comparative example were manufactured.

The memory elements A and B are greatly different from the comparative memory elements a, b, Z, and z, in a process gas at the time of forming a silicon nitride film by a PECVD method and in that nitridation treatment using high-density plasma is performed or not. Table 1 shows the correspondence of the silicon nitride film 42 of each of the memory elements A and B and the comparative memory elements a, b, Z, and z.

TABLE 1

| | Silicon nitride film formed by PECVD | Nitridation treatment by N* | Silicon nitride film to be charge trapping film |
|---|---|---|---|
| A | Silicon nitride film 42-a | Yes | Silicon nitride film 42-A |
| a | | No | Silicon nitride film 42-a |
| B | Silicon nitride film 42-b | Yes | Silicon nitride film 42-B |
| b | | No | Silicon nitride film 42-b |
| Z | Silicon nitride film 42-z | Yes | Silicon nitride film 42-Z |
| z | | No | Silicon nitride film 42-z |

The capacitance-voltage characteristics were measured to evaluate charge retention characteristics of the memory elements A and B and the comparative memory elements a, b, Z, and z. The measurement was performed as follows. To evaluate a charge retention characteristic which is obtained after writing of data, a writing voltage of 15 V was applied to the electrode 45 for 10 milliseconds with a metal halide lamp light emitted, and electrons were injected into the silicon nitride film 42; thus, writing operation was performed. Note that a writing voltage of each of the memory element B and the comparative memory elements a and b was set to 17 V. Then, the state in which the silicon substrate 40 was being heated at 150° C. with a hot plate (retention state) was kept. A capacitance-voltage characteristic of each element was measured in an initial state (before writing operation), immediately after writing operation, after writing operation, and in a retention state in which heating was performed for three hours.

Further, to evaluate a charge retention characteristic of each element which is obtained after erasing written data, erasing operation was performed after performing writing operation. First, a voltage of 15 V was applied to the electrode 45 for 10 milliseconds and electrons were injected into the silicon nitride film 42; thus, writing was performed. Note that a writing voltage of the memory element B and the comparative memory elements a and b was set to 17 V. Next, to perform erasing, a voltage of −15 V was applied to the electrode 45 for 10 milliseconds and holes were injected into the silicon nitride film 42; thus, erasing was performed. After erasing operation, the state in which the silicon substrate 40 was being heated at 150° C. with a hot plate was kept. A capacitance-voltage characteristic of each element was measured in an initial state (before writing operation), immediately after writing operation, and immediately after erasing operation. Further, as a charge retention characteristic which is obtained after erasing operation, a capacitance-voltage characteristic which is obtained after keeping the state of heating at 150° C. for three hours after erasing operation was measured.

Figure 7A:
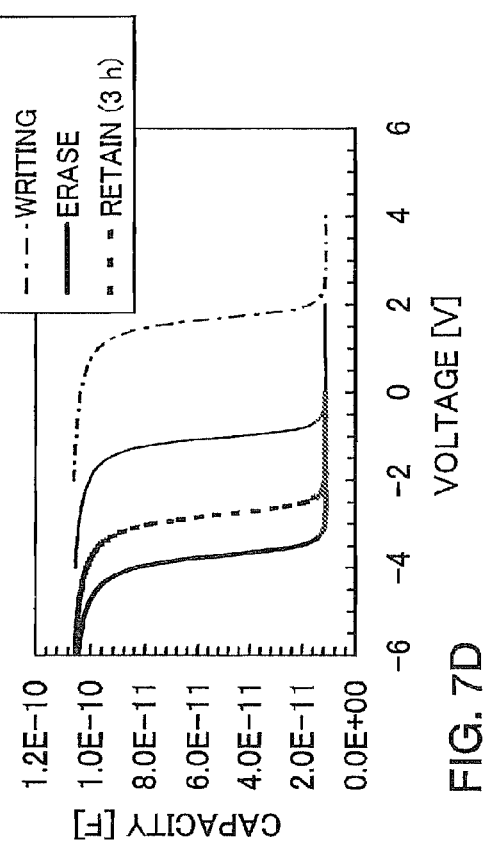
FIGS. 7A to 7D are graphs of capacitance-voltage characteristics of nonvolatile memory capacitors (a memory element A and a comparative memory element a)
Figure 7B:
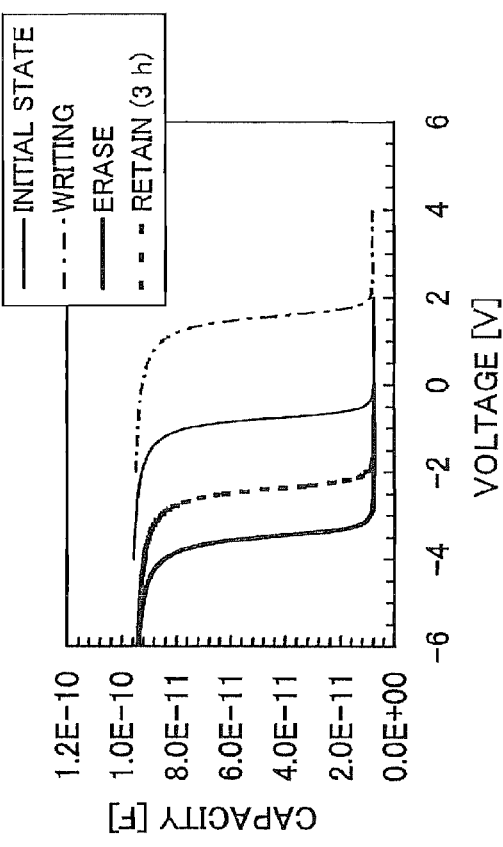
Figure 7C:
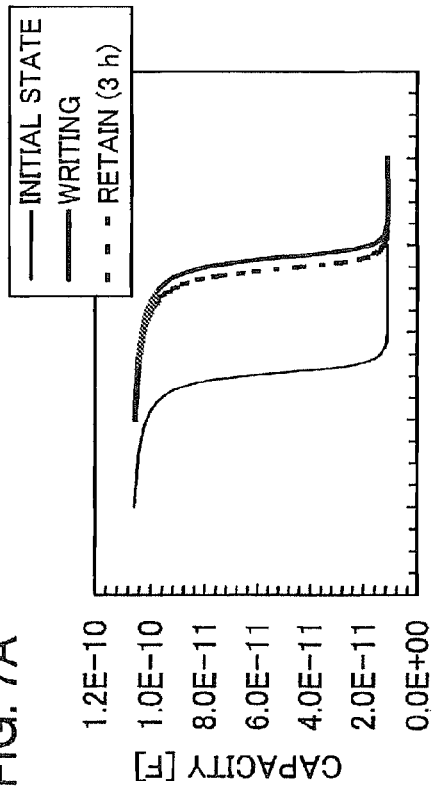
Figure 7D:
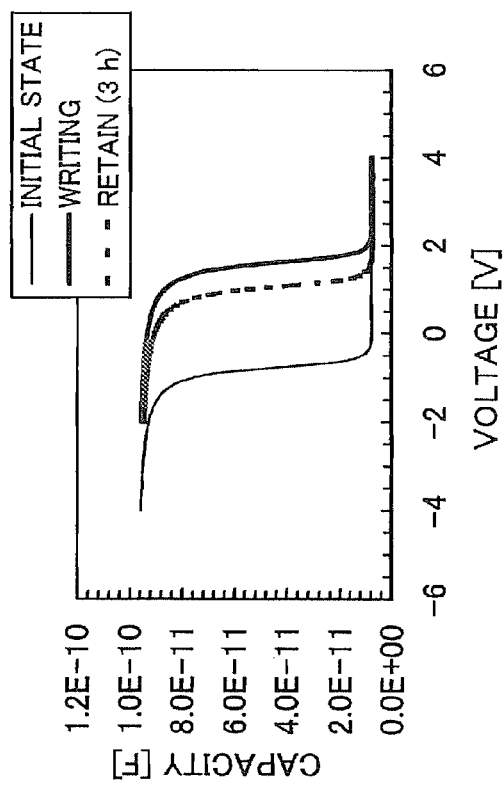

FIGS. 7A to 7D, FIGS. 8A to 8D, and FIGS. 9A to 9D show capacitance-voltage characteristic curves (hereinafter referred to as "C-V curves") of each element. FIGS. 7A and 7B show C-V curves of a writing state and an erasing state of the memory element A, and FIGS. 7C and 7D show C-V curves of a writing state and an erasing state of the comparative memory element a. FIGS. 8A and 8B show C-V curves of a writing state and an erasing state of the memory element B, and FIGS. 8C and 8D show C-V curves of a writing state and an erasing state of the comparative memory element b. FIGS. 9A and 9B show C-V curves of a writing state and an erasing state of the comparative memory element Z, and FIGS. 9C and 9D show C-V curves of a writing state and an erasing state of the comparative memory element z.

First, these C-V curves show that the memory element A has an excellent capability to retain charge. FIGS. 7A and 7B show that a voltage for writing is lowered and a charge retention characteristic obtained after writing operation is drastically improved, by using the silicon nitride film 42-A, which is obtained by nitriding an upper portion of the silicon nitride film 42-a, for a charge trapping film.

On the other hand, the C-V curves in FIGS. 9A to 9D show that nitridation treatment with respect to the silicon nitride film 42-z hardly contributes to the improvement of a charge retention characteristic of the comparative memory element Z.

Table 2 shows a Vth window (a subthreshold voltage window) ΔVth of each element which is obtained from each C-V curve. It is found that Vth windows of the memory elements A and B are the largest and charge retention characteristics of the memory elements A and B are the most excellent.

TABLE 2

|   | ΔVth (V) | ΔVth change by nitridation |
|---|---|---|
| A | 4.2 | +0.8 V |
| a | 3.4 | |
| B | 4.2 | +0.5 V |
| b | 3.7 | |
| Z | 3.7 | +0.1 V |
| z | 3.6 | |

ΔVth in Table 2 is a value obtained from an equation ΔVth=Vmw−Vme. Vmw is a voltage value calculated from a C-V curve of a retention state after writing operation, and Vme is a voltage value obtained from a C-V curve of a retention state after erasing operation. On a tangent of a C-V curve of a retention state after writing operation, of which the slope is the largest, a value of an x coordinate in a point where a y coordinate is a half value of a maximum value (a maximum value of a y coordinate) of a capacitance in the C-V curve is a voltage value Vmw. On the other hand, on a tangent of a C-V curve of a retention state after erasing operation, of which the slope is the largest, a value of an x coordinate in a point where a y coordinate is a half value of a maximum value (a maximum value of a y coordinate) of a capacitance in the C-V curve is a voltage value Vme. A difference between Vmw and Vme is ΔVth. Note that ΔVth is a value calculated from a C-V curve of each element which keeps a state of heating at 150° C. for three hours.

Further, Table 2 shows variation of ΔVth due to nitridation treatment with respect to the silicon nitride film. Table 2 shows that a charge retention characteristic of the memory element is improved by using the silicon nitride films 42-A and 42-B, which are obtained by nitriding the upper portions of the silicon nitride films 42-a and 42-b, for the charge trapping films, and that nitridation treatment with respect to the silicon nitride film 42-z hardly contributes to improvement of a charge retention characteristic of the comparative memory element Z. That is, measurement data of a capacitance-voltage characteristic shows that a composition of a silicon nitride film, which has not been nitrided, affects improvement of a charge retention characteristic of a non-volatile semiconductor memory element. Accordingly, compositions of a silicon nitride film which has been subjected to nitridation treatment and the silicon nitride film which has not been subjected to nitridation treatment, were analyzed.

Figures 10A, 10B:
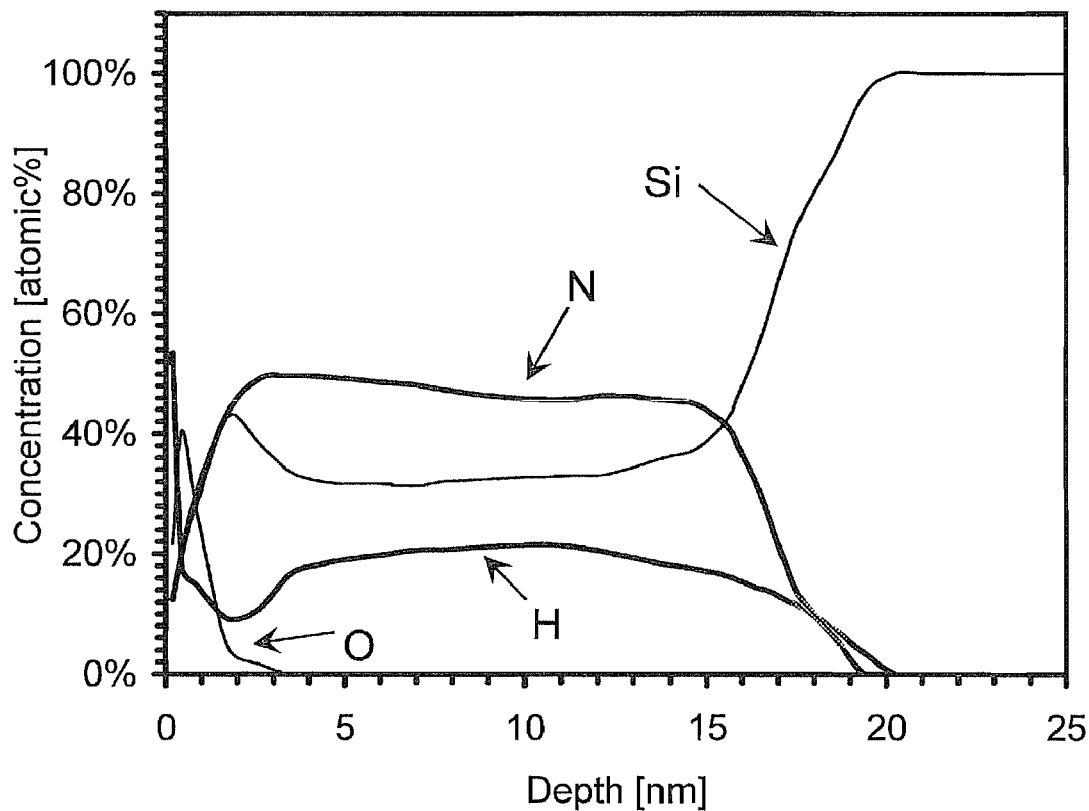
FIGS. 10A and 10B are respectively a depth profile of Si, N, H, and O of a silicon nitride film which is subjected to nitridation treatment using high-density plasma and a table showing a composition, and a concentration of the silicon nitride film of FIG. 10A.

FIG. 10A shows a concentration distribution (a depth profile) in a thickness direction of a composition element in the silicon nitride film 42-A of the memory element A. FIG. 10B shows a result of analyzing a composition of the silicon nitride film 42-A. Note that the horizontal axis of the depth profile indicates a depth, 0 nm corresponds to a surface of the silicon nitride film 42-A.

First, a depth profile in FIG. 10A is described. As an analysis method, high-resolution Rutherford backscattering spectrometry (HR-RBS) and high-resolution elastic recoil detection analysis (HR-ERDA) were used. As an analyzing apparatus, high-resolution Rutherford backscattering spectrometry apparatus (HRBS500) manufactured by Kobe Steel, Ltd. was used. Further, as an incident ion beam, a He$^+$ ion beam was used for HR-RBS and an N$^{2+}$ ion beam was used for HR-ERDA.

A sample which was analyzed was a silicon nitride film with a thickness of 16.83 nm which was formed over a silicon wafer with a diameter of 2 inches, under the same condition as the silicon nitride film 42-a. The nitridation treatment using high-density plasma was performed for 90 seconds.

An HR-RBS spectrum showed that Si, N, and O were included in the silicon nitride film. It is likely that oxygen is detected because a surface of the silicon nitride film is contaminated or oxidized by oxygen, moisture, or the like. An HR-ERDA spectrum showed that H was included in the silicon nitride film. FIG. 10A is a depth profile of Si, N, H, and O of a silicon nitride film which is obtained from the HR-RBS spectrum and the HR-ERDA spectrum.

The depth profile of H in FIG. 10A shows that the silicon nitride film includes an upper region having a low concentration of hydrogen and a lower region having a high concentration of hydrogen. Further, the depth profile of N tells that the nitrogen concentration of the upper region has increased by nitridation using N*. Note that in the depth profile, in a range from a surface (i.e. 0 nm) to a depth of 2 nm or less, the oxygen concentration and the hydrogen concentration are drastically increased toward the surface according to the depth profiles of O and H. It is likely that this is because the surface of the silicon nitride film is contaminated or oxidized by oxygen or moisture which is included in the air. The effect of the contamination and the oxidation to the silicon nitride film causes the lower nitrogen concentration at the depth of 2 nm or less as shown by the depth profile of N.

In order to examine compositions of the upper region and the lower region of the silicon nitride film, thicknesses of the upper region and the lower region were analyzed. An ellipsometer was used for the analysis. With the use of a model in which the silicon nitride film was assumed to be a multilayer film including two layers with different optical constants, a spectrum which has been measured was analyzed. Such a model including two layers can be given, because optical constants such as a refractive index or an extinction coefficient vary according to a composition of a substance. The analysis revealed that the thickness of the upper region of the sample was approximately 5 nm to 6 nm.

The concentration of Si, N, H, and O in the upper region and the lower region of the silicon nitride film was analyzed using the HR-RBS spectrum and the HR-ERDA spectrum. FIG. 10B is a table showing a composition and the concentration of the silicon nitride film. A calculation area in FIG. 10B corresponds to coordinates on a horizontal axis of the depth profile in FIG. 10A. FIG. 10B shows data of the silicon nitride film in a range of a depth from 0.9 nm to 2.6 nm, inclusive, and data of the silicon nitride film in a range of a depth from 6.1 nm to 11.3 nm, inclusive. The former is data of the upper region and the latter is data of the lower region. Note that measurement errors of concentration in FIG. 10B are as follows: ±1 atomic % for Si, ±3 atomic % for N, ±1 atomic % for H, and ±2 atomic % for O.

According to FIG. 10(B), the hydrogen concentration of the upper region is decreased to approximately 50% of the hydrogen concentration of the lower region. Thus, it is likely that the difference between the upper region and the lower region of the silicon nitride film in the hydrogen concentration causes charge retention characteristics of the memory elements A and B which are superior to that of the comparative memory elements a, b, Z, and z. Here, a substrate temperature of high-density plasma treatment performed on the silicon nitride films (42-A, 42-B, and 42-Z) is 400° C., which is the same as a substrate temperature at the time of film formation of the silicon nitride films (42-a, 42-b, and 42-z) with the use of a PECVD apparatus. Accordingly, it is likely that the lower region which is not reacted with active species in plasma has the same composition as the silicon nitride film at the time of formation by a PECVD method.

FIG. 11 shows the composition and the concentration of five kinds of silicon nitride films formed with the use of a PECVD apparatus. The sample which was measured was a silicon nitride film with a thickness of 100 nm over a silicon wafer. For the analysis, Rutherford backscattering spectrometry (RBS) and hydrogen forward scattering spectrometry (HFS) were used. In the description below, symbols SIN-1, SIN-2, SIN-3, SIN-4, and SIN-5 are used to distinguish the five kinds of silicon nitride films. Note that measurement errors of concentration in FIG. 11 are as follows: ±1 atomic % for Si, ±3 atomic % for N, ±1 atomic % for H, and ±2 atomic % for O.

SIN-1, SIN-2, SIN-3, SIN-4, and SIN-5 were formed with the use of the same parallel-plate PECVD apparatus. In addition, a substrate temperature was set to 400° C., a film formation pressure was set to 40 Pa, and a distance between electrodes was set to 30 mm. Formation conditions of SIN-1, SIN-2, SIN-3, SIN-4, and SIN-5 are different in a process gas and the flow rate. FIG. 11 shows a process gas and the flow rate. For example, "$SiH_4/NH_3=2/400$" of SIN-1 shows that $SiH_4$ at the flow rate of 2 sccm and $NH_3$ at the flow rate of 400 seem are supplied to a reaction chamber. For SIN-1, SIN-2, and SIN-3, ammonia ($NH_3$) is used as a nitrogen source gas. For SIN-4 and SIN-5, nitrogen ($N_2$) is used as a nitrogen source gas.

SIN-1 is a film which is formed under the same condition as the silicon nitride film 42-a which is formed in order to manufacture the memory element A and the comparative memory element a. SIN-3 is a film which is formed under the same condition as the silicon nitride film 42-b which is formed in order to manufacture the memory element B and the comparative memory element b. SIN-4 is a film which is formed under the same condition as the silicon nitride film 42-z which is formed in order to manufacture the comparative memory elements Z and z. Here, with the attention focused on a composition of SIN-1, SIN-3, and SIN-4, the reason why charge retention characteristics of the memory elements A and B are improved by nitridation treatment performed on the upper portions of SIN-1 and SIN-3 is described.

Data of FIGS. 10A and 10B shows that a hydrogen concentration is reduced in the upper portion of the silicon nitride film by nitridation treatment. Thus, in nitridation treatment by N*, it is likely that the following reaction occurs: N* is reacted with a Si—H bond and a N—H bond of the silicon nitride film, whereby these bonds are cut and H is released from the bonds.

Then, attention is focused on the hydrogen concentration of FIG. 11. The hydrogen concentration of SIN-4 is approximately 10 atomic %, which is 50% or less of SIN-1. Therefore, it is likely that the amount of H released from the film is small even when SIN-4 is treated with N*. It is likely that this is a main cause of no variation between a C-V curve (see FIGS. 9A and 9B) of the comparative memory element Z and a C-V curve (see FIGS. 9C and 9D) of the comparative memory element z, which are almost the same.

From the above description, increasing a hydrogen concentration difference between the upper region and the lower region of the silicon nitride film by the nitridation is effective for increasing a hydrogen concentration of the silicon nitride film formed by the CVD method. Nitridation treatment, which is performed on the upper portion of a silicon nitride film including hydrogen of at least 15 atomic % which is formed by a CVD method, is effective in improving the charge retention characteristic, in consideration of the following: SIN-4 with approximately 10 atomic % of a hydrogen concentration, which is hardly nitrided; improvement of a charge retention characteristic of the memory element A provided with a charge trapping film, in which the upper portion of the silicon nitride film (SIN-1) with approximately 21 atomic % of a hydrogen concentration is subjected to nitridation treatment; improvement of a charge retention characteristic of the memory element B provided with a charge trapping film, in which the upper portion of the silicon nitride film (SIN-3) with approximately 17 atomic % of a hydrogen concentration is subjected to nitridation treatment; measurement errors of concentration (±1 to 3 atomic %) in FIG. 10A and FIG. 11; and the like. Further, the hydrogen concentration of the silicon nitride film formed by a CVD method is preferably greater than or equal to 20 atomic %. That is, setting the hydrogen concentration of the lower region of the charge trapping film to be greater than or equal to 15 atomic % and reducing a hydrogen concentration of the upper region to be lower than the lower region are effective for improving a charge retention characteristic of a memory element. The hydrogen concentration of the lower region is preferably greater than or equal to 20 atomic %. Such a charge trapping film can be formed through a step of forming a silicon nitride film with a hydrogen concentration greater than or equal to 15 atomic % by a CVD method and a step of nitriding the upper portion of the silicon nitride film.

Referring to data of FIG. 11, use of $NH_3$ for a nitrogen source gas to be a source material of the silicon nitride film is effective for making the hydrogen concentration be 15 atomic % or more. In each SIN-1, SIN-2, and SIN-3, the hydrogen concentration is 15 atomic % or more. This is because the concentration of a N—H bond in the silicon nitride film, which is formed using $NH_3$ as a source material, is increased due to a N—H bond included in $NH_3$. Thus, when a nitrogen source gas having a N—H bond is used for a source material, the hydrogen concentration of the silicon nitride film can be easily increased as compared to the case where a nitrogen source gas having no N—H bond is used for a source material. Therefore, use of a hydronitrogen gas having a N—H bond for a nitrogen source gas is effective for making the hydrogen concentration of the silicon nitride film high. Note that in the case of using $N_2$ for a nitrogen source gas, $H_2$ may be added to a process gas.

FIG. 12 shows concentration of the N—H bond and Si—H bond of SIN-1, SIN-3, and SIN-4. The bond concentration was calculated from an absorption spectrum measured by Fourier transform infrared spectroscopy (FTIR). The concentration ratio of the Si—H bond to the N—H bond (hereinafter referred to as the ratio (Si—H/N—H)), in both SIN-1 and SIN-3 which are formed using $NH_3$ for a nitrogen source gas, is less than or equal to 0.03, while the bond concentration ratio (Si—H/N—H) in SIN-4 which is formed using $N_2$ as a source material is greater than or equal to 1.

In a silicon nitride film with a small ratio (Si—H/N—H), trap levels are at deep levels, and the deep levels are localized in the film. Since charge is not easily trapped in such a silicon nitride film, high voltage is needed for writing and erasing by the memory element. Meanwhile, since the trap levels are deep, trapped charge does not easily leak from the film. Thus, it is likely that the silicon nitride film with a small ratio (Si—H/N—H) has a good charge retention characteristic. This is obvious from the C-V curve of the comparative memory element a in FIG. 7C.

On the contrary, the silicon nitride film with a large ratio (Si—H/N—H) has more trap levels than the silicon nitride film with the small ratio (Si—H/N—H); however, most of the levels are at shallow levels. Thus, the silicon nitride film with a large ratio (Si—H/N—H) easily traps charge but the trapped charge easily leaks because the trap levels are shallow. Accordingly, the silicon nitride film with a large ratio (Si—H/N—H) has a bad charge retention characteristic. This is obvious from the C-V curve of the comparative memory element z in FIGS. 9C and 9D.

Therefore, forming the upper region on the side far from a semiconductor region from silicon nitride with high charge trap density and forming the lower region on the side close to the semiconductor region from silicon nitride having trap levels at deep levels, in the charge trapping film, are effective for reducing voltage needed for writing and erasing of a nonvolatile memory element and for improving the charge retention characteristic.

In order to form such a lower region, use of a hydronitrogen gas having a N—H bond such as $NH_3$ for a nitrogen source gas for forming a silicon nitride film is effective. In the case of using $N_2$ for a nitrogen source gas, $H_2$ may be added to a process gas. With the use of such a process gas, a silicon nitride film with a ratio (Si—H/N—H) of 0.1 or less can be easily formed. Further, a value of the ratio can be easily made to 0.05 or less. Further, nitriding the upper portion of the silicon nitride film formed by a CVD method in order to form such an upper region is effective for increasing charge trap density.

Furthermore, according to data in FIG. 10B, reducing the hydrogen concentration of the upper region of the silicon nitride film by 30% or more by a nitridation treatment step is effective for improving a charge retention characteristic of the silicon nitride film. Therefore, in the silicon nitride film included in the charge trapping film, the hydrogen concentration of the upper region is preferably 0.7 times or less, more preferably 0.6 times or less, as high as the hydrogen concentration of a region on the semiconductor region side.

Note that as a method for analyzing a composition of the upper region and the lower region of the charge trapping film, a method by which data in FIG. 10B is obtained can be used. However, when the composition of the upper region is analyzed, be careful that a boundary between the upper region and the lower region, and an interface with a second insulating film or a conductive film are not included in an area of analysis. Similarly, for the lower region, a boundary between the lower region and the upper region, and an interface with a first insulating film are not included in an area of analysis.

Embodiment Mode 4

This embodiment mode describes a nonvolatile semiconductor memory device as an example of a semiconductor device relating to the present invention.

Figure 13:
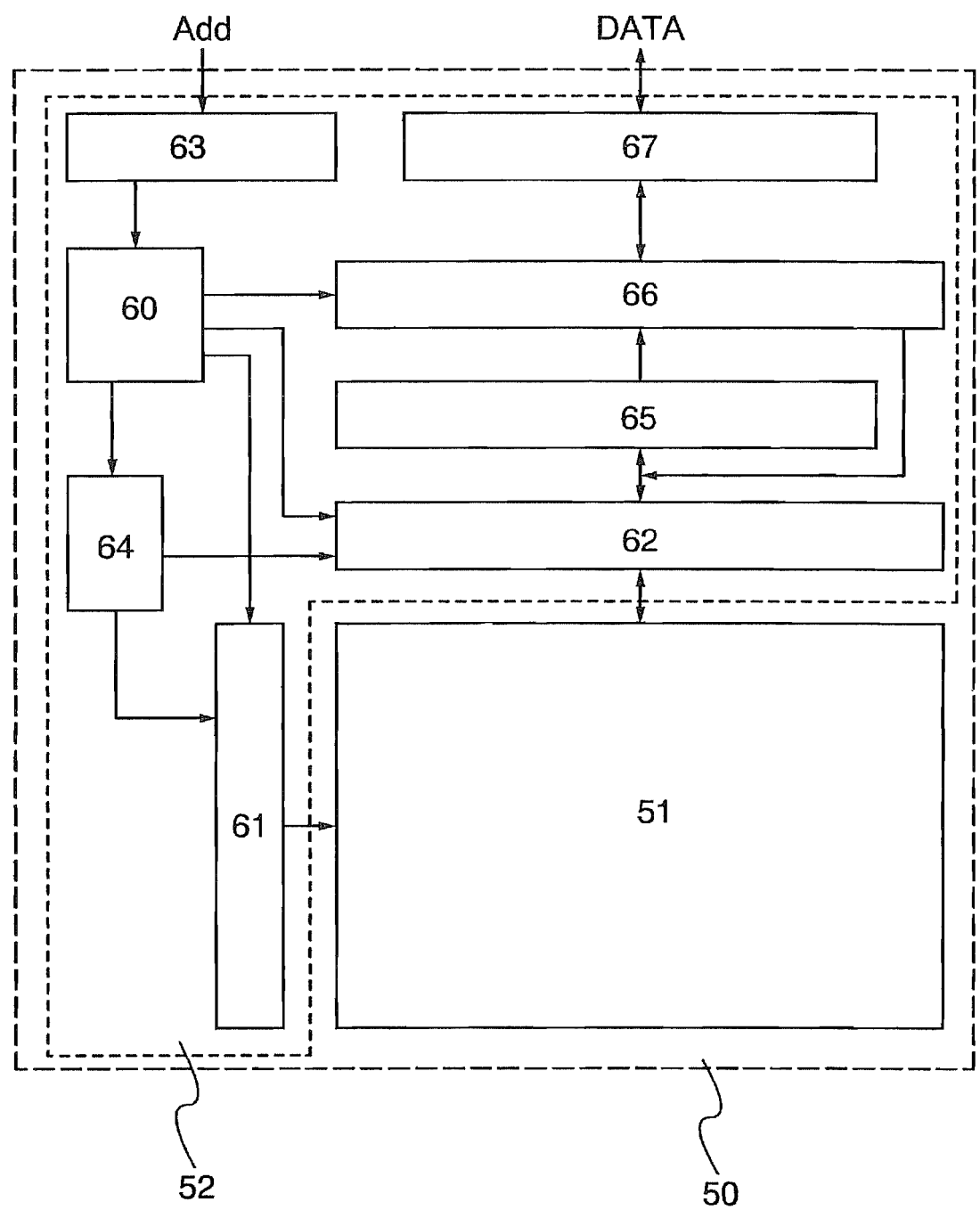
FIG. 13 is a block diagram showing a structural example of a semiconductor device.

FIG. 13 is a block diagram showing a structural example of a nonvolatile semiconductor memory device. In a nonvolatile semiconductor memory device 50 of FIG. 13, a memory cell array 51 and a driver circuit portion 52 which is connected to the memory cell array 51 and which controls the writing operation, the erasing operation, the reading operation, and the like are formed over one substrate. The memory cell array 51 includes a plurality of word lines WLs, a plurality of bit lines BLs which are crossed to the word lines WLs, and a plurality of memory cells MCs connected to the word lines WLs and the bit lines BLs. As a storage unit of data of the memory cells MCs, the nonvolatile memory transistor described in Embodiment Modes 1 to 3 is used. Accordingly, a nonvolatile semiconductor memory device which has an excellent charge retention characteristic and has high reliability can be obtained.

The driver circuit portion 52 includes a control circuit 60 for controlling various circuits in the driver circuit portion 52, a low decoder 61 for selecting a word line, a column decoder 62 for selecting a bit line, an address buffer 63, a boosting circuit 64, a sense amplifier 65, a data buffer 66, and a data input/output buffer 67.

An address Add of a memory cell to which data is written and from which data is read is input to the control circuit 60 through the address buffer 63. In the control circuit 60, an internal row address signal and an internal column address signal are generated. The internal row address signal is transferred to the row decoder 61 and the internal column address signal is transferred to the column decoder 62.

For data writing and erasing operations, a potential which is obtained by boosting a power supply potential is used. For this, the boosting circuit 64, which is controlled by the control circuit 60 depending on the operation mode, is provided. Output of the booster circuit 64 is supplied to the word line WL and the bit line BL which are formed in the memory cell array 51 through the row decoder 61 and the column decoder 62.

Data which is read from the memory cell array 51 is input to the sense amplifier 65 by the column decoder 62. Data which is input to the sense amplifier 65 is retained in the data buffer 66. Under control of the control circuit 60, data which is retained in the data buffer 66 is output from the nonvolatile semiconductor memory device 50 through the data input/output buffer 67. The data to be written is once retained in the data buffer 66 through the data input/output buffer 67, and the data is transferred to the column decoder 62 under control of the control circuit 60.

It is necessary that a potential which is different from the power supply potential be used in the memory cell array 51. Therefore, it is desirable that at least the memory cell array 51 and the driver circuit portion 52 be electrically insulated and isolated. As described in Embodiment Mode 2, when a nonvolatile memory element and a transistor of the driver circuit portion 52 are formed using a semiconductor film formed over an insulating film, insulation and isolation of each semiconductor element can be easily performed. Accordingly, a malfunction can be prevented, and a nonvolatile semiconductor memory device consuming low power can be obtained.

Next, a structural example of the memory cell array is described with reference to FIGS. 14, 15, and 16.

Figure 14:
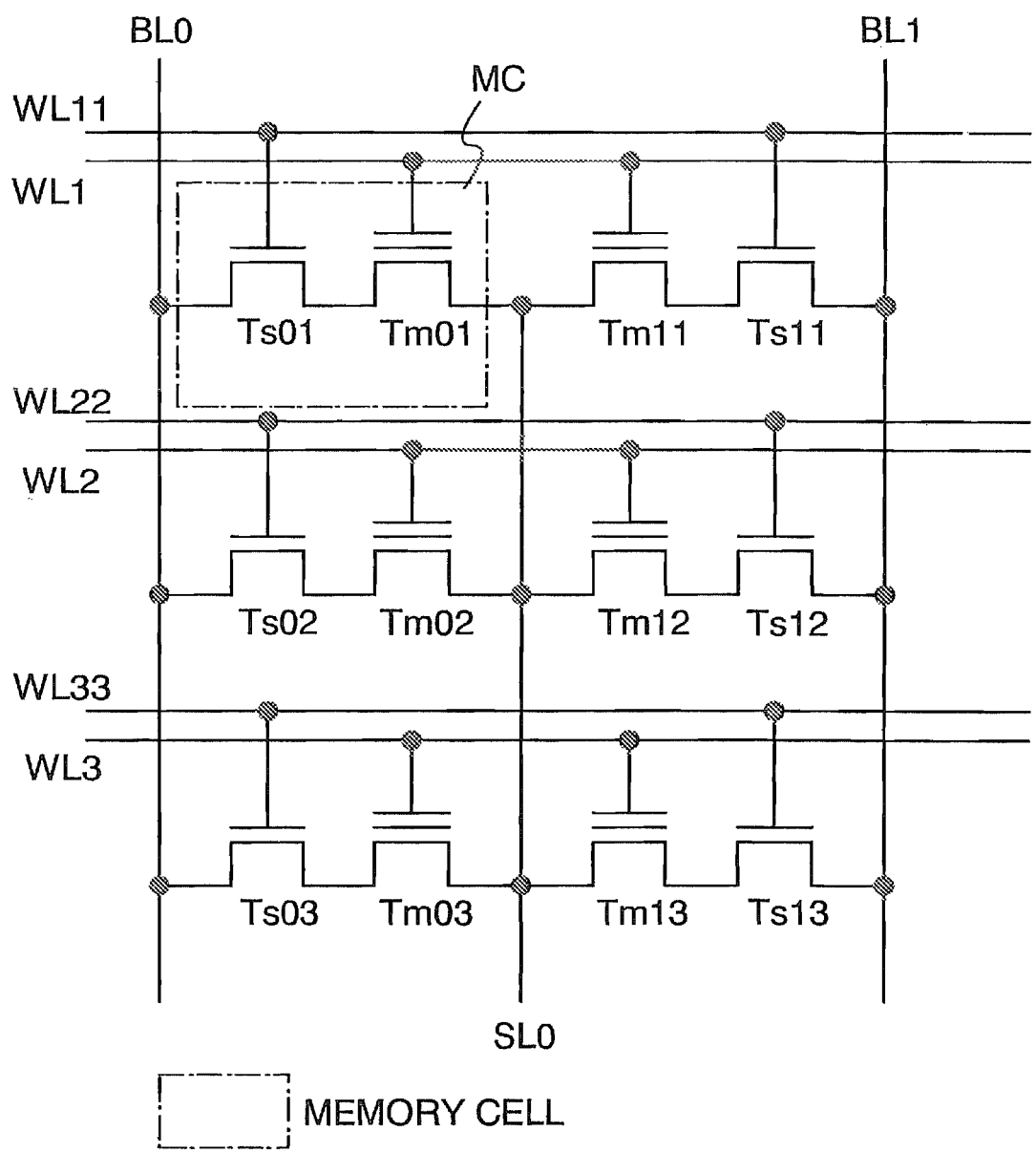
FIG. 14 is a circuit diagram showing a structural example of a memory cell array.

FIG. 14 is a circuit diagram showing a structural example of the memory cell array 51 having a NOR-type memory cell. The memory cells MCs are arranged in matrix. In FIG. 14, the memory cells MCs at 3 rows×2 columns are shown. Each memory cell MC which stores 1-bit information includes a switching transistor Ts and a nonvolatile memory transistor Tm which are connected in series. In the memory cell array 51, bit lines BL (BL0 and BL1) are provided every column, and source lines SL (SL0) are provided every two columns. These signal lines are connected to the column decoder 62. Further, first word lines WL (WL1, WL2, and WL3) and second word lines WL (WL11, WL22, and WL33) are provided every row, and these signal lines are connected to the row decoder 61.

A structure of a memory cell MC specified by the bit line BL0 and the first word line WL1, is described. The structures of other memory cells MC are similar to that of the memory cell MC. The switching transistor Ts has a gate which is connected to the second word line WL11, and a source and a drain of which one is connected to the bit line BL0 and the other is connected to the nonvolatile memory transistor Tm (hereinafter, referred to as a "memory transistor Tm"). The memory transistor Tm has a gate which is connected to the first word line WL1, and a source and a drain of which one is connected to the switching transistor Ts and the other is connected to the source line SL0.

An example of a writing method and an erasing method of data to/from the memory cell MC specified by the bit line BL0 and the first word line WL1 in the case where both the switching transistor Ts and the memory transistor Tm are n-channel transistors, is described.

To write data, the potential of the second word line WL11 and the bit line BL0 is set at a high level (hereinafter referred to as an "H level") and the potential of the bit line BL1 is set at a low level (hereinafter referred to as an "L level"), and high voltage is applied to the first word line WL1. Accordingly, charge (in this case, electrons) is injected into a charge trapping film of the memory transistor Tm01. To erase data from the memory transistor Tm01, the potential of the second word line WL11 and the bit line BL0 is set at an H level, and high voltage of negative polarity is applied to the first word line WL1.

Figure 15:
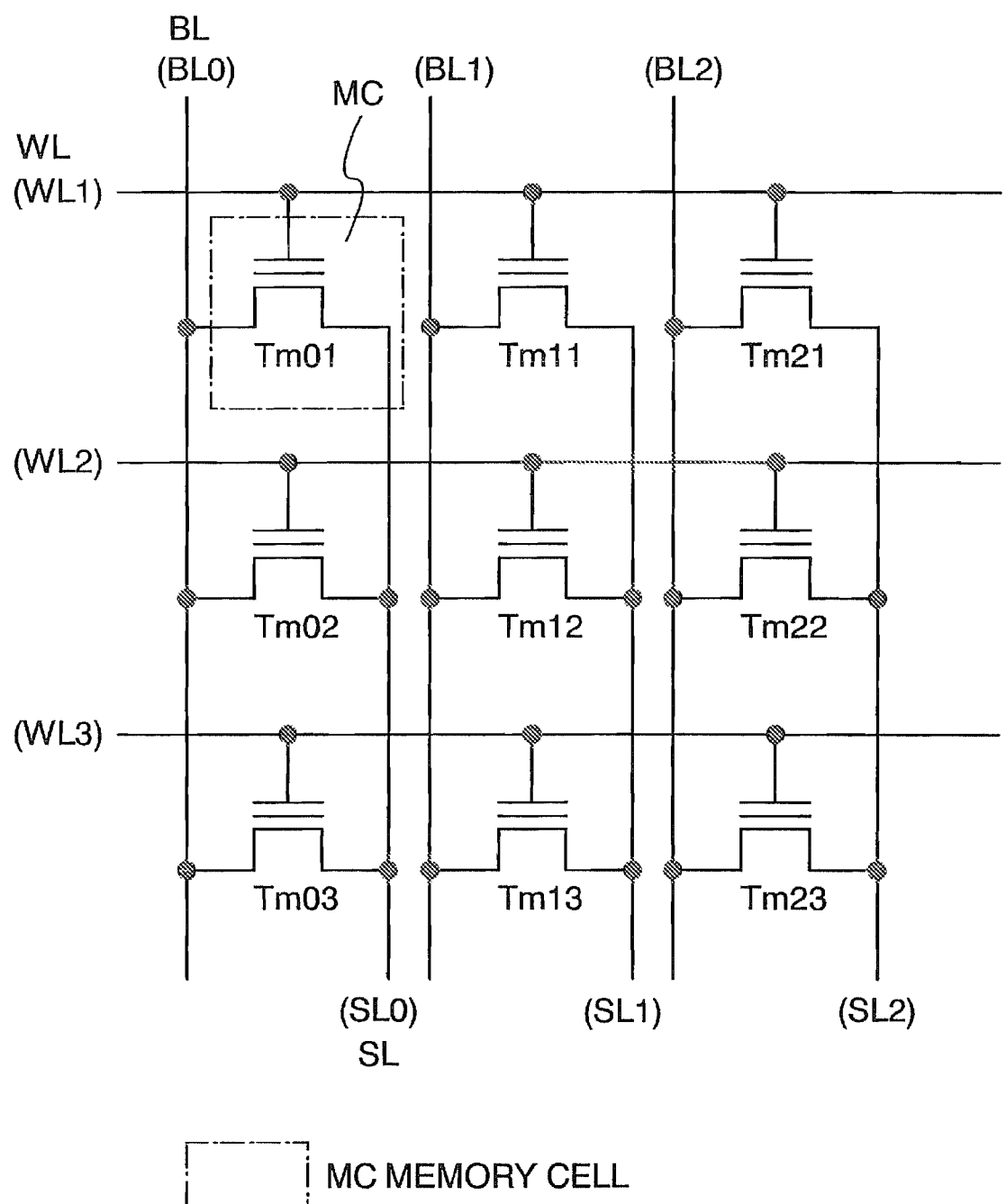
FIG. 15 is a circuit diagram showing a structural example of a memory cell array.

FIG. 15 is a circuit diagram showing another structural example of the memory cell array 51. In the memory cell MC, the switching transistor Ts is not provided, and one of a source and a drain of the memory transistor Tm is electrically connected to the bit line BL without through a switching element. Further, source lines SL (SL0, SL1, and SL2) are formed every column. Since the switching transistor Ts is not provided, second bit lines WL11, WL22, and WL33 for controlling on and off of the switching transistors Tss are not provided in the memory cell array 51 of FIG. 15. These are different from the memory cell in FIG. 14.

Next, an example of writing operation and erasing operation of data to/from the memory cell MC specified by the bit line BL0 and the first word line WL1 in the case where the memory transistor Tm is an n-channel transistor, is described.

Providing that the potential of a source line SL0 is set at an L level (e.g., 0 V), high voltage is applied to the first word line WL1, and a potential corresponding to data "0" or data "1" is given to the bit line BL0. For example, the potential of the bit line BL0 is set at an H level in the case of data "0" and the potential of the bit line BL0 is set at an L level in the case of data "1". In a drain of the memory transistor Tm01 to which an H level potential has been given due to writing of data "0", hot electrons are generated near the drain and the hot electrons are injected into a charge trapping film. That is, electrons are injected into the charge trapping film by F-N tunneling current, and thus, a threshold voltage of the memory transistor Tm01 is varied. In the memory cell MC to which data "0" has been given, hot electrons are generated near the drain by a high lateral electric field between the drain and the source, and the hot electrons are injected into the charge trapping film. A threshold voltage of the memory transistor Tm01 becomes high by the injection of electrons into the charge trapping film. This represents a state where data "0" is kept in the memory cell MC.

In the case where data "1" is written, electrons are prevented from being injected into the charge trapping film, and a threshold voltage of the memory transistor Tm01 is not varied. That is, a threshold voltage is kept low, and an erasing state is kept.

To erase the data, the potential of the source line SL0 is set at a high potential of positive polarity (e.g., a positive potential of approximately 10 V) and the bit line BL0 is made to be in a floating state. Then, the potential of the first word line WL1 is set at a high potential of negative polarity. Thus, electrons are extracted from the charge trapping film of the memory transistor Tm01 to a semiconductor region. Accordingly, an erasing state of data "1" is obtained.

For example, data is read in the following manner. Providing that the potential of the source line SL is set at 0 V and the potential of the bit line BL0 is set at approximately 0.8 V, a reading potential set at an intermediate value of threshold voltages corresponding to the data "0" and the data "1" are given as the potential of the first word line WL1. At this time, the sense amplifier 65 connected to the bit line BL judges whether or not current flows from the memory transistor Tm to the bit line BL0.

Figure 16:
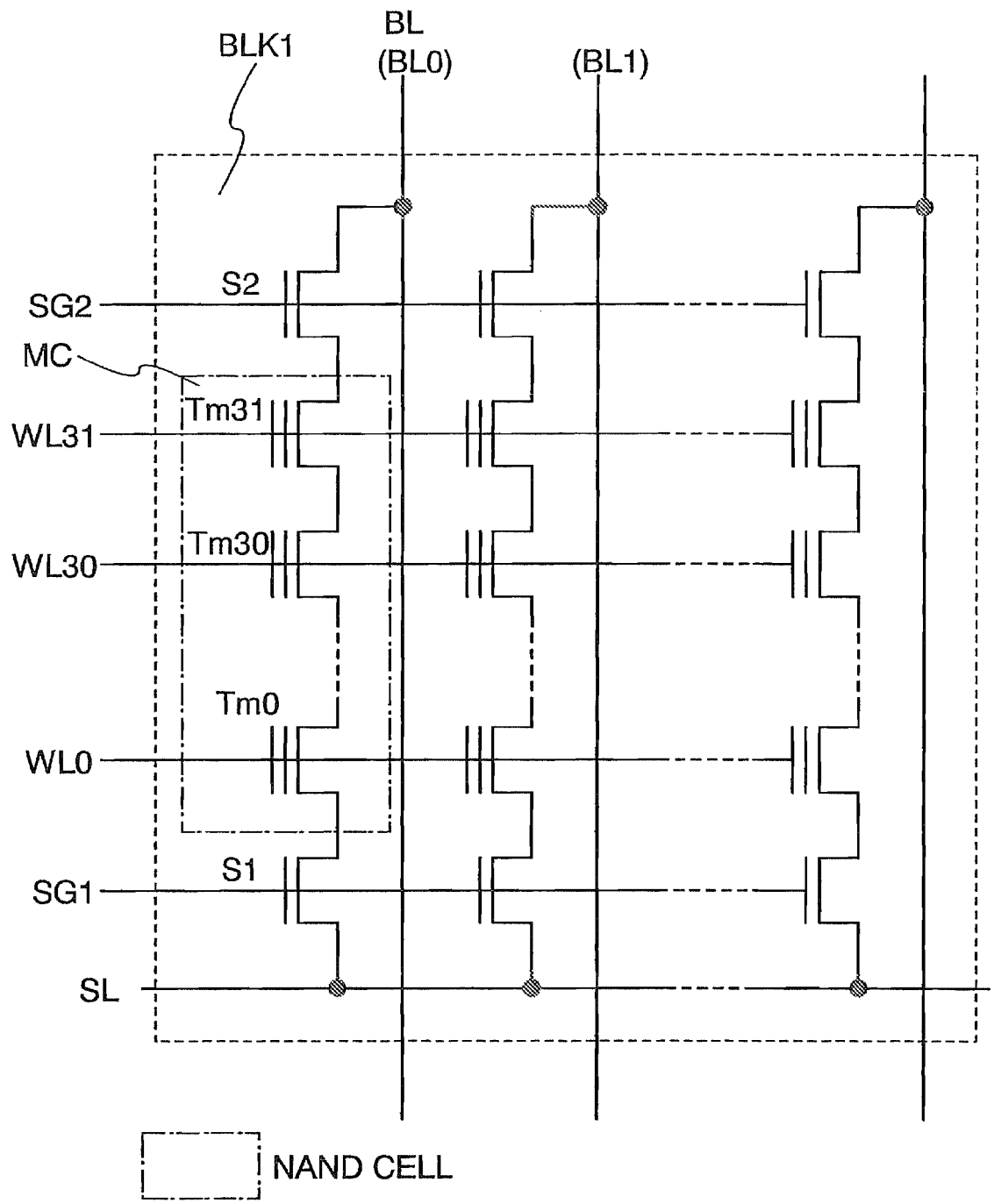
FIG. 16 is a circuit diagram showing a structural example of a memory cell array.

FIG. 16 is a circuit diagram showing another structural example of the memory cell array 51. FIG. 16 shows an equivalent circuit of the memory cell MC having a NAND-type memory cell. A block BLK1 includes a plurality of NAND cells. The block BLK1 shown in FIG. 16 has 32 word lines (word lines WL0 to WL31). The memory cell MC is formed of a plurality of memory transistors Tm connected in series.

A structure of a NAND cell specified by the bit line BL0 is described. Gates of the memory transistors Tm0 to Tm31 are connected to the first distinct word lines WL0 to WL31, respectively. One of a source and a drain of the first-row memory transistor Tm0 is connected to a first selection transistor S1, and one of a source and a drain of the $32^{nd}$-row memory transistor Tm31 is connected to a second selection transistor S2. The first selection transistor S1 is connected to a first selection gate line SG1 and the bit line BL0, and the second selection transistor S2 is connected to a second selection gate line SG2 and the bit line BL0.

Here, providing that the memory transistors Tm0 to Tm31, the first selection transistor S1, and the second selection transistor S2 are n-channel transistors, the writing operation and the erasing operation are described. In a NAND-type memory cell, after the memory cell MC is made in an erasing state, the writing operation is performed. The erasing state is a state in which threshold voltage of each of the memory transistors Tm0 to Tm31 of the memory cell MC is a negative voltage value.

FIG. 17A is a circuit diagram describing an example of operation to write "0" in the memory transistor Tm0, and FIG. 17B is a circuit diagram illustrating an example of operation to write "1". To write "0", 0 V (ground voltage) is applied to the bit line BL0 and for example, Vcc (a power supply potential) is applied to the second selection gate line SG2 to turn on the second selection transistor S2. Meanwhile, 0 V is applied to the first selection gate line SG1 to turn off the first selection transistor S1. Next, the potential of the word line WL0 is set at a high potential Vpgm (approximately 20 V), and potentials of the other word lines WL1 to WL31 are set at an intermediate potential Vpass (approximately 10 V). Since the potential of the bit line BL0 is 0 V, the potential of a channel formation region of the selected memory transistor Tm0 becomes 0 V. A potential difference between the word line WL0 and the channel formation region is large; therefore, electrons are injected into a charge trapping film of the memory transistor Tm0 by F-N tunneling current. Consequently, the threshold voltage of the memory transistor Tm0 has positive polarity so that a state where "0" has been written is obtained.

In the case where "1" is written to the memory transistor Tm0, as shown in FIG. 17B, the potential of the bit line BL is set at a power supply potential Vcc, for example. Since the potential of the second selection gate line SG2 is Vcc, the selection transistor S2 is cut off. Therefore, a channel formation region of the memory transistor Tm0 is made in a floating state. Next, the potential of the word line WL0 is set at a writing potential Vpgm (20 V) that is a high potential of positive polarity and potentials of the other word lines WL1 to WL31 are set at an intermediate potential Vpass (10 V). Voltage of a channel formation region is higher than (Vcc-Vth) and becomes, for example, approximately 8 V, due to capacitance coupling of each of the word lines WL0 to WL31 and the channel formation region of the memory transistor Tm0. Note that Vth refers to a threshold voltage of the memory transistor Tm0. Therefore, a potential difference between the word line WL0 and the channel formation region is small. Therefore, electron injection into an electron trapping film of the memory transistor Tm0 by F-N tunneling current does not occur. Accordingly, the threshold voltage of the memory transistor Tm0 is a voltage value of negative polarity so that a state where "1" has been written is obtained.

Figure 18A:
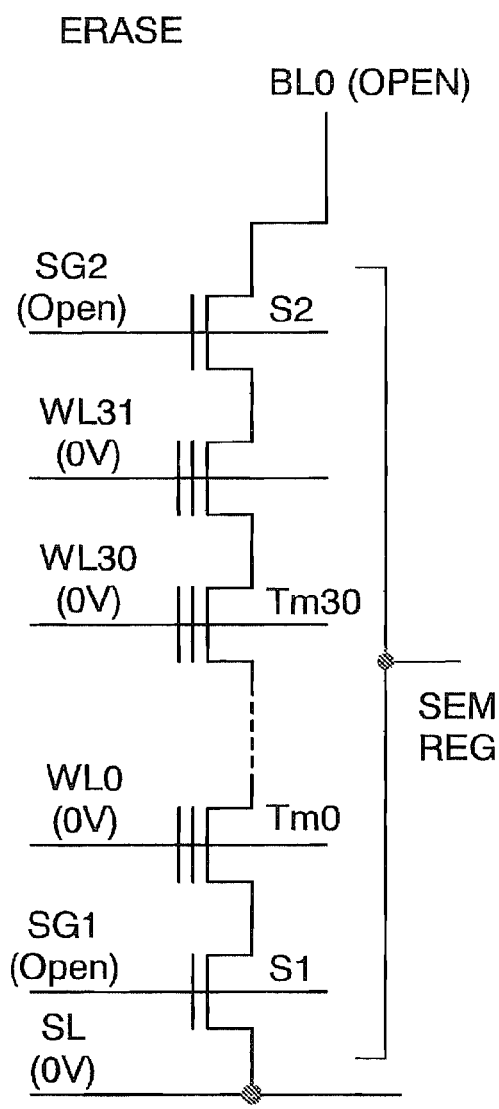
FIGS. 18A and 18B are respectively a circuit diagram illustrating erasing operation of a memory cell array and a circuit diagram illustrating reading operation of a memory cell array.

FIG. 18A is a circuit diagram describing an example of the erasing operation. In the memory cell array 51 of FIG. 16, data of a plurality of memory transistors Tms included in the same block BLK1 is erased at the same time. As shown in FIG. 18A, when potentials of all the word lines WL0 to WL31 of the selected block are set at 0 V and the potential of a semiconductor region is set at an erasing potential Vers which is a high potential of negative polarity, potentials of the bit line BL and the source line SL are in a floating state. Accordingly, electrons are discharged from a charge trapping film of all the memory transistors Tms included in the block BLK1 to a semiconductor region by tunneling current, and threshold voltage of the memory transistor Tm is decreased to be a negative value.

Figure 18B:
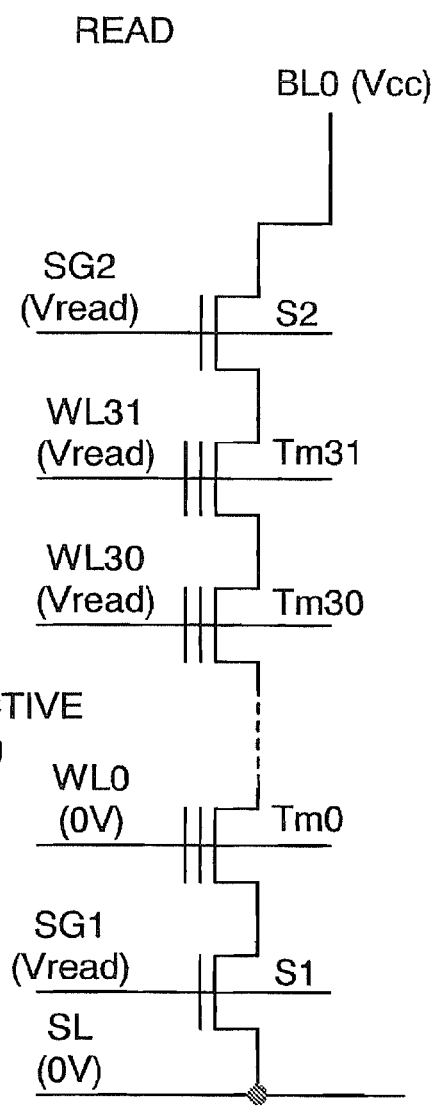

FIG. 18B is a circuit diagram describing an example of the reading operation to read data from the memory transistor Tm0. In the reading operation, the potential of the first word line WL0 is set at a reading potential Vr (e.g., 0 V), and the word lines WL1 to WL31 of unselected memory cells and the selection gate lines SG1 and SG2 are set at an intermediate potential Vread for reading which is a little higher than a power supply potential Vcc. As a result of this, the memory transistors Tm1 to Tm31 other than the memory transistor Tm0 function as transfer transistors, and current flowing in the bit line BL0 is detected in the sense amplifier 65 so that whether current flows in the memory transistor Tm0 can be detected. In the case where data stored in the memory transistor Tm0 is "0", the memory transistor Tm0 is in an off state; therefore, current does not flow to the bit line BL0. Meanwhile, in the case where data stored in the memory transistor Tm0 is "1", the memory transistor Tm0 is in an on state; therefore, current flows in the bit line BL0.

Embodiment Mode 5

This embodiment mode describes a nonvolatile semiconductor memory device as a semiconductor device. Further, this embodiment mode describes a method for manufacturing a nonvolatile semiconductor memory device. A nonvolatile semiconductor memory device of this embodiment mode has a circuit similar to the nonvolatile semiconductor memory device 50 shown in FIG. 13, and a memory cell array thereof has a circuit structure shown in FIG. 14.

In the nonvolatile semiconductor memory device, since a transistor of a memory cell array requires a higher drive voltage than a transistor of a driver circuit portion, it is preferable that structures of the transistor of the memory cell array and the transistor of the driver circuit be changed in accordance with drive voltage. For example, in the case where drive voltage is desired to be low and variation in a threshold voltage is desired to be small, it is preferable that a gate insulating film be thin. In the case where drive voltage is high and a gate insulating film having high dielectric strength voltage is required, it is preferable that the gate insulating film be thick.

Thus, this embodiment mode describes a method for manufacturing transistors in which a gate insulating film having different thicknesses is formed over the same substrate. In addition, this embodiment mode describes a method for manufacturing a transistor and a nonvolatile memory transistor using thin film transistors.

Figure 19:
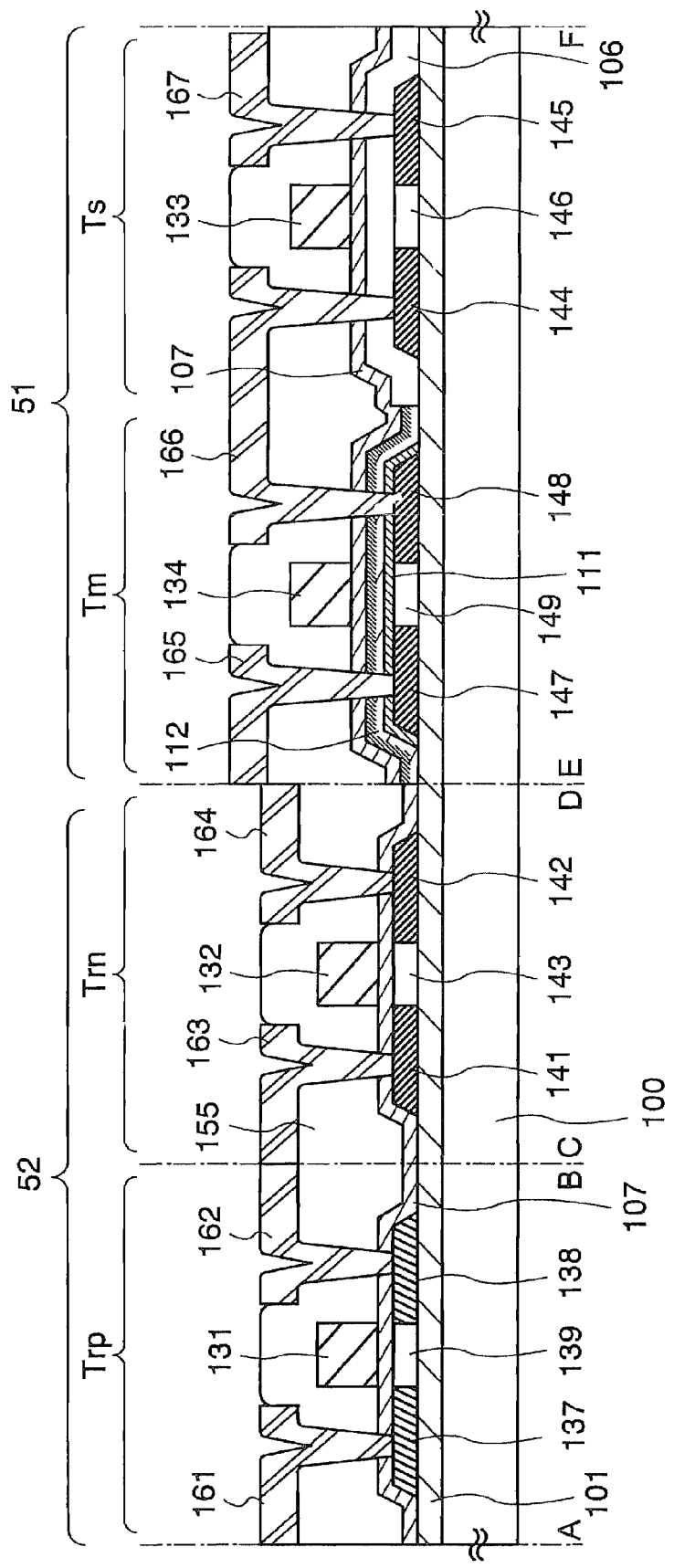
FIG. 19 is a cross-sectional view of a semiconductor device.
Figure 20A:
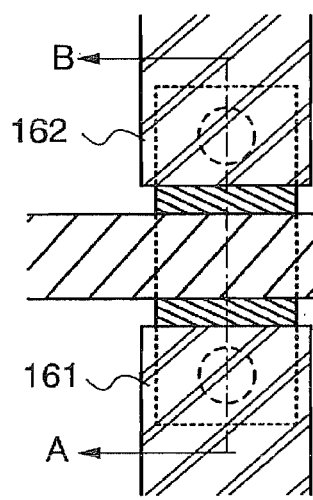
FIGS. 20A to 20C are top views of the semiconductor device of FIG. 19.
Figure 20B:
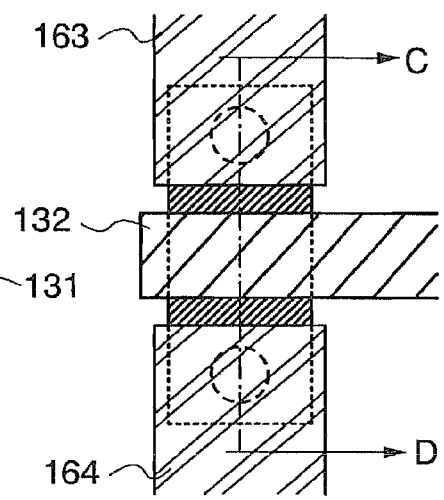
Figure 20C:
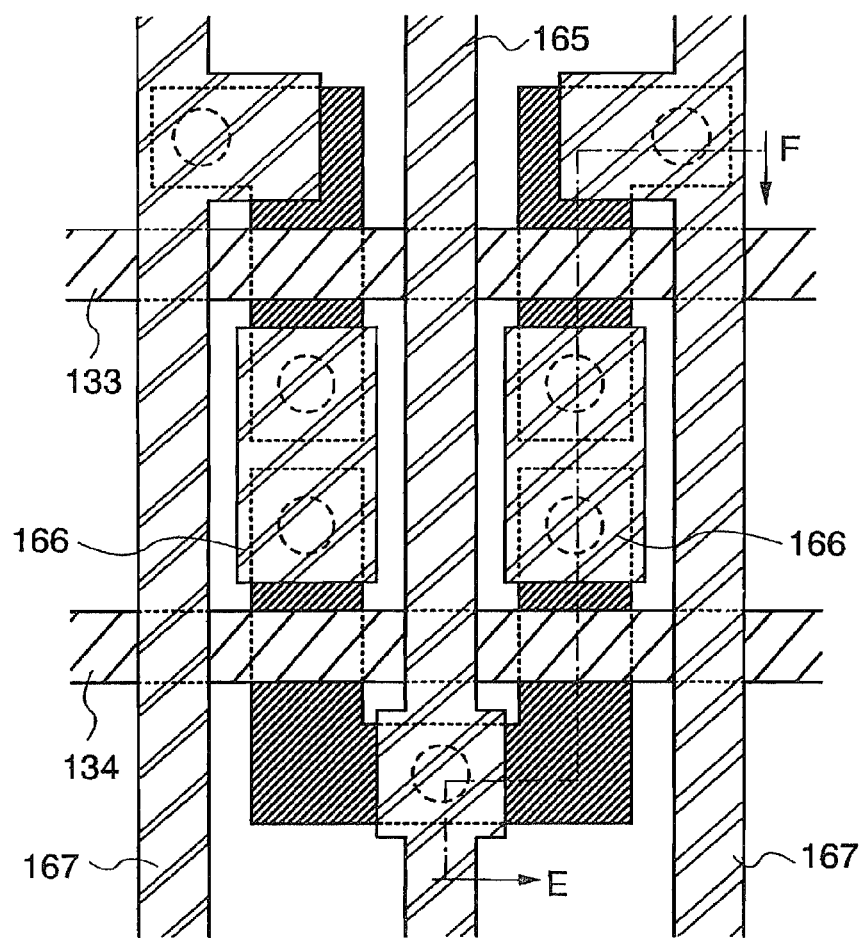

FIG. 19 is a cross-sectional view of a nonvolatile semiconductor memory device of this embodiment mode, and FIGS. 20A to 20C are top views of the nonvolatile semiconductor memory device. In FIG. 19, a cross-sectional view of a p-channel transistor Trp provided in a driver circuit portion 52 is shown in A-B, a cross-sectional view of an n-channel transistor Tm provided in the driver circuit portion 52 is shown in C-D, and a cross-sectional view of a nonvolatile memory transistor Tm and a switching transistor Ts of a memory cell MC is shown in E-F. A cross-sectional view taken along line A-B in FIG. 20A, a cross-sectional view taken along line C-D in FIG. 20B, and a cross-sectional view taken along line E-F in FIG. 20C are respectively shown in A-B, C-D, and E-F in FIG. 19. FIG. 20 is a top view of two adjacent memory cells MC.

As shown in FIG. 19, the p-channel transistor Trp (hereinafter, referred to as a "transistor Trp"), the n-channel transistor Trn (hereinafter, referred to as a "transistor Trn"), the memory transistor Tm, and the switching transistor Ts (hereinafter, referred to as a "transistor Ts") are fanned over one substrate, which is a substrate 100. A semiconductor film of each transistor is formed over a base insulating film 101 over the substrate 100.

P-type high concentration impurity regions 137 and 138 and a channel formation region 139 are formed in a semiconductor film of the transistor Trp, and n-type high concentration impurity regions 141 and 142 and a channel formation region 143 are formed in a semiconductor film of the transistor Trn. The transistor Ts and the memory transistor Tm are n-channel transistors. N-type high concentration impurity regions 144 and 145 and a channel formation region 146 are formed in a semiconductor film of the transistor Ts, and n-type high concentration impurity regions 147 and 148 and a channel formation region 149 are formed in a semiconductor film of the memory transistor Tm.

A gate insulating film of the transistor Trp and the transistor Trn is formed of an insulating film 107. A gate insulating film of the transistor Ts is formed of an insulating film 106 and the insulating film 107 to be thicker than the transistors Trp and Trn. The transistors Trp, Tm, and Ts respectively include conductive films 131, 132, and 133 which overlap with channel formation regions 139, 143, and 146 with the gate insulating film interposed therebetween. These conductive films 131, 132, and 133 form gate electrodes of the transistors Trp, Tm, and Ts, respectively. The conductive film 133 forms a second word line WL of FIG. 14.

The memory transistor Tm is a MONOS-type memory element. The memory transistor Tm includes, over the channel formation region 149, a first insulating film farmed of the insulating film 111, a silicon nitride film 112, a second insulating film formed of the insulating film 107, and the conductive film 134. The upper portion and the lower portion of the silicon nitride film 112 are different from each other in a hydrogen concentration, and the silicon nitride film 112 functions as a charge trapping film. The conductive film 134 forms a gate electrode of the memory transistor Tm and forms a first word line WL of FIG. 14.

Conductive films 161 and 162 form source or drain electrodes of the transistor Trp, and conductive films 163 and 164 form source or drain electrodes of the transistor Tm. A conductive film 165 is a source line SL in FIG. 14, and a conductive film 167 is a bit line BL. A conductive film 166 is an electrode which electrically connects the memory transistor Tm and the transistor Ts.

Hereinafter, a method for manufacturing a semiconductor device of this embodiment mode is described with reference to cross-sectional views shown in FIG. 19, FIGS. 21A to 21C, FIGS. 22A to 22C, FIGS. 23A and 23B, and FIGS. 24A and 24B, and top views shown in FIGS. 20A to 20C, FIGS. 25A to 25C, and FIGS. 26A to 26C.

First, as shown in FIG. 21A, the base insulating film 101 is formed over the substrate 100. For the substrate 100, a glass substrate, a quartz substrate, a ceramic substrate, or a metal substrate (e.g., a stainless steel substrate) can be used. The base insulating film 101 can have a single-layer structure or a stacked-layer structure which is formed from an insulating material such as silicon oxide, silicon nitride, silicon nitride oxide, or silicon oxynitride by a CVD method, a sputtering method, or the like. For example, in a case where the base insulating film 101 has a two-layer structure, a silicon nitride oxide film may be formed as a first layer and a silicon oxynitride film may be formed as a second layer. Alternatively, a silicon nitride film may be formed as the first layer and a silicon oxide film may be formed as the second layer. When a silicon nitride oxide film and a silicon nitride film which function as a blocking layer are formed as the base insulating film 101, a transistor can be prevented from being contaminated by alkali metal such as Na or alkaline earth metal which is included in the substrate 100.

Next, a semiconductor film 180 is formed over the base insulating film 101. The semiconductor film 180 can be formed in the following manner: an amorphous semiconductor film which contains silicon (Si) as its main component is formed by a sputtering method, an LPCVD method, a PECVD method, or the like, and the amorphous semiconductor film is crystallized to form a crystalline semiconductor film. Note that, as the amorphous semiconductor film, an amorphous silicon film, an amorphous germanium film, an amorphous silicon germanium film, or the like can be formed. Further, crystallization of the amorphous semiconductor film can be performed by a laser crystallization method, a thermal crystallization method using RTA or an annealing furnace, a thermal crystallization method using a metal element that promotes crystallization, a method in which any of these methods are combined, or the like. In the case where an SOI substrate is used as the substrate 100, a semiconductor layer of the SOI substrate forms the semiconductor film 180, and an insulating layer below the semiconductor layer forms is the base insulating film 101.

Figure 25A:
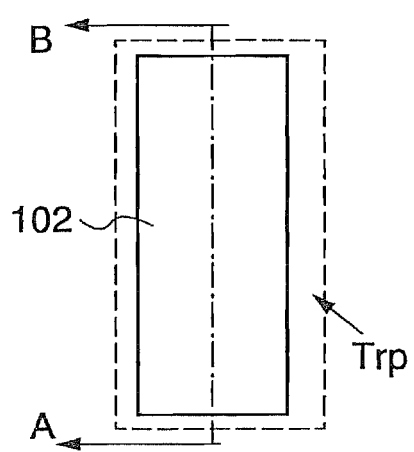
FIGS. 25A to 25C are top views of FIG. 21B.
Figure 25B:
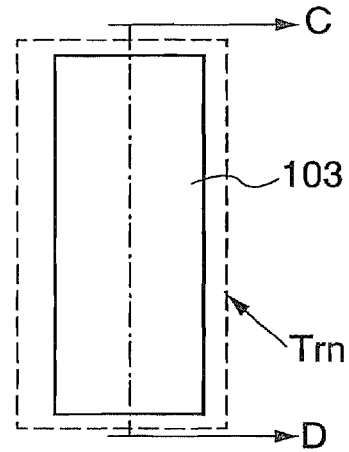
Figure 25C:
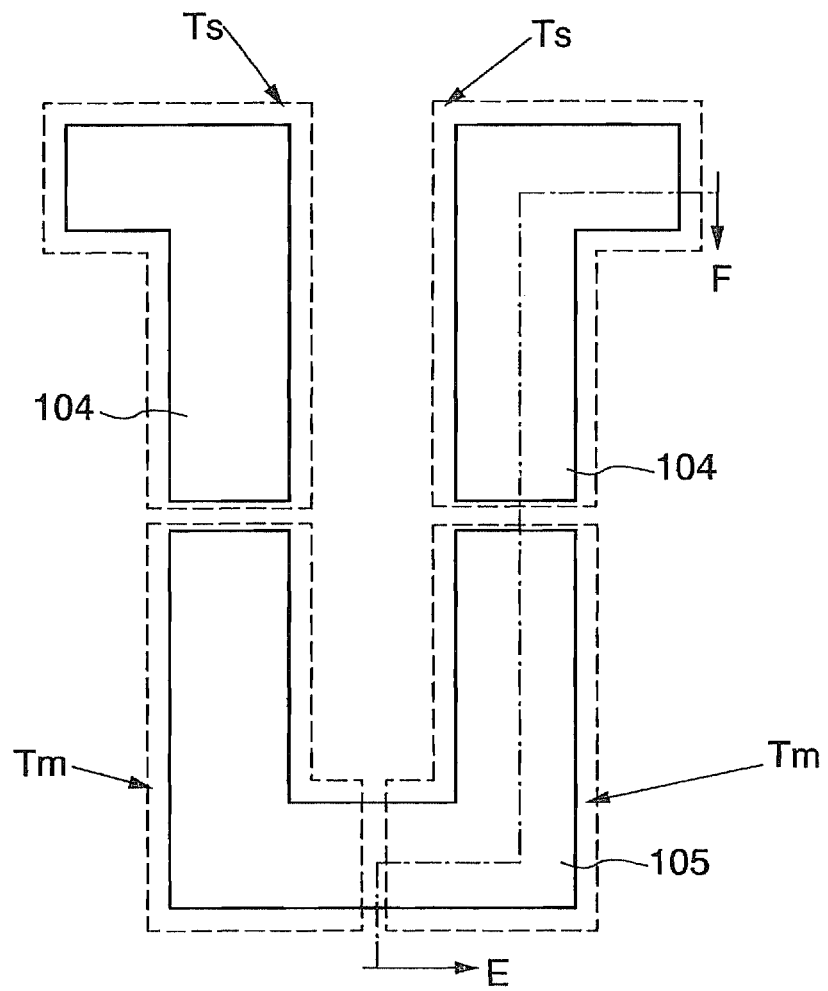

Next, the semiconductor film 180 is etched to have an island shape to form semiconductor films 102 to 105 as shown in FIG. 21B. FIG. 25A is a top view of the semiconductor film 102, FIG. 25B is a top view of the semiconductor film 103, and FIG. 25C is a top view of the semiconductor films 104 and 105. The semiconductor films 102, 103, 104, and 105 form semiconductor regions of the transistor Trp, the transistor Tm, the transistor Ts, and the memory transistor Tm, respectively. As shown in FIG. 25C, two memory transistors Tm are formed in one semiconductor film 105.

Next, an insulating film with a thickness of 10 nm to 50 nm is formed to cover the semiconductor films 102 to 105. This insulating film is formed of a single-layer film or a multilayer film including two or more layers which is made of silicon oxide, silicon nitride, silicon nitride oxide, or silicon oxynitride by an LPCVD method, a plasma CVD method, or the like. This insulating film is selectively removed to expose surfaces of the semiconductor films 102, 103, and 105 to form the insulating film 106 to cover the semiconductor film 104, as shown in FIG. 21B. A step of forming the insulating film 106 can be performed in such a manner that a portion where the insulating film 106 is faulted is covered with resist and other portions are removed by etching.

Next, as shown in FIG. 21C, insulating films 109, 110, and 111 are respectively formed over the semiconductor films 102, 103, and 105. The insulating film 111 forms a first insulating film of the memory transistor Tm. Each of the insulating films 109 to 111 preferably has a thickness greater than or equal to 1 nm and less than or equal to 10 nm, more preferably greater than or equal to 1 nm and less than or equal to 5 nm.

The insulating films 109 to 111 can be formed by subjecting the semiconductor films 102, 103, and 105 to heat treatment, plasma treatment, or the like. The insulating films 109 to 111 can be faulted by a method similar to a step of manufacturing the first insulating film 11 in FIG. 2A. Here, the semiconductor films 102, 103, and 105 are subjected to oxidation treatment using high-density plasma excited by a microwave, then, nitridation treatment is performed, whereby the insulating films 109 to 111 are formed over the respective semiconductor films. A mixed gas of oxygen ($O_2$) and argon (Ar) is used for a process gas of the oxidation treatment, and a mixed gas of nitrogen ($N_2$) and argon (Ar) is used for a process gas of the nitridation treatment. First, the semiconductor films 102, 103, and 105 are oxidized by O* in high-density plasma; thus, a silicon oxide film with a thickness of approximately 2 to 5 nm is formed over the surfaces of the semiconductor films 102, 103, and 105. Then, a mixed gas of $N_2$ and Ar is excited by a microwave to produce N* in high-density plasma, whereby the upper surface of the silicon oxide film is nitrided by N*. By adjusting nitridation treatment time, a region with a thickness of approximately 2 nm including nitrogen of approximately 10 to 50 atomic % can be formed over the upper portion of the silicon oxide film.

Then, as shown in FIG. 22A, a silicon nitride film 122 is formed to cover the semiconductor films 102 to 105. The silicon nitride film 122 can be formed in a manner similar to the formation of the silicon nitride film 22 in FIG. 2B. For example, the silicon nitride film 122 is formed by a PECVD method, under the condition where a mixed gas of $NH_3$ and $SiH_4$ is used for a process gas, the flow ratio is set to $NH_3/SiH_4$=400/2, and a substrate temperature is set to 400° C. In the silicon nitride film 122, hydrogen of 15 atomic % or more is included.

Next, the upper portion of the silicon nitride film 122 is nitrided to form a silicon nitride film 112. FIG. 22B is a cross-sectional view illustrating a step of nitridation treatment of the silicon nitride film 122. In FIG. 22B, reference numeral 112B denotes an upper region which is nitrided, and reference numeral 112A denotes a lower region which is not nitrided. A step of the nitridation treatment can be performed in a manner similar to a step of nitridation treatment of the silicon nitride film 22 of FIG. 2C. For example, the step of the nitridation treatment can be performed by high-density plasma treatment which excites a mixed gas of $N_2$ and Ar by a microwave. The high-density plasma treatment can be performed under the condition of a frequency of a microwave of 2.45 GHz, a substrate temperature of 400° C., and a reaction pressure of 40 Pa. By the nitridation treatment, the silicon nitride film 112 including the upper region 112B having a hydrogen concentration lower than a hydrogen concentration of the lower region 112A is formed. When a charge trapping film formed of the silicon nitride film 112 is included, a charge retention characteristic of the memory transistor Tm can be improved.

Next, the silicon nitride film 112 which has been subjected to nitridation treatment is etched to form a charge trapping film over the semiconductor film 105 as shown in FIG. 22C. By this etching treatment, the insulating films 109 and 110 are removed to expose the semiconductor films 102 and 103.

Next, the insulating film 107 is formed over the substrate 100 as shown in FIG. 23A. The insulating film 107 forms a gate insulating film of the transistors Trp and Tm of the driver circuit portion 52 and forms a second insulating film of the memory transistor Tm. The insulating film 107 can be formed in a manner similar to the formation of the second insulating film 14 shown in FIG. 2D. For example, in the case where the insulating film 107 is formed of a single layer, a silicon oxynitride film is formed to a thickness of 5 nm to 50 nm by a CVD method. Alternatively, in the case where the insulating film 107 is formed to have a three-layer structure, a silicon oxynitride film is formed as a first layer, a silicon nitride film is formed as a second layer, and a silicon oxynitride film is formed as a third layer.

Next, a conductive film 130 is formed over the insulating film 107 as shown in FIG. 23B. The conductive film 130 forms gate electrodes of the transistors Trp, Trn, and Ts and the memory transistor Tm. The conductive film 130 can be formed in a manner similar to the formation of the conductive film 15 shown in FIG. 2D, and can be formed to have a single-layer structure or a multilayer structure including two or more layers. In the case of a two-layer structure, a tungsten nitride film, a molybdenum nitride film, or a titanium nitride film can be formed as a lower layer, and a tantalum film, a molybdenum film, or a titanium film can be formed as an upper layer. For example, the conductive film 130 can be formed of a stacked-layer film of a tantalum nitride film and a tungsten film.

Note that, when the memory transistor Tm is of an MNOS type, before the step for forming the conductive film 130, the insulating film 107 is removed by etching from a region in which the memory transistor Tm is formed.

Next, as shown in FIG. 24A, the conductive film 130 is etched to form the conductive films 131, 132, 133, and 134 which overlap with the semiconductor films 102, 103, 104, and 105.

Next, as shown in FIG. 24B, a dopant impurity element is added to the semiconductor films 102 to 105 using the conductive films 131, 132, 133, and 134 as masks to form high concentration impurity regions. First, a mask made of resist, which covers the semiconductor film 102, is formed. Gas which includes a donor impurity element in a composition is excited, and a donor impurity element is added to the semiconductor films 103 to 105 by an ion implantation method or an ion doping method. The donor impurity element is P or As, and $PH_3$ or $AsH_3$ can be used as a process gas. Through this step, n-type high concentration impurity regions 141, 142, 144, 145, 147, and 148 are formed in the semiconductor films 103 to 105, and channel formation regions 143, 146, and 149 are formed in regions overlapping with the conductive films 132 to 134.

Next, the mask covering the semiconductor film 102 is removed, and a mask which covers the semiconductor films 103 to 105 is formed using resist. Gas including an acceptor impurity element in a composition is excited, and the acceptor impurity element is added to the semiconductor film 102 by an ion implantation method or an ion doping method. The acceptor impurity element is B, and $B_2H_5$, $BF_3$, $(CH_3)_3B$ (trimethylboron), or the like can be used for a process gas. Through this step, p-type high concentration impurity regions 137 and 138 are formed in the semiconductor film 102, and channel formation region 139 is formed in a region overlapping with the conductive film 131.

Note that an acceptor impurity element may be added to the semiconductor film 102, then, a donor impurity element may be added to the semiconductor films 103 to 105.

FIGS. 26A to 26C are top views corresponding to FIG. 24B. The conductive films 133 and 134 which are shown in FIG. 26C are respectively the second word line WL and the first word line WL in FIG. 14.

The mask covering the semiconductor films 103 to 105 is removed. Next, an insulating film 155 which covers the conductive films 131 to 134 is formed as shown in FIG. 19. Openings are formed in the insulating films 155, 107, and 106 and the silicon nitride film 112 to expose part of the high concentration impurity regions 137, 138, 141, 142, 144, 145, 147, and 148. Conductive films 161 to 167, which are electrically connected to the high concentration impurity regions formed in the semiconductor films 102 to 105, are framed over the insulating film 155. FIGS. 20A to 20C are top views of the above-described state. The conductive films 165 and 167 are respectively the source line SL and the bit line BL in FIG. 14. The conductive film 166 is an electrode which electrically connects the memory transistor Tm and the transistor Ts.

The insulating film 155 can be formed to have a single-layer structure or a stacked-layer structure. As an insulating film which forms the insulating film 155, an inorganic insulating film of silicon oxide, silicon nitride, silicon nitride oxide, silicon oxynitride, DLC (diamond-like carbon), or the like can be formed by a CVD method, a sputtering method, or the like. Further, a film formed from an organic material such as epoxy, polyimide, polyamide, polyvinyl phenol, benzocyclobutene, or acrylic; or a film formed from a siloxane material such as a siloxane resin can be formed.

The conductive films 161 to 167 can each be formed to have either a single-layer structure or a stacked-layer structure. The conductive films 161 to 167 can each be formed from, by a CVD method, a sputtering method, or the like, a conductive material such as a single metal element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), or neodymium (Nd); or an alloy material or a compound material containing any of these elements as its main component. For example, as an alloy material which contains aluminum as its main component, an alloy of aluminum and nickel; an aluminum alloy containing nickel, and one or both of carbon and silicon; and the like are given. Since aluminum or aluminum silicon has a low resistance value and is inexpensive, aluminum or aluminum silicon is suitable for the material for forming the conductive film 164.

For example, in the case where the conductive films 161 to 167 are each formed of a conductive film having a three-layer structure, a stacked-layer film including a barrier layer, an aluminum silicon (Al—Si) layer, and a barrier layer; a stacked-layer film including a barrier layer, an aluminum silicon (Al—Si) layer, and a barrier layer; or the like can be used. Note that the barrier layer is formed using a thin film formed of titanium, a nitride of titanium, molybdenum, or a nitride of molybdenum. When barrier layers are provided in the top layer and the bottom layer, generation of hillocks of aluminum or aluminum silicon can be prevented. Further, when the barrier layer is formed from titanium that is a highly-reducible element, even when a thin natural oxide film is formed over the crystalline semiconductor layer, the natural oxide film is reduced so that good contact with the crystalline semiconductor layer can be obtained.

Through the above-described steps, a nonvolatile semiconductor device in which the memory cell array 51 and the driver circuit portion 52 are integrated over the same substrate 100 can be formed.

Embodiment Mode 6

In Embodiment Mode 5, a manufacturing method is described, in which the insulating layer which serves as the second insulating film of the nonvolatile memory element formed in the memory cell MC and the gate insulating film of the thin film transistor formed in the driver circuit portion are concurrently fixated; however, a method for manufacturing a nonvolatile semiconductor memory device is not limited thereto. For example, a nonvolatile semiconductor memory device can be formed as shown in FIG. 27.

First, by a manufacturing method described in Embodiment Mode 5, steps up to steps shown in FIG. 23A are performed. Subsequently, the insulating film 107 is etched, so that a portion overlapping with the silicon nitride film 112 is left and other portions are removed, as shown in FIG. 27A.

Surfaces of the semiconductor film 102 and the semiconductor film 103 are oxidized by oxidation treatment using high-density plasma to form insulating films 172 and 173 as shown in FIG. 27B. The high-density plasma treatment can be performed in a manner similar to the formation of the first insulating film 11 in FIG. 2A.

The step subsequent to FIG. 23B is performed in a manner similar to Embodiment Mode 5; thus, a nonvolatile semiconductor memory device having the transistor Trp, the transistor Trn, the memory transistor Tm, and the switching transistor Ts is manufactured as shown in FIG. 27C. The nonvolatile semiconductor memory device of this embodiment mode has the same structure as the nonvolatile semiconductor memory device of Embodiment Mode 5 (see FIG. 19 and FIGS. 20A to 20C) except for a structure in which gate insulating films of the transistor Trp and the transistor Trn are respectively formed of the insulating film 172 and the insulating film 173, and a gate insulating film of the transistor Ts is formed of the insulating film 106.

Embodiment Mode 7

This embodiment mode describes a nonvolatile semiconductor memory device as a semiconductor device. Further, this embodiment mode describes a method for manufacturing a nonvolatile semiconductor memory device. The nonvolatile semiconductor memory device of this embodiment mode has the same circuit as the nonvolatile semiconductor memory device 50 shown in FIG. 13, and a memory cell array thereof has a circuit structure shown in FIG. 14.

Furthermore, this embodiment mode also describes a method for manufacturing transistors having gate insulating films with different thicknesses over one substrate, in a manner similar to Embodiment Mode 5. In addition, this embodiment mode describes a method for manufacturing a transistor and a nonvolatile memory transistor using thin film transistors.

Figure 28:
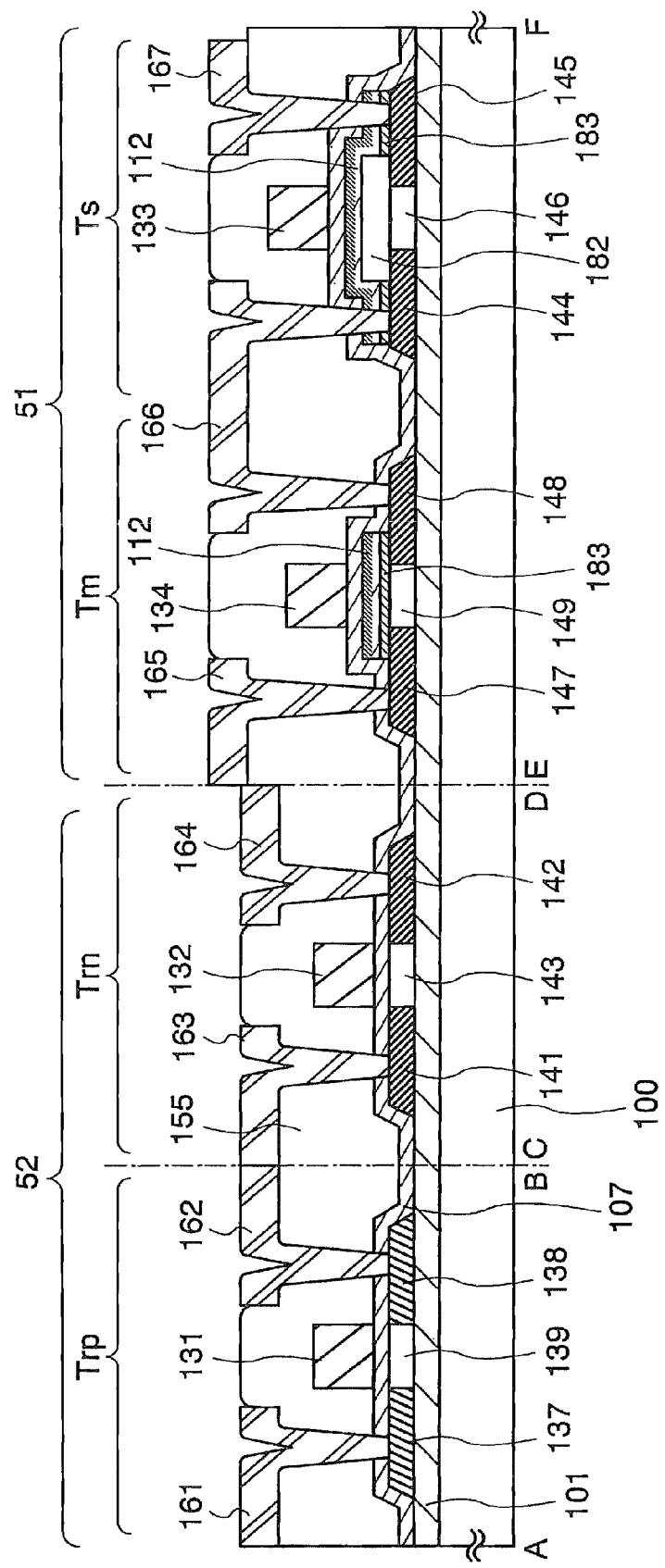
FIG. 28 is a cross-sectional view of a semiconductor device.

FIG. 28 is a cross-sectional view of a nonvolatile semiconductor memory device of this embodiment mode, and FIG. 20 is a top view of the nonvolatile semiconductor memory device. In FIG. 28, a cross-sectional view of a p-channel transistor Trp provided in the driver circuit portion 52 is shown in A-B, a cross-sectional view of an n-channel transistor Trn provided in the driver circuit portion 52 is shown in C-D, and a cross-sectional view of a nonvolatile memory transistor Tm and a switching transistor Ts of a memory cell MC is shown in E-F. A cross-sectional view taken along long dashed short dashed line A-B in FIG. 20A, a cross-sectional view taken along long dashed short dashed line C-D in FIG. 20B, and a cross-sectional view taken along long dashed short dashed line E-F in FIG. 20C are shown in FIG. 19. FIG. 20 is a top view of two adjacent memory cells MC.

As shown in FIG. 28, the transistor Trp, the transistor Trn, the memory transistor Tm, and the switching transistor Ts are formed over one substrate, which is a substrate 100. A semiconductor film of each transistor is formed over a base insulating film 101 over the substrate 100.

P-type high concentration impurity regions 137 and 138 and a channel formation region 139 are formed in a semiconductor film of the transistor Trp, and n-type high concentration impurity regions 141 and 142 and a channel formation region 143 are formed in a semiconductor film of the transistor Tm. The transistor Ts and the memory transistor Tm are n-channel transistors. N-type high concentration impurity regions 144 and 145 and a channel formation region 146 are formed in a semiconductor film of the transistor Ts, and the n-type high concentration impurity regions 147 and 148 and a channel formation region 149 are formed in a semiconductor film of the memory transistor Tm.

A gate insulating film of the transistor Trp and the transistor Trn is formed of an insulating film 107. A gate insulating film of the transistor Ts is formed of a stacked-layer film of an insulating film 182, a silicon nitride film 112, and an insulating film 107 to be thicker than the transistors Trp and Trn. The transistors Trp, Trn, and Ts respectively include conductive films 131, 132, and 133 which overlap with channel formation regions 139, 143, and 146 with the gate insulating film interposed therebetween. These conductive films 131, 132, and 133 form gate electrodes of the transistors Trp, Tm, and Ts, respectively. The conductive film 133 forms a second word line WL of FIG. 14.

The memory transistor Tm is a MONOS-type memory element. The memory transistor Tm includes, over the semiconductor film, a first insulating film formed of an insulating film 183, a charge trapping film formed of the silicon nitride film 112, a second insulating film formed of the insulating film 107, and a conductive film 134. The upper portion and the lower portion of the silicon nitride film 112 are different from each other in a hydrogen concentration. The conductive film 134 forms a gate electrode of the memory transistor Tm and forms a first word line WL of FIG. 14.

Conductive films 161 and 162 form source or drain electrodes of the transistor Trp, and conductive films 163 and 164 form source or drain electrodes of the transistor Tm. A conductive film 165 forms a source line SL in FIG. 14, and a conductive film 167 forms a bit line BL in FIG. 14. A conductive film 166 is an electrode which electrically connects the memory transistor Tm and the transistor Ts.

Hereinafter, a method for manufacturing a semiconductor device of this embodiment mode is described with reference to cross-sectional views shown in FIGS. 29A to 29C, FIGS. 30A to 30C, and FIGS. 31A and 31B, and top views shown in FIGS. 20A to 20C, FIGS. 25A to 25C, and FIGS. 26A to 26C. Note that in a manufacturing method of this embodiment mode, the description of Embodiment Mode 5 is used for the detailed description on the components denoted by the same reference numerals as in FIG. 19, FIGS. 20A to 20C, FIGS. 21A to 21C, FIGS. 22A to 22C, FIGS. 23A and 23B, FIGS. 24A and 24B, FIGS. 25A to 25C, and FIGS. 26A to 26C, because Embodiment Mode 5 can be applied to a structure and a manufacturing method thereof.

First, as shown in FIG. 29A, a semiconductor film 180 is formed over the base insulating film 101, and the insulating film 182 is formed over the semiconductor film 180. The insulating film 182 can be formed in a manner similar to the formation of the insulating film 106 in FIG. 21B.

Next, the insulating film 182 is etched so that a portion overlapping with a semiconductor region of the transistor Ts is left as shown in FIG. 29B. The insulating film 182 is formed in a portion overlapping with a channel formation region of the transistor Ts. Next, a portion where the semiconductor film 180 is exposed is subjected to oxidation treatment, nitridation treatment, or treatment combining oxidation treatment with nitridation treatment to form the insulating film 183 with a thickness greater than or equal to 1 nm and less than or equal to 10 nm, over a surface of the semiconductor film 180, as shown in FIG. 29B. The formation of the insulating film 183 can be performed in a manner similar to the formation of the insulating films 109 to 111 in FIG. 21C. For example, the insulating film 183 can be formed by subjecting the semiconductor film 180 to high-density plasma treatment.

Next, as shown in FIG. 29C, a silicon nitride film 122 is formed to cover the insulating films 182 and 183. The upper portion of the silicon nitride film 122 is nitrided to form a silicon nitride film 112 having a lower portion 112A and an upper region 112B as shown in FIG. 30A.

Next, a mask made of resist is formed, and the insulating film 183 and the silicon nitride film 112 are etched as shown in FIG. 30B. In the transistor Ts, a stacked-layer film of the insulating film 182, the insulating film 183, and the silicon nitride film 112 is formed. In the transistor Ts, the edge portion of the silicon nitride film 112 is almost in line with the edge portion of the insulating film 183, and the edge portion of the insulating film 182 is inside the edge portion of the silicon nitride film 112 and the insulating film 183. In the memory transistor Tm, a first insulating film farmed of the insulating film 183 and a charge trapping film formed of the silicon nitride film 112 are formed. The edge portion of the silicon nitride film 112 is almost in line with the edge portion of the insulating film 183 in the memory transistor Tm.

Next, the semiconductor film 180 is etched to have an island shape, so that semiconductor films 102 to 105 are fanned as shown in FIG. 30C. FIG. 25A is a top view of the semiconductor film 102, FIG. 25B is a top view of the semiconductor film 103, and FIG. 25C is a top view of the semiconductor films 104 and 105. The semiconductor films 102, 103, 104, and 105 respectively form semiconductor regions of the transistor Trp, the transistor Trn, the transistor Ts, and the memory transistor Tm.

Next, as shown in FIG. 31A, an insulating film 107 which covers the semiconductor films 102 to 105 is formed. Next, conductive films 131, 132, 133, and 134 are respectively formed above the semiconductor films 102, 103, 104, and 105.

Note that, when the memory transistor Tm is of an MNOS type, before a step in which the conductive films 134, 136, 138, and 140 are formed, the insulating film 107 is removed by etching from the region in which the memory transistor Tm is formed.

Subsequently, a step similar to that of FIG. 24B in Embodiment Mode 5 is performed to form a p-type high concentration impurity region in the semiconductor film 102 and n-type high concentration impurity regions in the semiconductor films 103, 104, and 105, with the conductive films 131, 132, 133, and 134 used as masks. N-type high concentration impurity regions 141, 142, 144, 145, 147, and 148 are formed in the semiconductor films 103 to 105, and channel formation regions 143, 146, and 149 are formed in regions overlapping with the conductive films 132 to 134. P-type high concentration impurity regions 137 and 138 are faulted in the semiconductor film 102, and a channel formation region 139 is formed in a region overlapping with the conductive film 131. Note that FIGS. 26A to 26C are top views corresponding to FIG. 31B.

Next, in a manner similar to FIG. 19, an insulating film 155 is formed and conductive films 161 to 167, which are electrically connected to high concentration impurity regions formed in the semiconductor films 102 to 105, are formed over the insulating film. FIG. 28 is a cross-sectional view and FIG. 20 is a top view of the above-described state.

Through the above-described process, a nonvolatile semiconductor memory device in which the memory cell array 51 and the driver circuit portion 52 are integrated over one substrate, which is the substrate 100, is formed.

Embodiment Mode 8

This embodiment mode describes a nonvolatile semiconductor memory device using a semiconductor substrate and a method for manufacturing the nonvolatile semiconductor memory device using a semiconductor substrate. The structure and the manufacturing method are described, provided that the nonvolatile semiconductor memory device has the same circuit as the nonvolatile semiconductor memory device 50 shown in FIG. 13, and a memory cell array 51 thereof has the NAND cell in FIG. 16.

Further, this embodiment mode also describes a method for manufacturing transistors in which gate insulating films with different thicknesses are formed over the same substrate. In this embodiment mode, a bulk semiconductor substrate is used for a substrate and a semiconductor region of a semiconductor element is formed in a semiconductor substrate.

Figure 32:
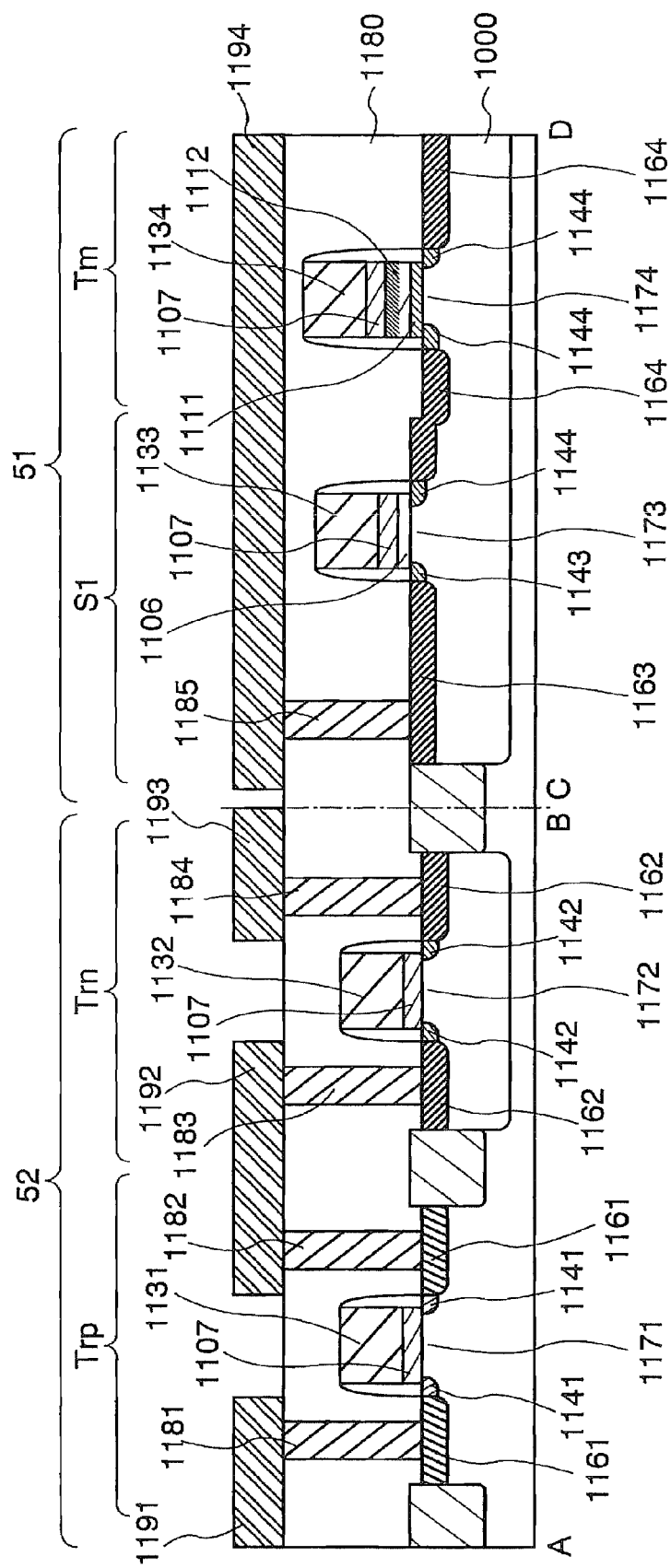
FIG. 32 is a cross-sectional view of a semiconductor device.
Figure 33A:
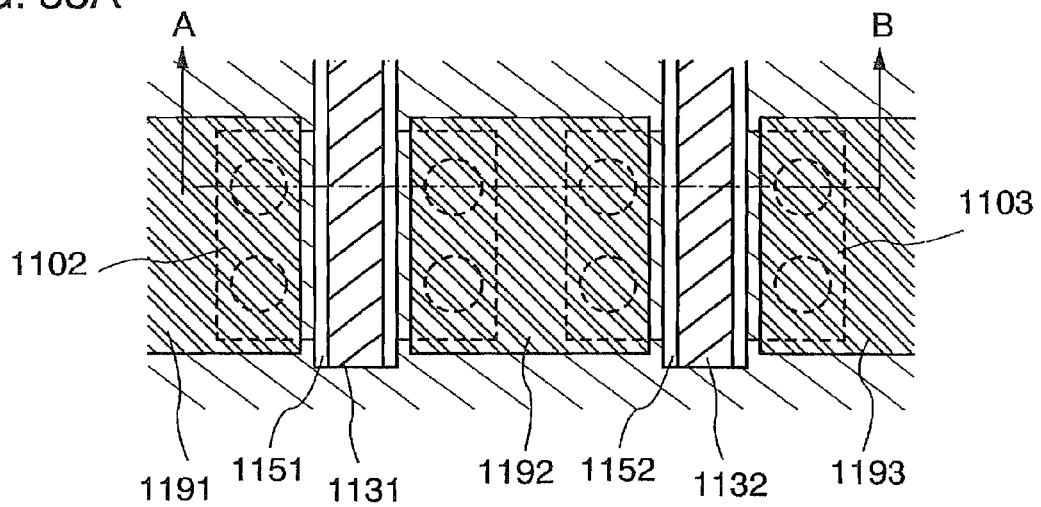
FIGS. 33A and 33B are top views of the semiconductor device of FIG. 32.
Figure 33B:
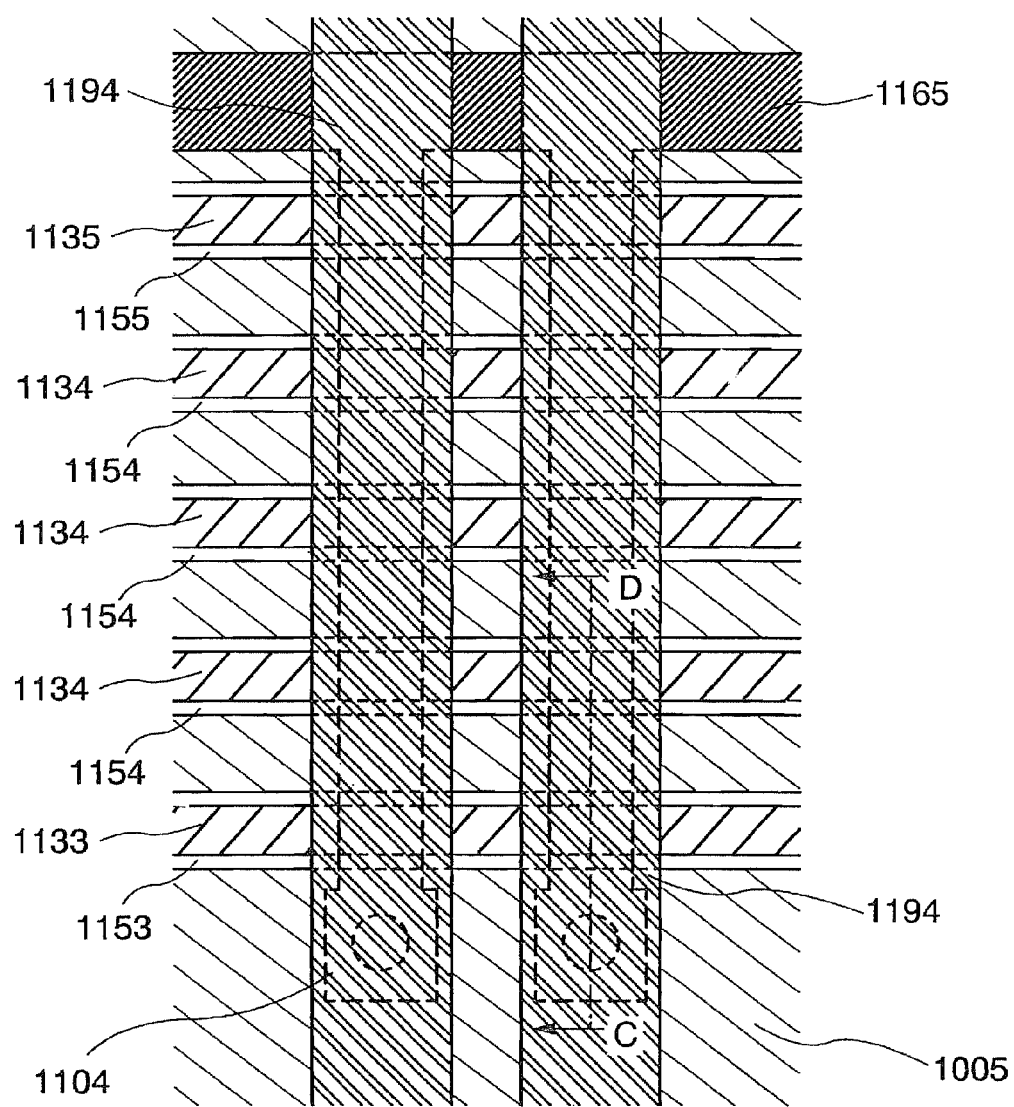

FIG. 32 is a cross-sectional view of a nonvolatile semiconductor memory device of this embodiment mode, and FIGS. 33A and 33B are top views thereof. A cross-sectional view of a CMOS inverter circuit including a p-channel transistor Trp and an n-channel transistor Trn is shown in A-B in FIG. 32 as a typical example of a circuit provided in a driver circuit portion 52. A cross-sectional view of a first selection transistor S1 and a nonvolatile memory transistor Tm of a memory cell MC, as main elements of the memory cell array 51, is shown in C-D in FIG. 32.

FIG. 33A is a top view of an inverter circuit, and a cross-sectional view taken along line A-B in FIG. 33A is shown in A-B in FIG. 32. FIG. 33B is a top view of the memory cell array 51, and a cross-sectional view taken along line C-D in FIG. 33B is shown in C-D in FIG. 32. FIG. 33B is a top view of a memory cell MC including a NAND cell, in which three memory transistors Tm are connected in series, and the first selection transistor S1 (hereinafter, referred to as a "transistor S1") and a second selection transistor S2 (hereinafter, referred to as a "transistor S2") which are connected to the NAND cell. Further, FIG. 33B shows two columns of memory cells MCs.

As shown in FIG. 32, a semiconductor substrate 1000 is provided with the transistor Trp, the transistor Trn, the transistor S1, and the memory transistor Tm. A semiconductor region of each transistor is formed in the semiconductor substrate 1000. In the semiconductor region of the transistor Trp, a channel formation region 1171, p-type high concentration impurity regions 1161 which form source or drain regions, and p-type extension regions 1141 which are extension portions of the source or drain regions are formed. In a semiconductor region of the transistor Trn, a channel formation region 1172, n-type high concentration impurity regions 1162 which form source or drain regions, and n-type low concentration impurity regions 1142 are formed.

The transistor S1 and the memory transistor Tm are n-channel transistors. In the semiconductor region of the transistor S1, a channel formation region 1173, n-type high concentration impurity regions 1163 and 1164 which form source or drain regions, and n-type low concentration impurity regions 1143 and 1144 are formed. In the semiconductor region of the memory transistor Tm, a channel formation region 1174, n-type high concentration impurity regions 1164 which form source or drain regions, and n-type low concentration impurity regions 1144 are formed.

Gate insulating films of the transistor Trp and the transistor Trn are formed of insulating films 1107. A gate insulating film of the transistor S1 is formed of an insulating film 1106 and an insulating film 1107, and is formed to be thicker than that of the transistors Trp and Trn.

As shown in FIG. 33A, conductive films 1191 and 1193 are electrically connected to a source region of the transistor Trp and a source region of the transistor Trn, respectively. A drain region of the transistor Trp and a drain region of the transistor Trn are electrically connected to each other by the conductive film 1192, so that a CMOS inverter circuit is formed. In addition, the conductive films 1131 and 1132 serve as a gate electrode of the transistor Trp and a gate electrode of the transistor Trn, respectively. Note that plug electrodes 1181 to 1184 in FIG. 32 are electrodes for electrically connecting the conductive films 1191, 1192, and 1193 to the source or drain regions of the transistors Trp and Trn.

The memory transistor Tm is a MONOS-type memory element. The memory transistor Tm includes, over the channel formation region 1174, a first insulating film formed of an insulating film 1111, a charge trapping film formed of a silicon nitride film 1112, a second insulating film formed of an insulating film 1107, and a conductive film 1134. The upper portion and the lower portion of the silicon nitride film 1112 are different from each other in a hydrogen concentration. The conductive film 1134 fauns a gate electrode of the memory transistor Tm and forms a first word line WL in FIG. 16.

The transistor S1 and the memory transistor Tm are connected in series by the high concentration impurity region 1164. A conductive film 1194 which is electrically connected to the transistor S1 forms a source line SL in FIG. 16. The conductive film 1194 is connected to the high concentration impurity region 1163 by a plug electrode 1185. The conductive film 1133 forms a gate electrode of the transistor S1 and forms a first selection gate line SG1 in FIG. 16.

Note that a second selection transistor S2 (hereinafter, referred to as a "transistor S2") is an n-channel transistor, and has the same structure as the transistor S1. The transistor S2 and the memory transistor Tm are connected in series by the high concentration impurity regions 1164. A gate electrode of the transistor S2 is formed of a conductive film 1135 shown in FIG. 33B. The conductive film 1135 forms a second selection gate line SG1 in FIG. 16. An n-type high concentration impurity region 1165 in FIG. 33B fauns a bit line BL in FIG. 16 and fauns source or drain regions of the transistor S2. Accordingly, the transistor S2 is electrically connected to the bit line BL.

A manufacturing step in this embodiment mode is described with reference to FIG. 32, FIGS. 34A to 34C, FIGS. 35A to 35C, FIGS. 36A to 36C, FIGS. 37A to 37C, and FIGS. 38A and 38B as cross-sectional views; and FIGS. 33A and 33B, FIGS. 39A and 39B, and FIGS. 40A and 40B as top views.

First, as shown in FIG. 34A, the semiconductor substrate 1000 is prepared. Here, a single-crystalline silicon wafer having n-type conductivity is used as the semiconductor substrate 1000. An insulating film 1001 is formed over the semiconductor substrate 1000. As a method for forming the insulating film 1001, a method in which the upper surface of the semiconductor substrate 1000 is oxidized by thermal oxidation treatment to form silicon oxide can be used. A silicon nitride film 1002 is formed over the insulating film 1001 by a CVD method. The silicon nitride film 1002 can be formed in such a way that the insulating film 1001 is nitrided by high-density plasma treatment after the insulating film 1001 is formed.

Next, a mask made of resist is formed over the silicon nitride film 1002, and the silicon nitride film 1002, the insulating film 1001, and the semiconductor substrate 1000 are etched using the mask. By the etching, a depression 1004 is formed in the semiconductor substrate 1000 as shown in FIG. 34B. This etching can be performed by dry etching using plasma.

After removing the mask made of resist, an insulating film 1005 which fills the depression 1004 formed in the semiconductor substrate 1000 is formed as shown in FIG. 34C. The insulating film 1005 is formed of a film using an insulating material such as silicon oxide, silicon nitride, silicon nitride that contains oxygen, or silicon oxide that contains nitrogen by a CVD method, a sputtering method, or the like. Here, as the insulating film 1005, silicon oxide is formed using a TEOS (tetraethylorthosilicate) gas by an atmospheric-pressure CVD method or a reduced-pressure CVD method.

Figure 39A:
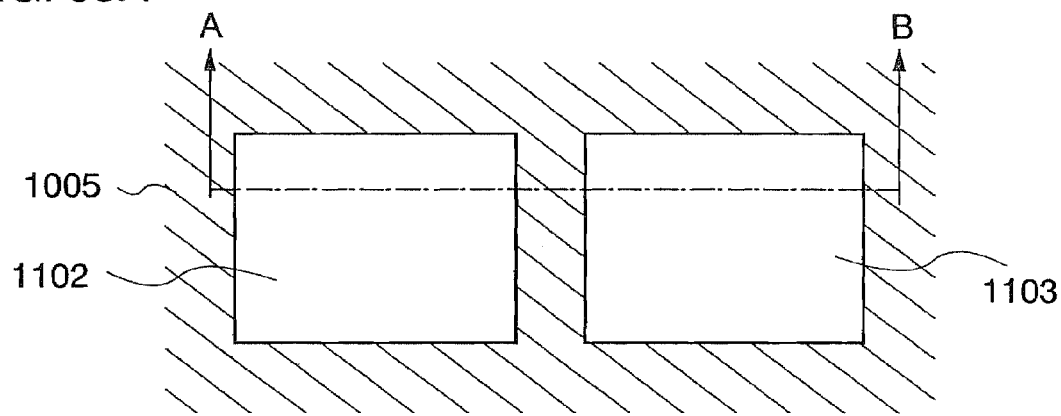
FIGS. 39A and 39B are top views of FIG. 35A.
Figure 39B:
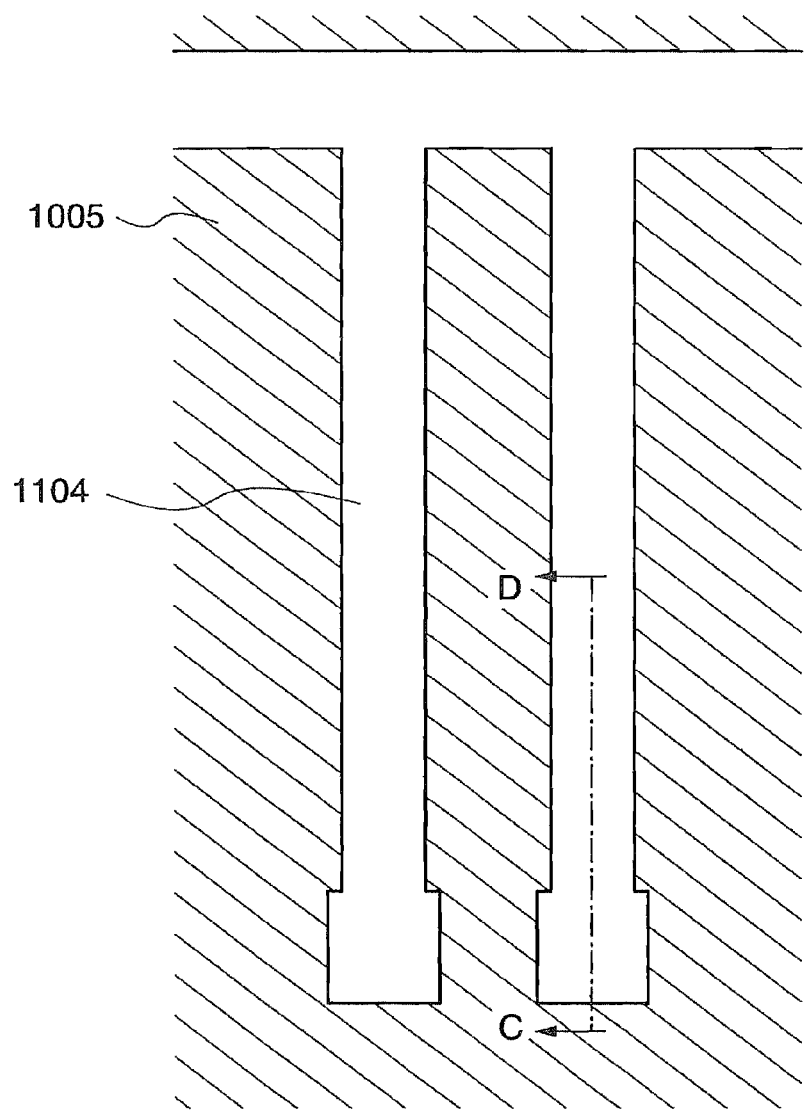

Next, a grinding process, a polishing process, or chemical mechanical polishing (CMP) process is performed so that the insulating film 1005, the silicon nitride film 1002, and the insulating film 1001 are removed as shown in FIG. 35A, whereby the surface of the semiconductor substrate 1000 is exposed. By this treatment, semiconductor regions 1102, 1103, and 1104 are provided between the insulating films 1005 left in the depression 1004 of the semiconductor substrate 1000. Next, the semiconductor substrate 1000 is selectively doped with an acceptor impurity element to form a p-well 1101. FIG. 39A is a top view in A-B in FIG. 35A, and FIG. 39B is a top view in C-D in FIG. 35A.

Note that in this embodiment mode, a semiconductor substrate having n-type conductivity is used as the semiconductor substrate 1000; therefore, an impurity element is not introduced into the semiconductor region 1102. Alternatively, a donor impurity element can be introduced so that an n-well can be formed in the semiconductor region 1102. Note that in the case where a p-type semiconductor substrate is used, an n-well is formed so that the semiconductor region 1102 is formed. In this case, a p-well may be formed or not be formed in the semiconductor regions 1103 and 1104.

Next, as shown in FIG. 35B, an insulating film 1106 is formed over a surface of the semiconductor substrate 1000. The insulating film 1106 can be formed in a manner similar to the formation of the insulating film 106 of Embodiment Mode 5. Here, as the insulating film 1106, silicon oxynitride is formed by a CVD method. Note that the insulating film 1106 formed over the semiconductor region 1104 forms a gate insulating film of the transistor S1 and the transistor S2.

Next, a mask made of resist is formed, and the insulating film 1106 is etched using this mask to remove the insulating film 1106 formed over the semiconductor regions 1102 and 1103 and to remove the insulating film 1106 from a region of the semiconductor region 1104 where the memory transistor Tm is formed, as shown in FIG. 35C.

After the mask made of resist is removed, a surface of the semiconductor substrate 1000 is subjected to nitridation treatment or oxidation treatment, or both nitridation treatment and oxidation treatment. Thus, as shown in FIG. 35C, an insulating film 1109 is formed over a surface of the semiconductor region 1102, an insulating film 1110 is formed over a surface of the semiconductor region 1103, and an insulating film 1111 is formed over a surface of the semiconductor region 1104. The insulating films 1109 to 1111 can be formed in a manner similar to the formation of the insulating films 109 to 111 in FIG. 21C, and for example, the insulating films 1109 to 1111 can be formed by high-density plasma treatment.

Figures 36A, 36B, 36C:
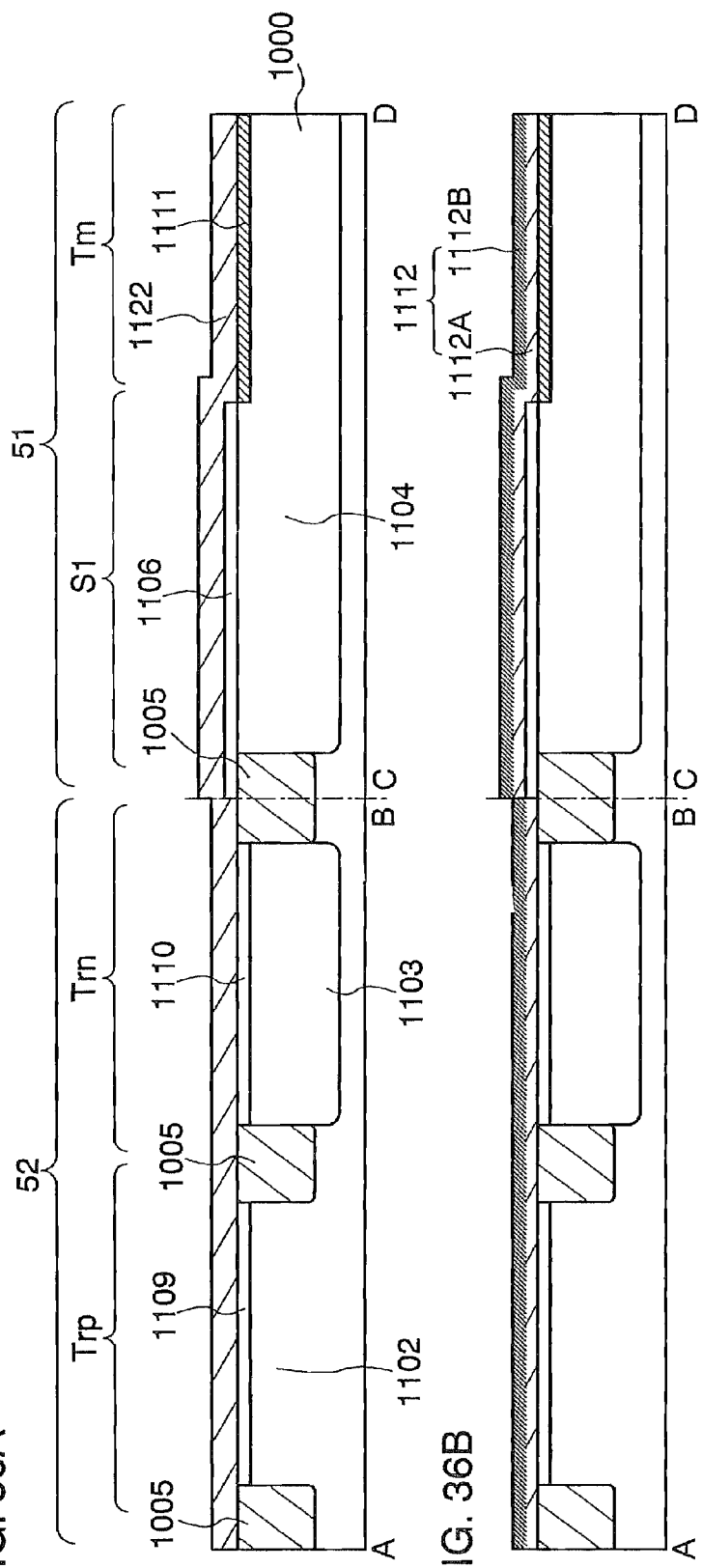
FIGS. 36A to 36C are cross-sectional views showing a method for manufacturing a semiconductor device, which are continued from FIG. 35C.

Next, as shown in FIG. 36A, a silicon nitride film 1122 is formed to cover the insulating film 1106 and the insulating films 1109 to 1111. The silicon nitride film 1122 can be formed in a manner similar to the formation of the silicon nitride film 22 in FIG. 2B. Next, the upper portion of the silicon nitride film 1122 is nitrided to form the silicon nitride film 1112 including a lower region 1112A and an upper region 1112B as shown in FIG. 36B. A step of the nitridation treatment can be performed in a manner similar to a step of performing the nitridation treatment on the upper portion of the silicon nitride film 22 in FIG. 2C.

Next, a mask made of resist is formed to etch the silicon nitride film 1112 and the insulating films 1109 and 1110 using the mask, as shown in FIG. 36C. By the etching, the silicon nitride film 1112 and the insulating film 1109 are removed from the semiconductor region 1102, and the silicon nitride film 1112 and the insulating film 1110 are removed from the semiconductor region 1103. Further, in the semiconductor region 1104, the silicon nitride film 1112 is removed from a region where the transistors S1 and S2 are formed, and a stacked-layer film of the insulating film 1111 and the silicon nitride film 1112 is formed in a region where the memory transistor Tm is formed.

Figures 37A, 37B, 37C:
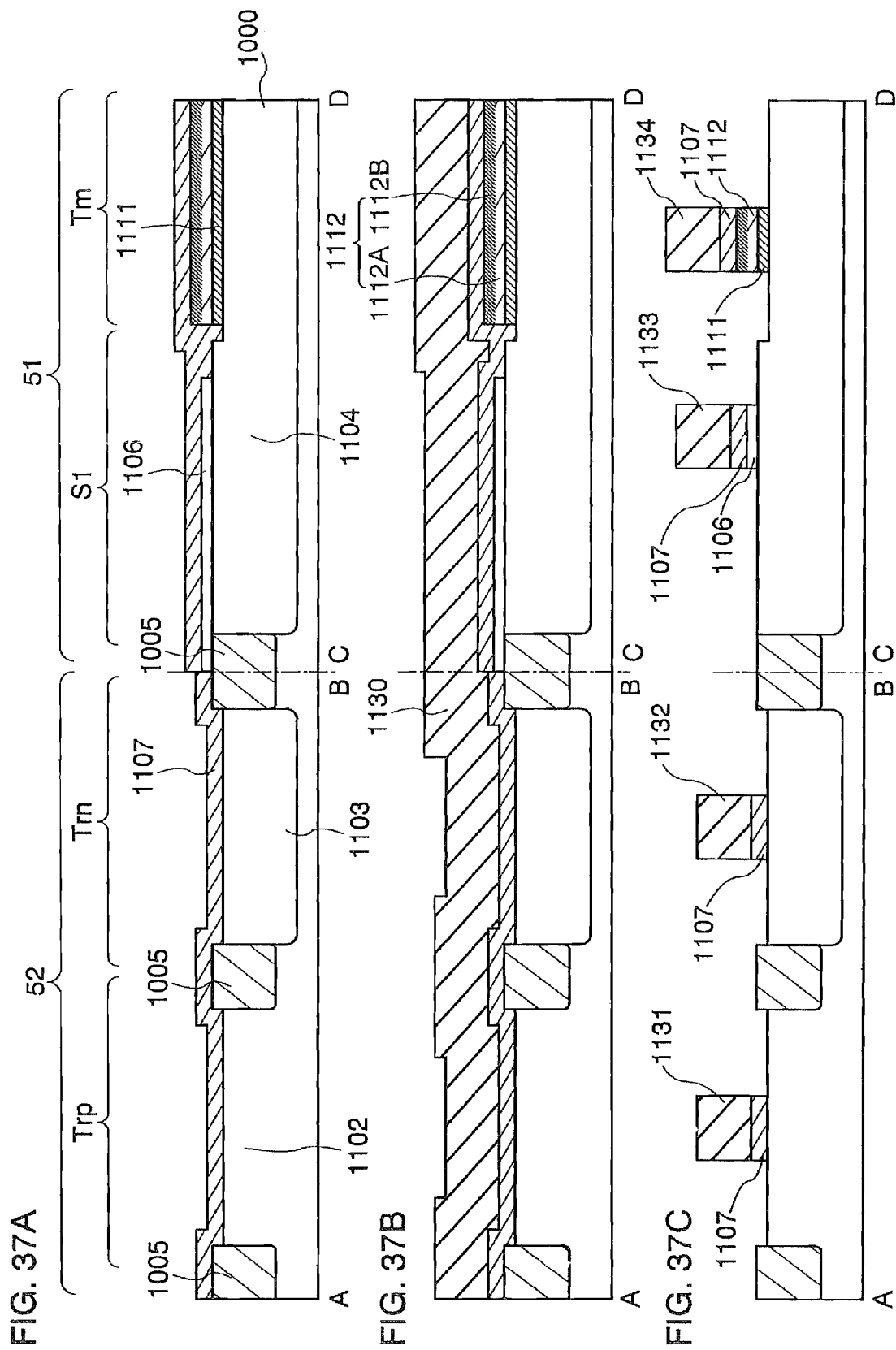
FIGS. 37A to 37C are cross-sectional views showing a method for manufacturing a semiconductor device, which are continued from FIG. 36C.

After the mask made of resist is removed, an insulating film 1107 which covers the semiconductor regions 1102 to 1104 is formed as shown in FIG. 37A. The insulating film 1107 may be formed of a single-layer film or a stacked-layer film. The insulating film 1107 can be formed in a manner similar to the formation of the second insulating film 14 in FIG. 2D.

Next, a conductive film 1130 is formed over the insulating film 1107 as shown in FIG. 37B. The conductive film 1130 can be formed in a manner similar to the formation of the conductive film 130 in FIG. 23B. Here, the conductive film 1130 is formed of a stacked-layer film of a tantalum nitride film and tungsten.

Figure 40A:
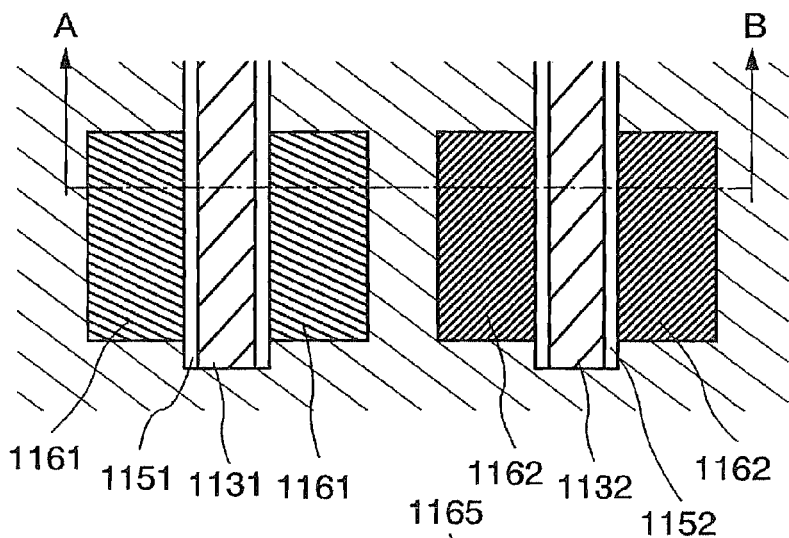
FIGS. 40A and 40B are top views of FIG. 38B.
Figure 40B:
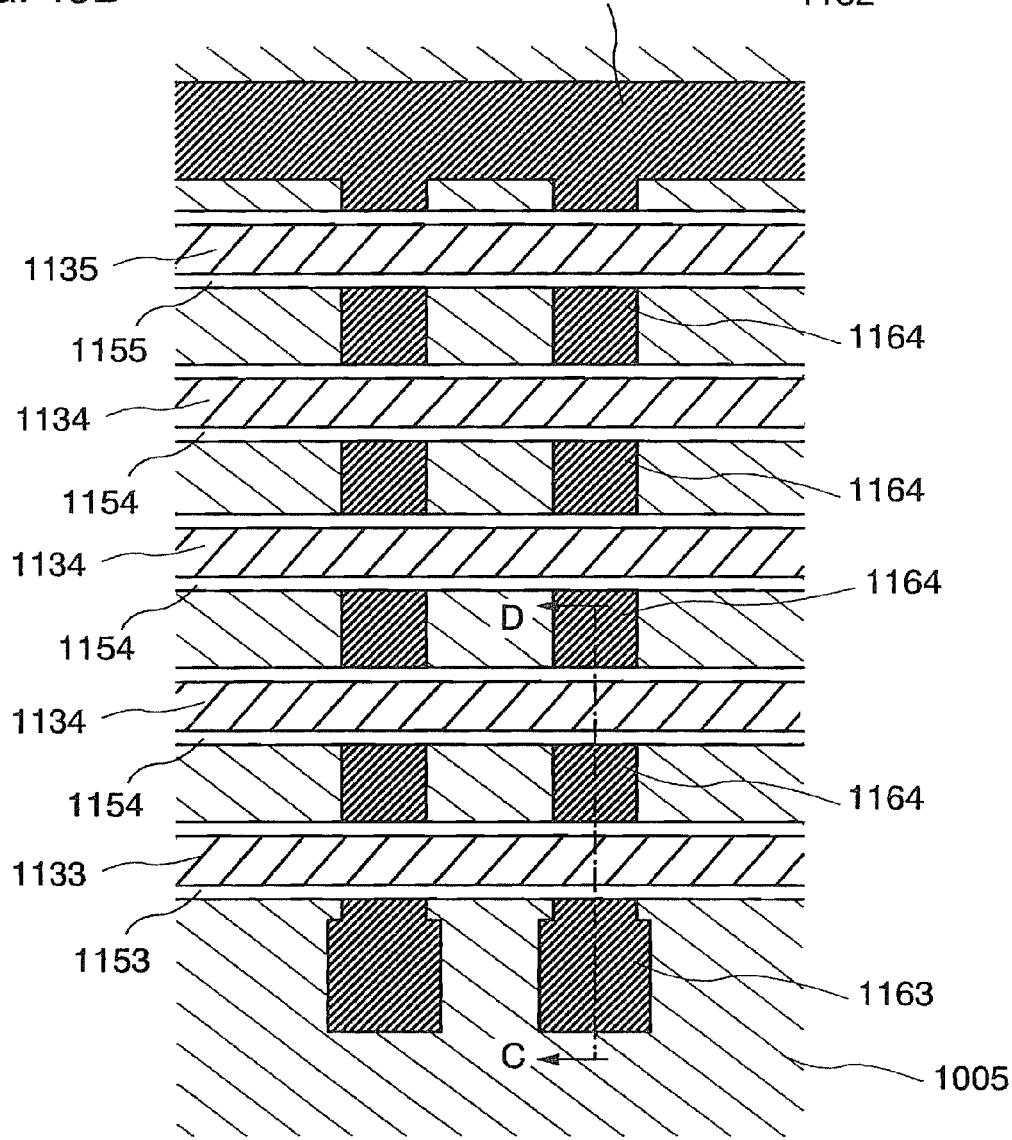

Next, the conductive film 1130 is etched to form conductive films 1131 to 1135 as shown in FIG. 37B (see FIG. 37B and FIGS. 40A and 40B). The insulating film 1107, the insulating film 1106, the silicon nitride film 1112, and the insulating film 1111 are etched using the conductive films 1131 to 1135 as masks to expose a portion of the semiconductor regions 1102 to 1104 which does not overlap with the conductive films 1131 to 1135.

Next, a donor impurity element or an acceptor impurity element is selectively introduced into each semiconductor region 1102, 1103, and 1104 to form impurity regions as shown in FIG. 38A. A donor impurity is added to the semiconductor regions 1103 and 1104 using the conductive films 1132 to 1135 as masks to form n-type high concentration impurity region 1142 to 1144. In a step of adding a donor impurity element, the semiconductor region 1102 is covered with a mask made of resist. An acceptor impurity is added to the semiconductor region 1102 using the conductive film 1131 as a mask to form a p-type extension region 1141. In a step of adding an acceptor impurity element, the semiconductor regions 1103 and 1104 are covered with a mask made of resist.

Next, spacers 1151 to 1155 are formed, which are in contact with side faces of the conductive films 1131 to 1135 and formed of an insulating film (see FIG. 38B and FIGS. 40A and 40B). The spacers 1151 to 1155 formed of an insulating film are also referred to as sidewalls. The spacers 1151 to 1155 are formed in the following manner. An insulating film having a single-layer structure or a multilayer structure including two or more layers is formed from an inorganic material such as silicon oxide, silicon oxynitride, or silicon nitride oxide; or an organic material such as an organic resin by a PECVD method, a sputtering method, or the like. The insulating film is subjected to anisotropic etching mainly in a perpendicular direction. Thus, the spacers 1151 to 1155 are formed in contact with the side faces of the conductive films 1131 to 1135.

Next, a donor impurity element or an acceptor impurity element is selectively added to the semiconductor regions 1102 to 1104 using the spacers 1151 to 1155 and the conductive films 1131 to 1135 as masks to form high concentration impurity regions serving as source or drain regions (see FIG. 38B and FIGS. 40A and 40B). Note that FIG. 40A is a top view in A-B of FIG. 38A, and FIG. 40B is a top view in C-D of FIG. 38B.

An acceptor impurity is added to the semiconductor region 1102 to form a p-type high concentration impurity region 1161. A donor impurity is added to the semiconductor regions 1103 and 1104 to form n-type high concentration impurity regions 1162 to 1165. In a step of adding an acceptor impurity element, the semiconductor regions 1103 and 1104 are covered with a mask made of resist, and in a step of adding a donor impurity element, the semiconductor region 1102 is covered with a mask made of resist. Through this step, in the semiconductor regions 1102 to 1104 which overlap with the conductive films 1131 to 1134, channel formation regions 1171 to 1174 are formed. Further, in a region of the semiconductor region 1104 which overlaps with the conductive film 1135, a channel formation region of the transistor S2 is formed.

Note that when a step of forming a spacer (a sidewall) and a step of adding a dopant impurity element are performed in Embodiment Modes 5 to 7 in a manner similar to this embodiment mode, low concentration impurity regions can be formed in the transistors Trn and Ts, and the memory transistor Tm.

Next, as shown in FIG. 32, an insulating film 1180 which covers the semiconductor substrate 1000 is formed. The insulating film 1180 can be formed in a manner similar to the formation of the insulating film 155 in Embodiment Mode 5. Here, the insulating film 1180 is formed using polysilazane. In the insulating film 1180, contact holes reaching the high concentration impurity regions 1161 to 1163 are formed.

Next, the plug electrodes 1181 to 1185 with which the contact holes are filled are formed. The plug electrodes 1181 to 1185 can be formed from tungsten or copper by a damascene method. Next, a conductive film formed from a material having low resistance such as aluminum or copper is formed over the insulating film 1180 and the conductive film is etched to form a conductive film 1191 connected to the plug electrode 1181, the conductive film 1192 connected to the plug electrodes 1182 and 1183, the conductive film 1193 connected to the plug electrode 1184, and the conductive film 1194 connected to the plug electrode 1185.

Through the above-described steps, a nonvolatile semiconductor memory device is manufactured, in which the semiconductor substrate 1000 is provided with the driver circuit portion 52 including a p-channel transistor Trp and the n-channel transistor Trn; and the memory cell array 51 including the NAND-type memory cell, the first selection transistor S1, and the second selection transistor S2.

Note that in the nonvolatile semiconductor memory device in FIG. 32, the depression 1004 and the insulating film 1005 are formed to isolate elements. However, instead of forming the depression 1004 and the insulating film 1005, an oxide of the semiconductor substrate 1000 can be formed as an element isolation region by LOCOS (local oxidation of silicon).

Embodiment Mode 9

This embodiment mode describes electronic devices provided with a nonvolatile semiconductor memory device as a semiconductor device. The present invention can be used for electronic devices in various fields, which are provided with nonvolatile semiconductor memory devices as memory devices. For example, the following can be given: a camera such as a video camera or a digital camera, a goggle type display (a head mounted display), a navigation system, an audio reproducing device (car audio set, audio component set, or the like), a computer, a game machine, a portable information terminal (mobile computer, mobile phone, portable game machine, e-book reader, or the like), and an image reproducing device provided with a recording medium (specifically, a device provided with a display that can reproduce audio data or image data in a recording medium such as a digital versatile disc (DVD) and display the image data), and the like. FIGS. 41A to 41E illustrate specific examples of the electronic devices.

Figure 41A:
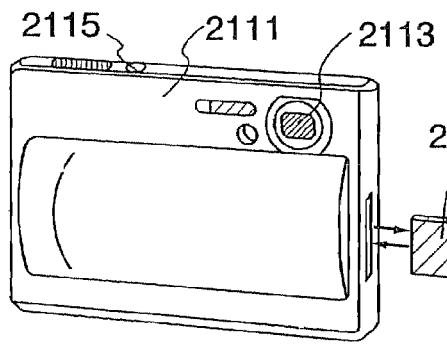
FIGS. 41A to 41E are external views of electronic devices (FIGS. 41A and 41B: a digital camera, FIG. 41C: a mobile phone, FIG. 41D: a digital player, and FIG. 41E: an electronic book) each having a nonvolatile semiconductor memory device.
Figure 41B:
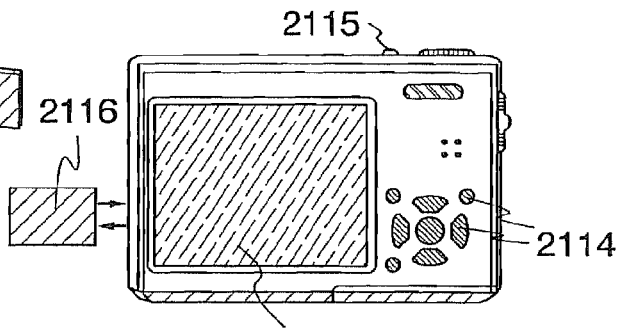

FIGS. 41A and 41B are external views of a digital camera. FIG. 41B shows the back of the digital camera shown in FIG. 41A. This digital camera shown in FIGS. 41A and 41B includes a chassis 2111, a display portion 2112, a lens 2113, operation keys 2114, a shutter button 2115, a storage medium 2116 provided with a nonvolatile semiconductor memory device, and the like. The chassis 2111 has a structure in which users can take out the recording medium 2116. In the digital camera, still image data or dynamic image data which are taken or audio data which is recorded can be stored in the recording medium 2116. The nonvolatile semiconductor memory device described in any of Embodiment Modes 4 to 8 is applied to the recording medium 2116.

Figure 41C:
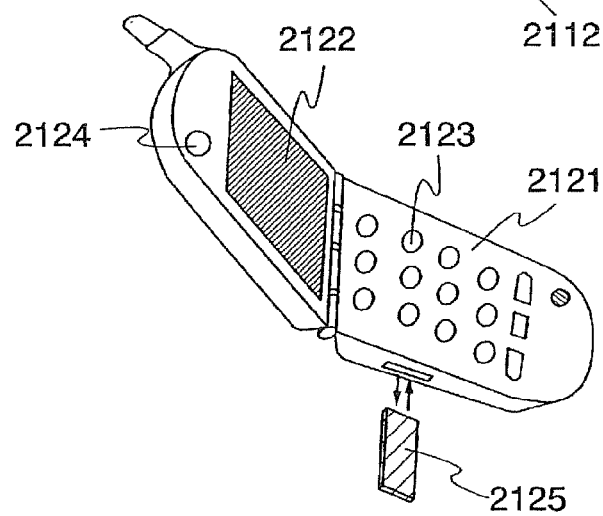

FIG. 41C is an external view of a mobile phone. The mobile phone is a typical example of a mobile terminal. This mobile phone includes a housing 2121, a display portion 2122, operating keys 2123, and the like. Further, the mobile phone is provided with a recording medium 2125 including a nonvolatile semiconductor memory device. The chassis 2111 has a structure in which the storage medium 2125 can be taken out. Data such as phone numbers, video data, music data, audio data, or the like included in the mobile phone can be stored in the storage medium 2125, and the video data, music data, or audio data stored in the storage medium 2125 can be reproduced by the mobile phone. The nonvolatile semiconductor memory device described in any of Embodiment Modes 4 to 8 is applied to the storage medium 2125.

Figure 41D:
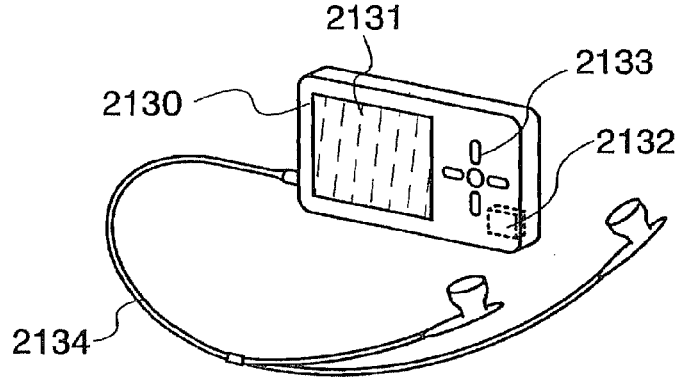

FIG. 41D is an external view of a digital player. The digital player is a typical example of an audio device. The digital player includes a main body 2130, a display portion 2131, an operation portion 2133, earphones 2134, and the like. A headphone or a wireless earphone can be used instead of the earphone 2134. A storage medium 2132 provided with a nonvolatile semiconductor memory device is incorporated in the main body 2130 of the digital player. The nonvolatile semiconductor memory device described in any of Embodiment Modes 4 to 8 is applied to the storage medium 2132. As a structure of the main body 2130, a structure in which the storage medium 2132 can be taken out by users may be employed.

For example, a NAND-type nonvolatile semiconductor memory device with a memory capacity of 20 to 200 gigabytes can be used for the storage medium 2132. The operation portion 2133 is operated, whereby data of a still image, a dynamic image, audio, music, or the like can be stored in the storage medium 2132, and the stored data can be reproduced.

Figure 41E:
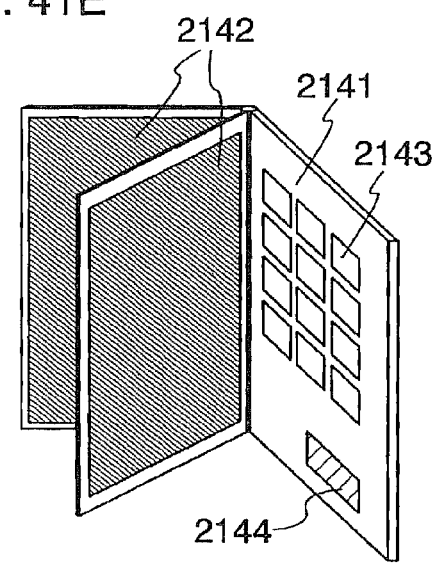

FIG. 41E is an external view of an e-book reader (also referred to as electronic paper). This e-book reader includes a main body 2141, a display portion 2142, operation keys 2143, and a storage medium 2144. In addition, a modem may be incorporated in the main body 2141, or information can be transmitted and received wirelessly. The nonvolatile semiconductor memory device described in any of Embodiment Modes 4 to 8 can be applied to the storage medium 2144. For example, a NAND-type nonvolatile semiconductor memory device with a memory capacity of 20 to 200 gigabytes (GB) can be used. The operation keys 2143 are operated, whereby data of a still image, a dynamic image, audio, music, or the like can be recorded in the storage medium 2144, and stored data can be reproduced. The main body 2141 may have a structure in which users can take out the storage medium 2144.

As described above, an application range of the semiconductor device of the present invention is extremely wide, and the semiconductor device of the present invention can be applied to electronic devices in various fields as long as the electronic devices have a storage medium. A nonvolatile storage medium in which a charge retention characteristic is improved is provided so that reliability of memory performance of the electronic devices can be improved.

Embodiment Mode 10

This embodiment mode describes a semiconductor device capable of inputting and outputting data without contact. A nonvolatile semiconductor memory device is used for the semiconductor device. The semiconductor device which is described in this embodiment mode is also referred to as an RFID tag, an ID tag, an IC tag, an IC chip, an RF tag, a wireless tag, an electronic tag, or a wireless chip depending on the usage.

Figure 42:
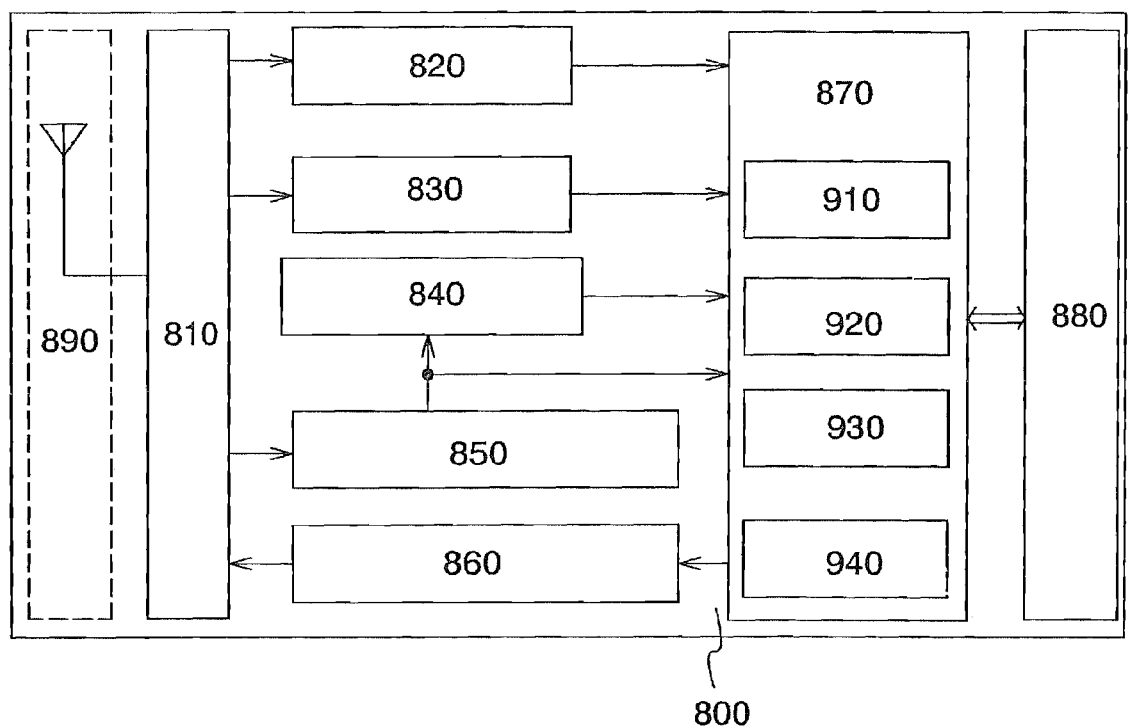
FIG. 42 is a block diagram showing a structural example of a semiconductor device capable of data transmission without contact.

FIG. 42 is a block diagram showing a structural example of the semiconductor device capable of inputting and outputting data without contact. As shown in FIG. 42, a semiconductor device 800 has a function of exchanging data without contact, and includes a high-frequency circuit 810, a power supply circuit 820, a reset circuit 830, a clock generating circuit 840, a data demodulation circuit 850, a data modulation circuit 860, a control circuit 870 for controlling circuits included in the semiconductor device 800, a memory device 880, and an antenna 890.

A signal received by the antenna 890 is inputted to the high-frequency circuit 810. The high-frequency circuit 810 outputs the received signal to the data modulation circuit 860, the reset circuit 830, and the data demodulation circuit 850. The power supply circuit 820 is a circuit which generates a power supply potential from the received signal. The reset circuit 830 is a circuit which generates a reset signal. The clock generating circuit 840 is a circuit which generates various clock signals based on a received signal. The data demodulation circuit 850 is a circuit which demodulates a received signal and outputs the demodulated signal to the control circuit 870. The data modulation circuit 860 is a circuit which modulates a signal outputted from the control circuit 870. The signal modulated in the data modulation circuit 860 is inputted to the high-frequency circuit 810, and the signal is transmitted from the antenna 890.

As the control circuit 870, a code extraction circuit 910, a code determination circuit 920, a CRC determination circuit 930, and an output unit circuit 940 are provided, for example. The code extracting circuit 910 is a circuit which extracts each of a plurality of codes included in an instruction transmitted to the control circuit 870. The code determination circuit 920 is a circuit which determines the content of an instruction by comparing an extracted code with a code which corresponds to a reference. The CRC determination circuit 930 is a circuit which detects the presence of transmission errors and the like based on a determined code.

The memory device 880 includes a ROM which is not rewritable and a rewritable nonvolatile semiconductor memory device which is described in Embodiment Modes 4 to 8. Since the drive voltage can be lowered in the nonvolatile semiconductor memory device, power consumption of the entire semiconductor device 800 can be suppressed. Thus, a communication distance is extended and communication with high quality is possible.

A signal is sent from a communication device such as a reader/writer to the semiconductor device 800, and a signal sent from the semiconductor device 800 is received by the communication device, whereby data of the semiconductor device 800 can be read. Next, a communication operation of the semiconductor device 800 is described. A radio signal is received by the antenna 890. The radio signal is sent to the power supply circuit 820 through the high-frequency circuit 810, and high power supply potential (hereinafter referred to as VDD) is generated. The VDD is supplied to each circuit included in the semiconductor device 800. Note that a low power supply potential (hereinafter referred to as VSS) is common in the plural circuits included in the semiconductor device 800 and the VSS can be a ground potential (GND).

The data demodulation circuit 850 generates a demodulated signal by demodulating a signal sent from the high-frequency circuit 810. The reset signal outputted from the reset circuit 830, the clock signal outputted from the clock generating circuit 840, and the demodulated signal outputted from the data demodulation circuit 850 are sent to the control circuit 870. The demodulated signal sent to the control circuit 870 is analyzed by the code extraction circuit 910, the code determination circuit 920, the CRC determination circuit 930, and the like. Then, based on the analyzed signals, information of the semiconductor device 800 stored in the memory device 880 is read. The information is encoded in the output unit circuit 940. The encoded information is modulated in the data modulation circuit 860 and then inputted to the high-frequency circuit 810. The signal inputted to the high-frequency circuit 810 is superimposed on a carrier wave and sent as a radio signal from the antenna 890.

Figure 43A:
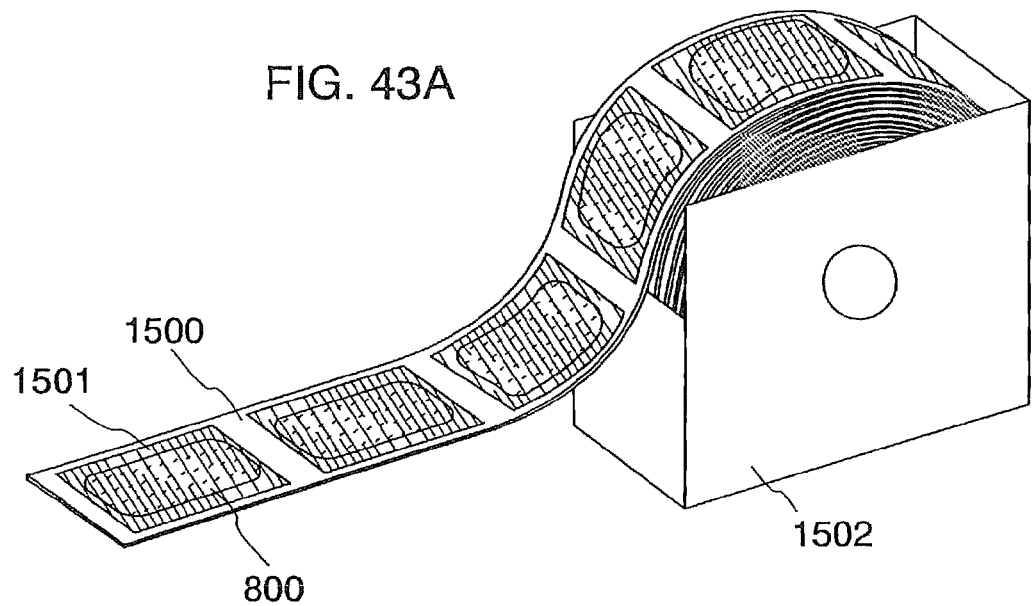
FIGS. 43A to 43D are diagrams showing usage patterns of a semiconductor device capable of data transmission without contact.

Examples showing the use of the semiconductor device 800 are described with reference to FIGS. 43A to 43D and FIGS. 44A and 44B. FIG. 43A is an external view of an ID label having the semiconductor device 800. On a label board (separate paper) 1500, a plurality of ID labels 1501 each incorporating the semiconductor device 800 is formed. The ID labels 1501 are put in a box 1502.

On the ID label 1501, information regarding a product or a service (such as product name, brand, trademark, trademark owner, seller, or manufacturer) is printed. On the other hand, in the incorporated semiconductor device 800, a large amount of information that cannot all be written on a container or a label of the product, such as the product's area of production, area of sales, quality, raw material, effect, use, quantity, shape, price, a production method, a usage method, time of production, time of use, expiration date, instruction manual, and intellectual property information relating to the product, for example can be stored. Accordingly, a trader and a consumer can access the information which is stored in the semiconductor device 800, with the use of a simple reader. In addition, the RFID tag has a structure such that the producer of a product can easily perform rewriting, erasing, or the like of the information stored in the semiconductor device 800, but a trader or a consumer cannot perform rewriting, erasing, or the like thereof.

Figure 43B:
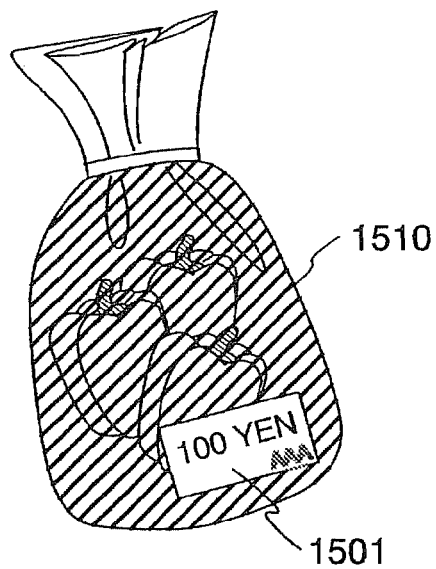

FIG. 43B is a diagram showing a usage method in which the ID label 1501 is attached to a package 1510 of a vegetable. By providing a product with the IC label 1501, management of the product can be simplified. For example, even in the case where a product is stolen, the product can be quickly found because a path of the product can be traced.

Figure 43C:
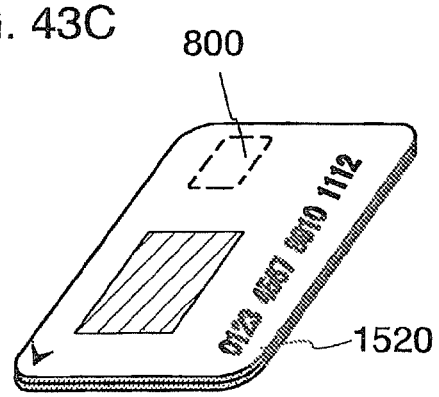

FIG. 43C is an external view of the ID card 1520 relating to the present invention. The semiconductor device 800 is incorporated in the ID card 1520. The ID card 1520 includes all kinds of cards such as a cash card, a credit card, a prepaid card, an electronic ticket, electronic money, a telephone card, and a membership card.

Figure 43D:
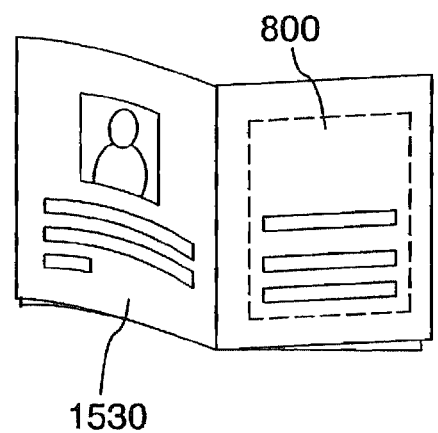

FIG. 43D is an external view of a passport 1530. The passport 1530 has a page in which the semiconductor device 800 is embedded. Similarly, the semiconductor device 800 can be attached to or embedded in a driver's license, a credit card, a banknote, a coin, a certificate, a merchandise coupon, a ticket, a traveler's check, a health insurance card, a residence certificate, a family register, and the like. By the attachment of the semiconductor device 800, an effect of preventing counterfeiting can be obtained. For example, only information certifying the authenticity may be stored in the semiconductor device 800, and access privileges may be set to prevent information stored in the semiconductor device 800 from being read or written illegally.

Figure 44A:
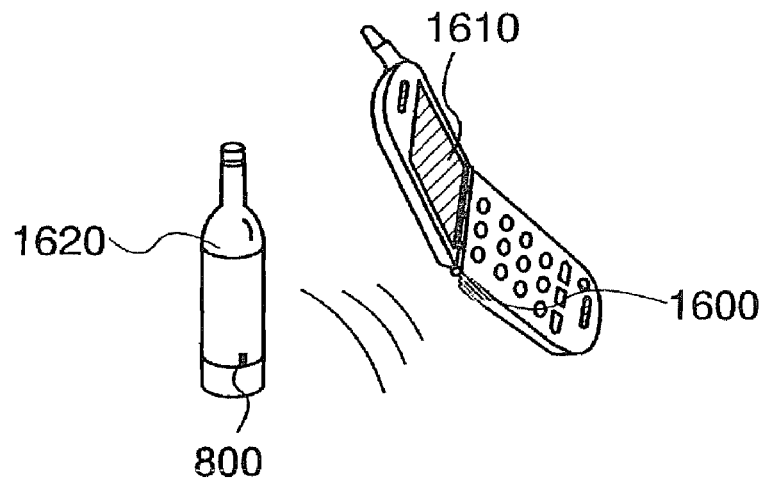
FIGS. 44A and 44B are diagrams showing usage patterns of a semiconductor device capable of data transmission without contact.

An example of usage of the semiconductor device 800 is described with reference to FIGS. 44A and 44B. As shown in FIG. 44A, a side surface of a mobile terminal including a display portion 1610 is provided with a reader/writer 1600. A side surface of an article 1620 is provided with the semiconductor device 800. When the reader/writer 1600 is held over the semiconductor device 800, information stored in the semiconductor device 800 is sent. For example, information on the product such as a material, a place of origin, an inspection result for each production step, a history of the distribution process, and a description of the product is sent from the semiconductor device 800. When information is received by the reader/writer 1600, the information is displayed on the display portion 1610 of a mobile phone.

Figure 44B:
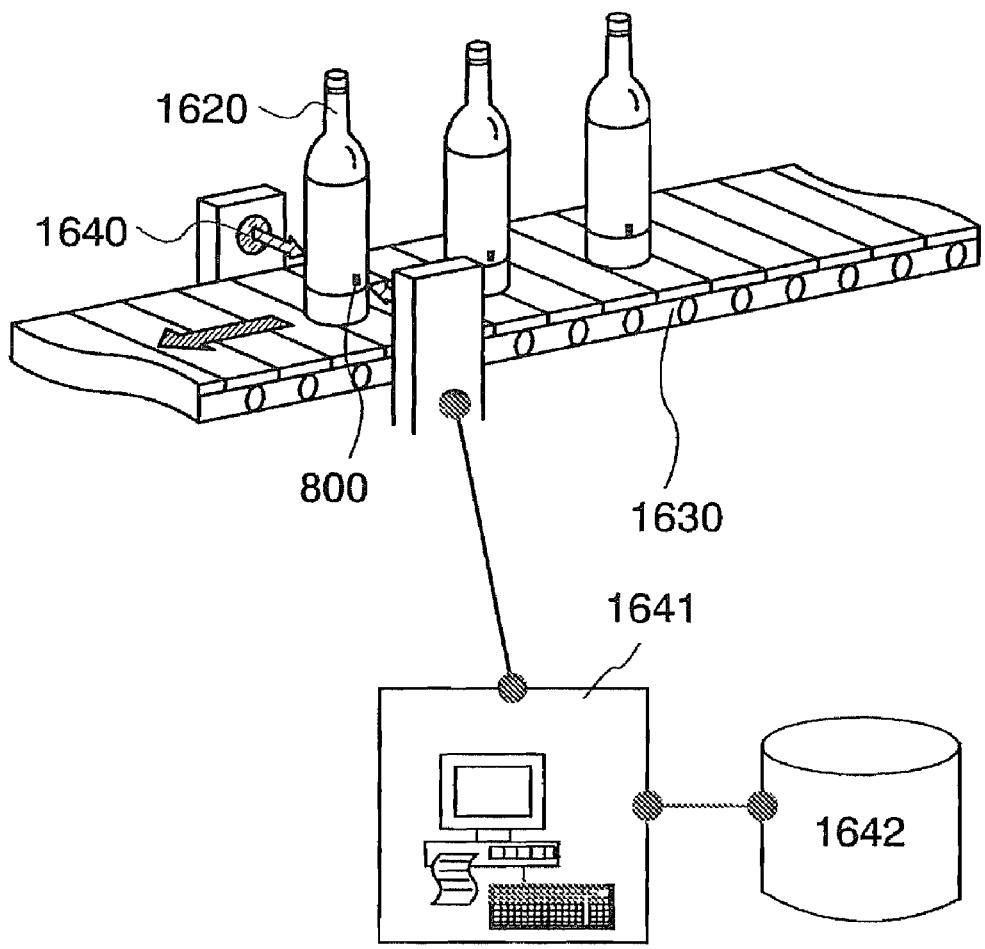

FIG. 44B shows a structural example of an inspection system. In the inspection system, a belt conveyer 1630 is provided with a reader/writer 1640 which communicates with the semiconductor device 800. A computer 1641 is connected to the reader/writer 1640, and a database 1642 is connected to the computer 1641. The semiconductor device 800 is attached to a product 1660. Communication is performed between the reader/writer 1640 and the semiconductor device 800 attached to the product 1660 with the product 1660 carried by the belt conveyer 1630. Thus, information stored in the semiconductor device 800 is read and then stored in the database 1642 through the computer 1641. When the semiconductor device 800 capable of radio communication is used for an inspection system as described above, a variety of information that cannot be directly displayed on the product 1660 can be obtained easily.

This application is based on Japanese Patent Application serial no. 2007-226903 filed with Japan Patent Office on Aug. 31, 2007, the entire contents of which are hereby incorporated by reference.

What is claimed is:

1. A method for manufacturing a semiconductor device including a nonvolatile semiconductor memory element, comprising:
    forming a semiconductor region;
    forming a first insulating film over the semiconductor region;
    forming a charge trapping film over the first insulating film, wherein a silicon nitride film having a hydrogen concentration of greater than or equal to 15 atomic % is formed by a chemical vapor deposition method using a process gas including at least a nitrogen source gas and a silicon source gas, and wherein an upper portion of the silicon nitride film is nitrided; and
    forming a conductive film over the charge trapping film.

2. A method for manufacturing a semiconductor device including a nonvolatile semiconductor memory element, comprising:
    forming a semiconductor region;
    forming a first insulating film over the semiconductor region;
    forming a charge trapping film over the first insulating film, wherein a silicon nitride film is formed by a chemical vapor deposition method using a process gas including at least a nitrogen source gas and a silicon source gas, and wherein an upper portion of the silicon nitride film is nitrided to decrease a hydrogen concentration of the nitrided region by 30% or more; and
    forming a conductive film over the charge trapping film.

3. The method for manufacturing a semiconductor device according to claim 2,
    wherein the silicon nitride film formed by the chemical vapor deposition method has a hydrogen concentration of greater than or equal to 15 atomic %.

4. The method for manufacturing a semiconductor device according to any one of claims 1 and 2,
    wherein a thickness of the silicon nitride film which is to be nitrided accounts for 40% or more and 60% or less of a thickness of the silicon nitride film.

5. The method for manufacturing a semiconductor device according to any one of claims 1 and 2,
    wherein an upper portion of the silicon nitride film is nitrided by reacting nitrogen radicals with the silicon nitride film.

6. The method for manufacturing a semiconductor device according to any one of claims 1 and 2,
    wherein an $N_2$ gas is excited to produce nitrogen radicals, and
    wherein an upper portion of the silicon nitride film is nitrided by reacting the nitrogen radicals with the silicon nitride film.

7. The method for manufacturing a semiconductor device according to any one of claims 1 and 2,
    wherein a mixed gas including an $N_2$ gas and a rare gas is excited to produce plasma of the mixed gas, and an upper portion of the silicon nitride film is nitrided by reacting nitrogen radicals produced in the plasma with the silicon nitride film.

8. The method for manufacturing a semiconductor device according to any one of claims 1 and 2,
    wherein a mixed gas including an $N_2$ gas and a rare gas is excited by a microwave to produce plasma of the mixed gas, and an upper portion of the silicon nitride film is nitrided by reacting nitrogen radicals produced in the plasma with the silicon nitride film.

9. The method for manufacturing a semiconductor device according to claim 8,
    wherein the plasma has an electron density greater than or equal to $1 \times 10^{11}$ cm$^{-3}$ and an electron temperature less than or equal to 3 eV.

10. The method for manufacturing a semiconductor device according to any one of claims 1 and 2,
    wherein the process gas includes $NH_3$ as the nitrogen source gas.

11. The method for manufacturing a semiconductor device according to any one of claims 1 and 2,
    wherein the process gas includes $H_2$ and $N_2$ as the nitrogen source gas.

12. The method for manufacturing a semiconductor device according to any one of claims 1 and 2,
wherein a gas selected from $SiH_4$, $Si_2H_6$, $SiCl_4$, $SiHCl_3$, $SiH_2Cl_2$, $SiH_3Cl_3$, or $SiF_4$ is used as the silicon source gas.

13. The method for manufacturing a semiconductor device according to any one of claims 1 and 2,
wherein the silicon nitride film is formed by a plasma enhanced chemical vapor deposition method.

14. The method for manufacturing a semiconductor device according to any one of claims 1 and 2,
wherein the silicon source gas is $SiH_4$ and the nitrogen source gas is $NH_3$, and
wherein the silicon nitride film is formed using a mixed gas of $SiH_4$ and $NH_3$ as the process gas by a plasma enhanced chemical vapor deposition method.

15. The method for manufacturing a semiconductor device according to any one of claims 1 and 2,
wherein the silicon source gas is $SiH_4$ and the nitrogen source gas is $NH_3$, and
wherein the silicon nitride film is formed using a mixed gas of $SiH_4$, $NH_3$, and $H_2$ as the process gas by a plasma enhanced chemical vapor deposition method.

16. The method for manufacturing a semiconductor device according to any one of claims 1 and 2,
wherein the silicon source gas is $SiH_4$ and the nitrogen source gas is $NH_3$, and
wherein the silicon nitride film is formed using a mixed gas of $SiH_4$, $NH_3$, $H_2$, and Ar as the process gas by a plasma enhanced chemical vapor deposition method.

17. The method for manufacturing a semiconductor device according to any one of claims 1 and 2,
wherein the silicon nitride film is formed by a plasma enhanced chemical vapor deposition method with a heating temperature of a surface over which the silicon nitride film is formed set to 500° C. or less.

18. The method for manufacturing a semiconductor device according to any one of claims 1 and 2,
wherein the first insulating film is in contact with the semiconductor region,
wherein the charge trapping film is in contact with the first insulating film, and
wherein the conductive film is in contact with the charge trapping film.

19. The method for manufacturing a semiconductor device according to any one of claims 1 and 2,
further comprising a second insulating film formed between the charge trapping film and the conductive film,
wherein the first insulating film is in contact with the semiconductor region,
wherein the charge trapping film is in contact with the first insulating film,
wherein the second insulating film is in contact with the charge trapping film, and
wherein the conductive film is in contact with the second insulating film.

20. The method for manufacturing a semiconductor device according to any one of claims 1 and 2,
further comprising a second insulating film formed between the charge trapping film and the conductive film,
wherein the first insulating film is in contact with the semiconductor region,
wherein the charge trapping film is in contact with the first insulating film,
wherein the second insulating film contains two or more stacked films, and is in contact with the charge trapping film, and
wherein the conductive film is in contact with the second insulating film.

21. The method for manufacturing a semiconductor device according to claim 20,
wherein the second insulating film includes a silicon oxide film in contact with the charge trapping film, and a silicon nitride film on the silicon oxide film.

22. The method for manufacturing a semiconductor device according to any one of claims 1 and 2,
wherein the nonvolatile semiconductor memory element is formed over a glass substrate.

23. The method for manufacturing a semiconductor device according to claims 1 and 2,
wherein the nonvolatile semiconductor memory element is formed on a semiconductor substrate.

24. The method for manufacturing a semiconductor device according to claim 23,
wherein the semiconductor substrate is any of a single-crystal silicon substrate, a polycrystalline silicon substrate, a silicon-germanium substrate, or a germanium substrate.

25. The method for manufacturing a semiconductor device according to claim 23,
wherein the semiconductor substrate is any of an SOI (Silicon on Insulator) substrate, an SGOI (Silicon-Germanium on Insulator) substrate, or a GOI (Germanium on Insulator) substrate.

26. The method for manufacturing a semiconductor device according to any one of claims 1 and 2,
wherein the semiconductor device is one selected from the group consisting of a camera, a phone, a digital player and an e-book.

* * * * *